US007713771B2

(12) United States Patent
Eriksen et al.

(10) Patent No.: US 7,713,771 B2
(45) Date of Patent: May 11, 2010

(54) PRESSURE SENSOR

(75) Inventors: Gert Friis Eriksen, Greve (DK);
Karsten Dyrbye, Silkeborg (DK); Heins K. Pedersen, Bjerringbro (DK); Robert M. Mehalso, Fairport, NY (US);
Stephen F. Pond, Williamsburg, VA (US)

(73) Assignee: Grundfos a/s, Bjerringbro (DK)

( * ) Notice: Subject to any disclaimer, the term of this patent is extended or adjusted under 35 U.S.C. 154(b) by 559 days.

(21) Appl. No.: 11/469,511

(22) Filed: Sep. 1, 2006

(65) Prior Publication Data
US 2008/0054383 A1 Mar. 6, 2008

(51) Int. Cl.
*H01L 21/00* (2006.01)
(52) U.S. Cl. .............................. 438/53; 438/15; 438/50; 438/51; 73/716
(58) Field of Classification Search ......... 438/106–127, 438/53; 73/716
See application file for complete search history.

(56) References Cited

U.S. PATENT DOCUMENTS

| | | | |
|---|---|---|---|
| 6,030,709 A | 2/2000 | Jensen et al. | |
| 6,085,596 A | 7/2000 | Jensen et al. | |
| 6,723,620 B1 * | 4/2004 | Pavier | 438/460 |
| 7,010,984 B2 | 3/2006 | Krog et al. | |
| 2004/0040382 A1 * | 3/2004 | Peterson et al. | 73/708 |

OTHER PUBLICATIONS

Krassaw et al. ("Novel Packaging Techniques and its Application to a Wet/Dry Differential Pressure Silicon Sensor", International Conference on Solid-State Sensors and Actuators, pp. 275-278, Jun. 1997).*
Krassaw et al. ("Wafer Level Packaging of Silicon Pressure Sensors", Sensors and Actuators A, vol. 82, pp. 229-233, 2000).*

* cited by examiner

*Primary Examiner*—Charles D Garber
*Assistant Examiner*—Yasser A Abdelaziez
(74) *Attorney, Agent, or Firm*—Panitch Schwarze Belisario & Nadel LLP

(57) ABSTRACT

A differential pressure sensor includes a micro-electromechanical sensor die fabricated as a plurality of sensor die sites on a semiconductor wafer, and then singularized, the sensor die having a top face surface including die electrical output pads exposed to a first test fluid source and a bottom side surface exposed to a second test fluid source. The differential pressure further has a sensor die support member having a die support member fluid access port with a support member port perimeter; wherein one of the top face surface or the bottom side surface is sealed fully around the support member port perimeter by a wafer scale seal formed on the plurality of sensor die sites before die singulation. Wafer scale seals may be formed by a photofabrication process, screen printing, stamp printing, or pressure transfer printing. Some embodiments may include a photofabricated seal formed by a photosensitive polydimethylsiloxane material, by a filled photofabricated mold, and by photopatterned glass frit.

51 Claims, 37 Drawing Sheets

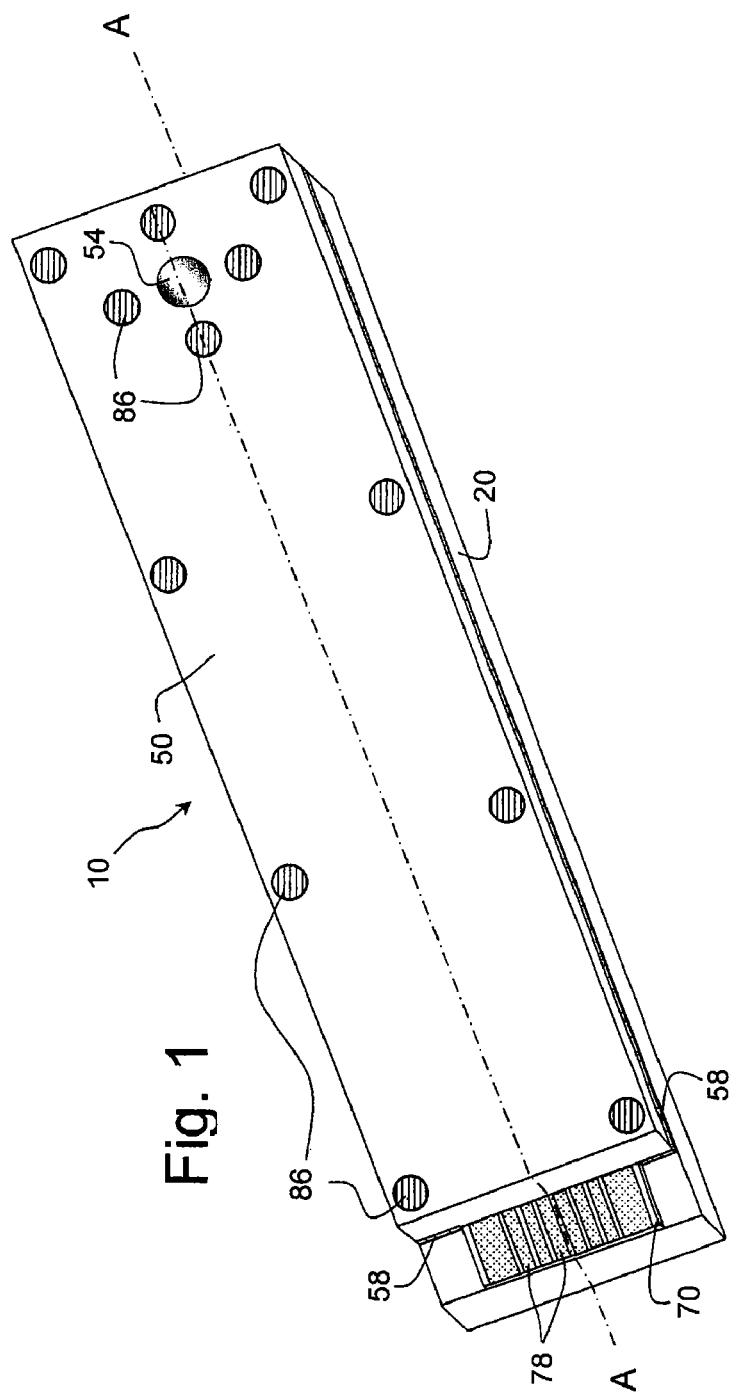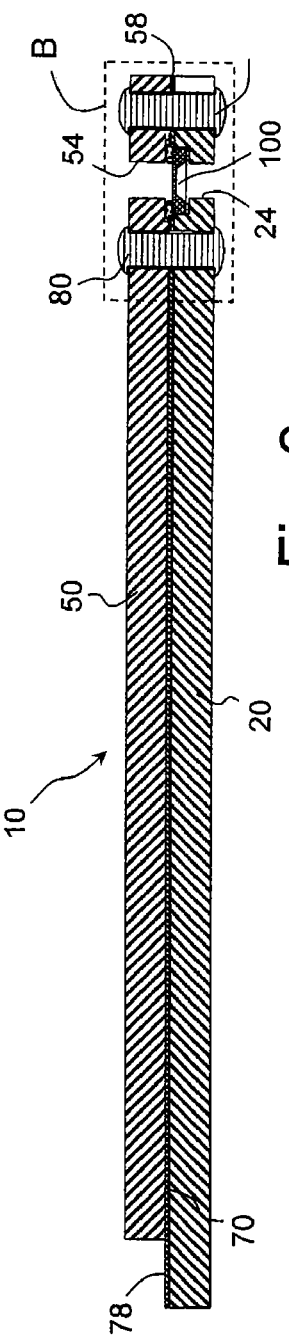

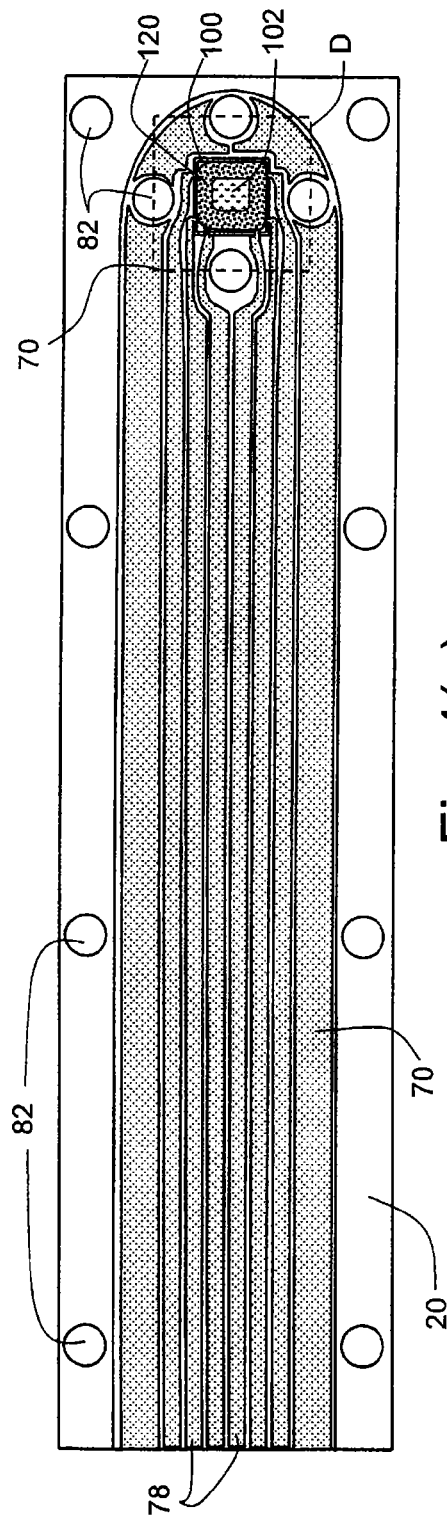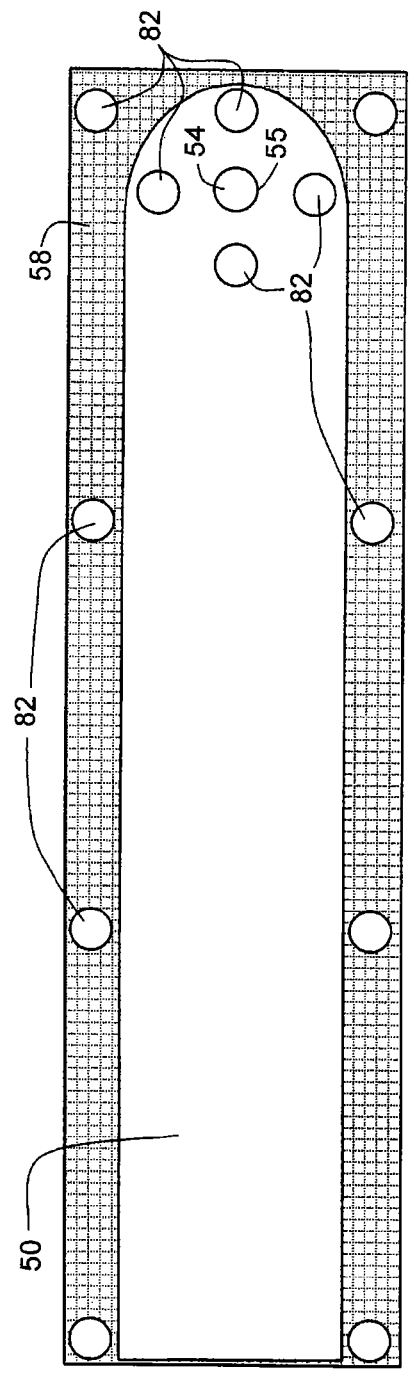
Fig. 4(a)
Fig. 4(b)

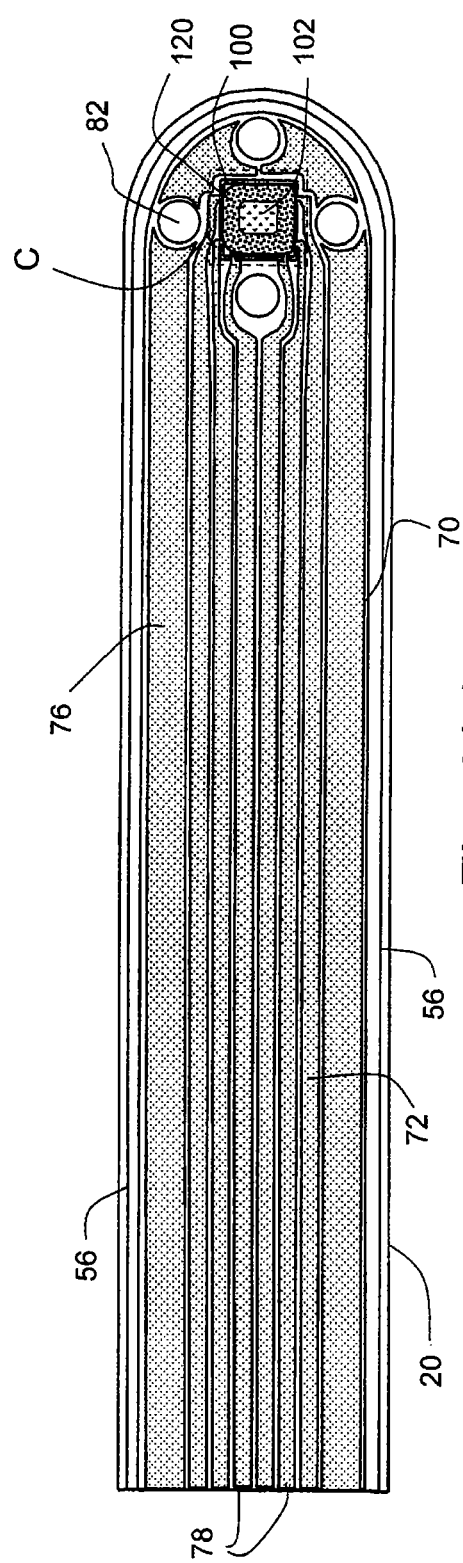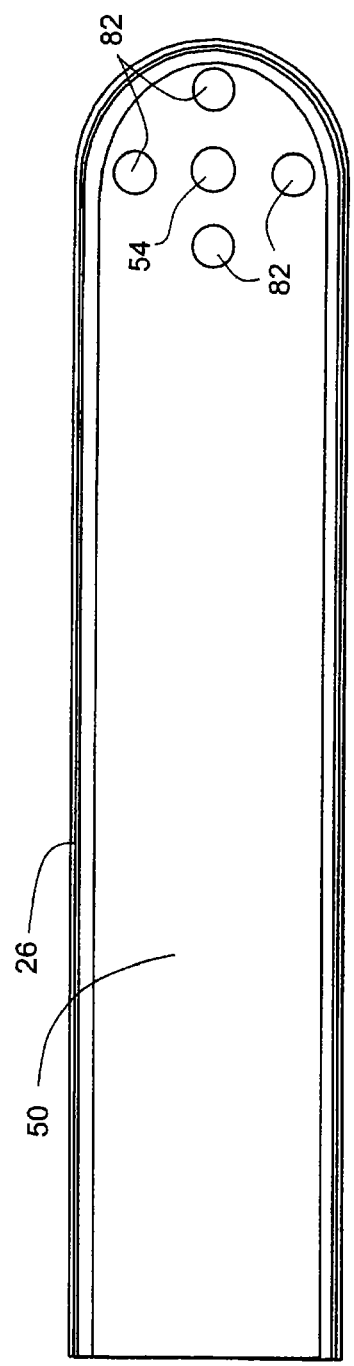
Fig. 6(a)
Fig. 6(b)

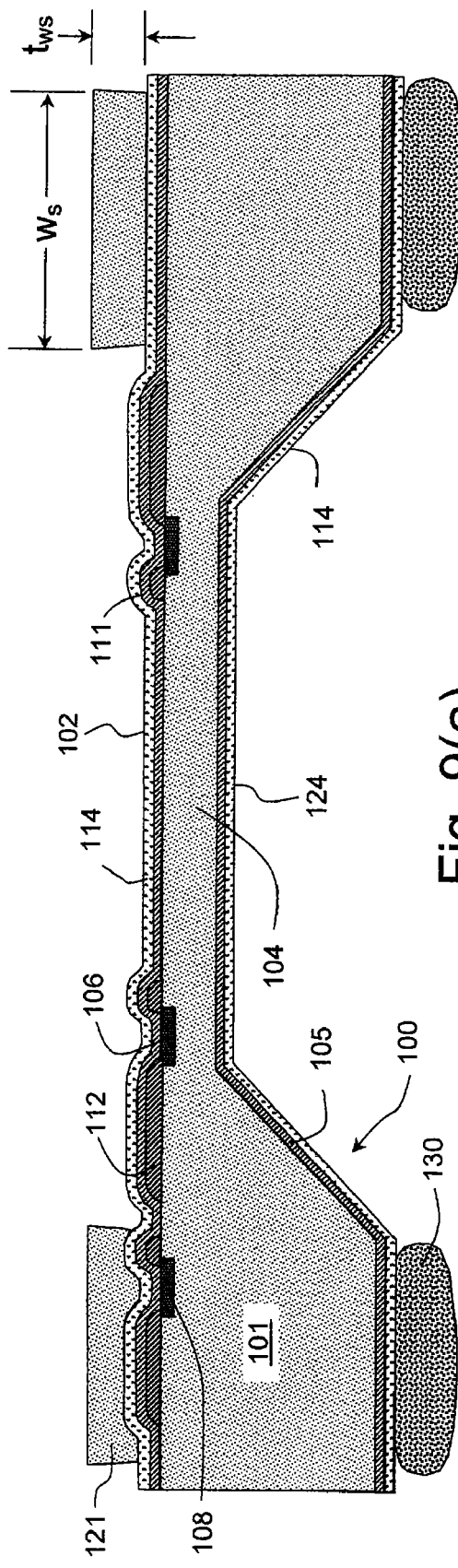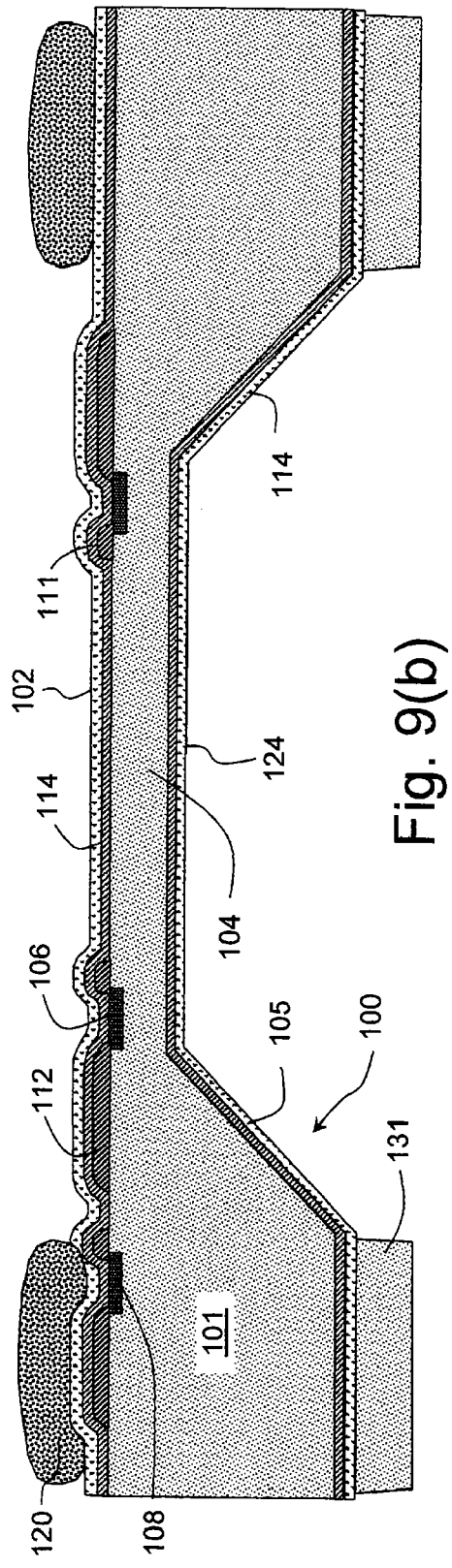
Fig. 9(a)
Fig. 9(b)

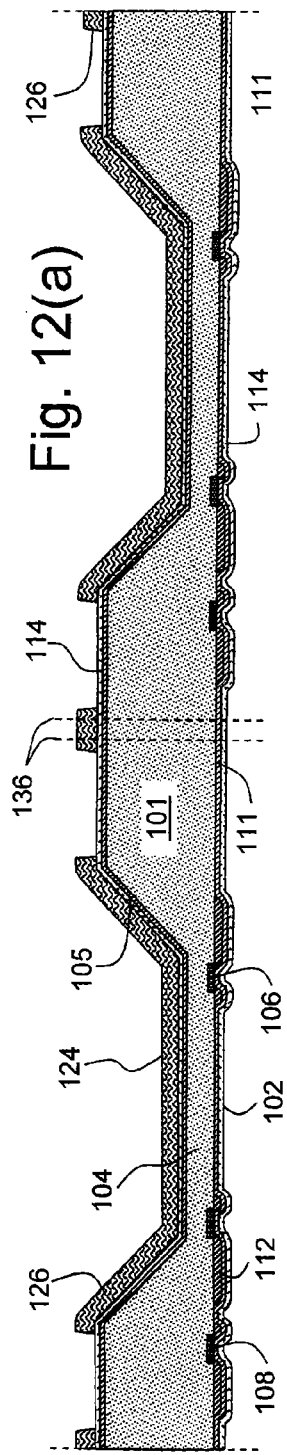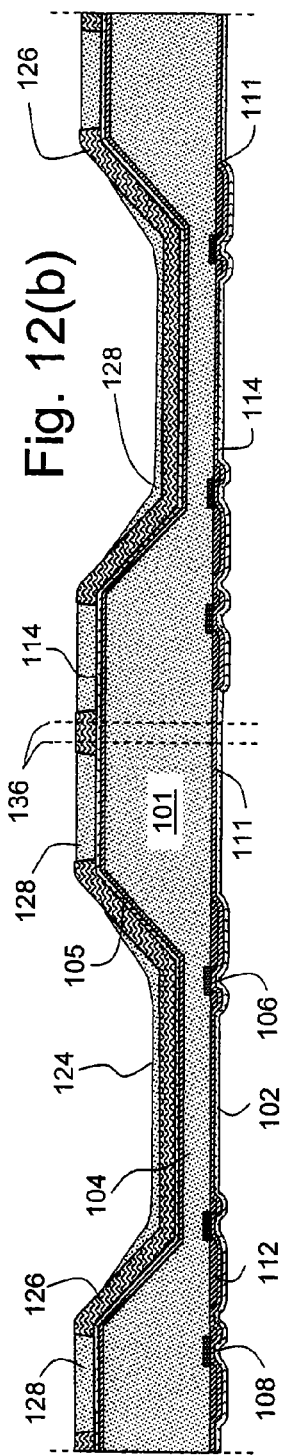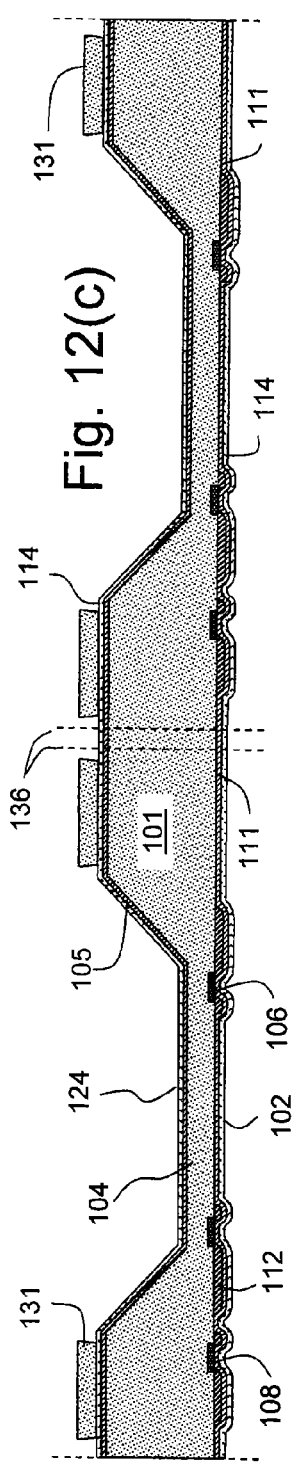

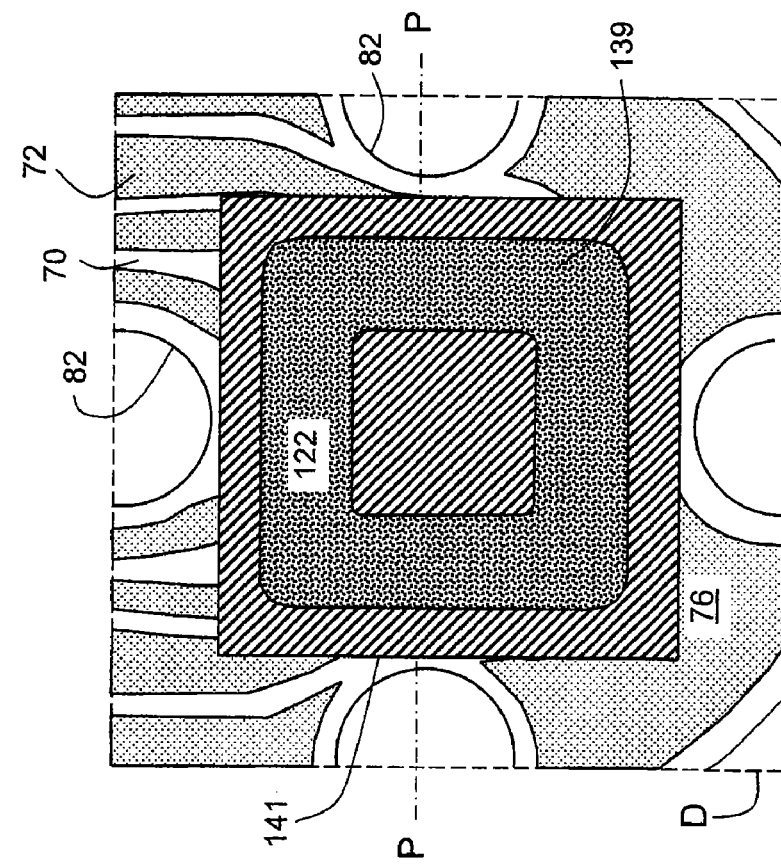
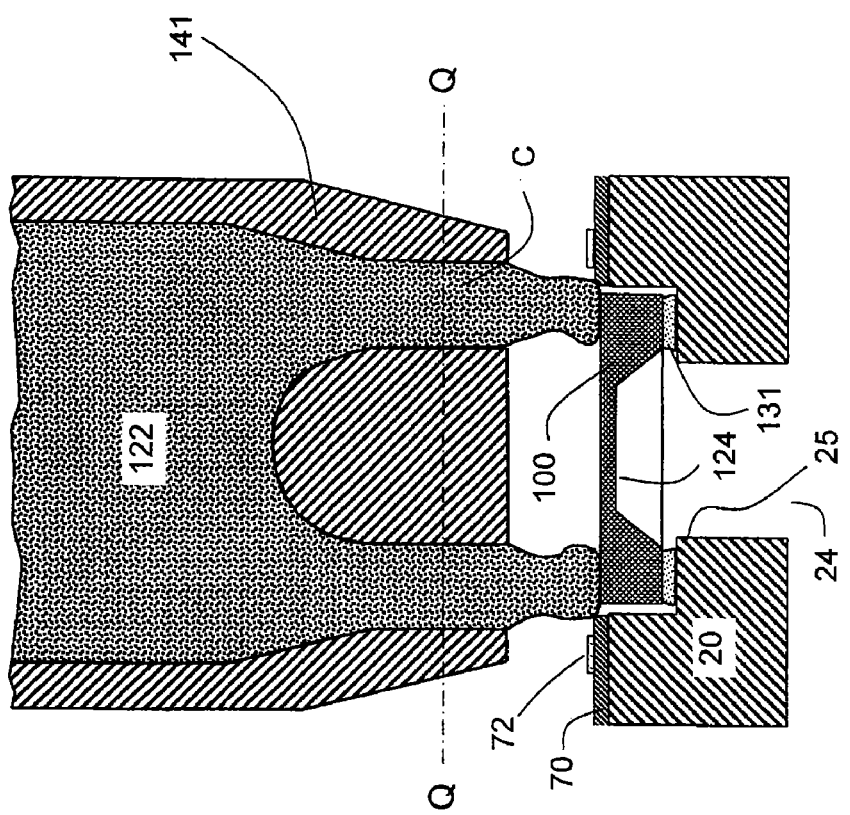
Fig. 14(a)
Fig. 14(b)

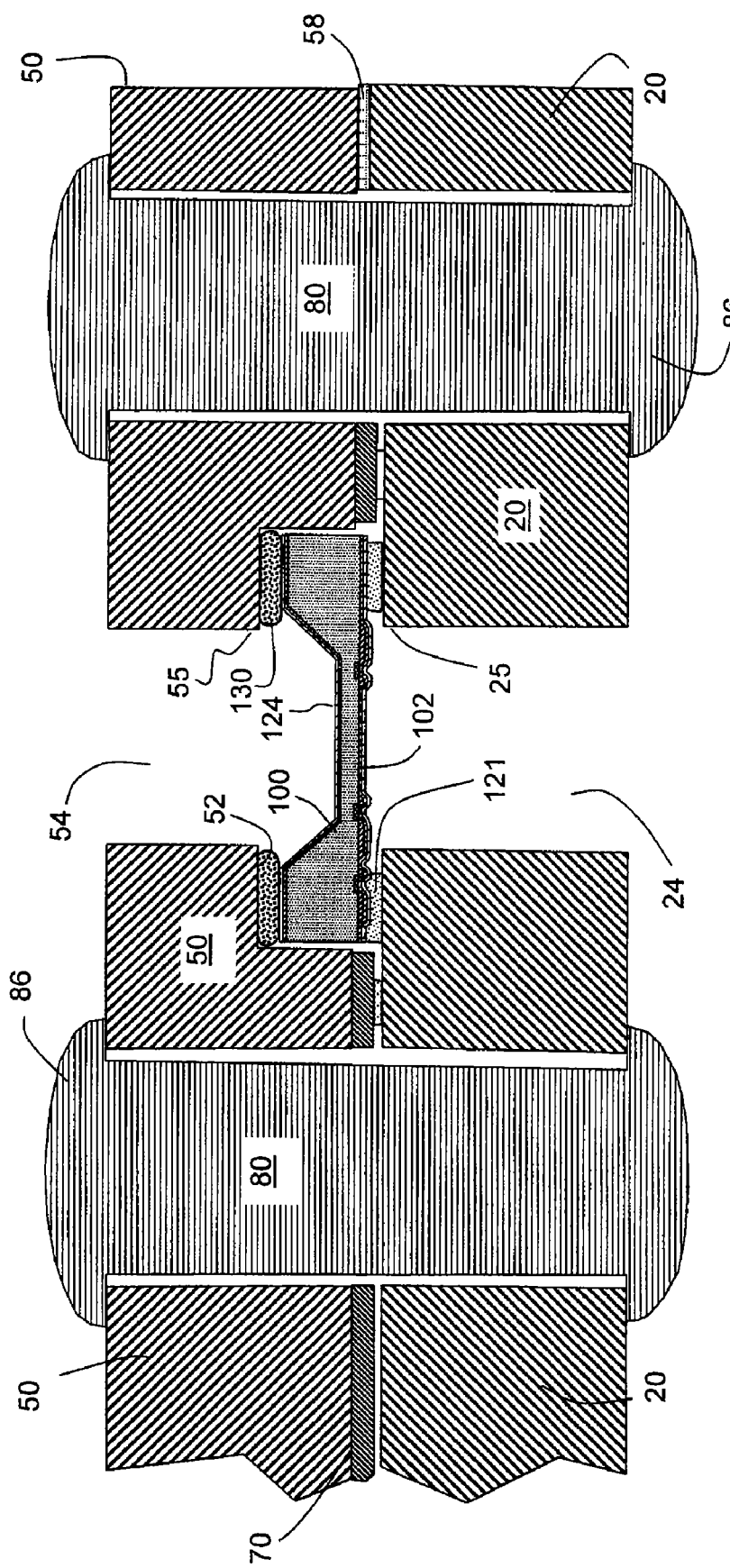

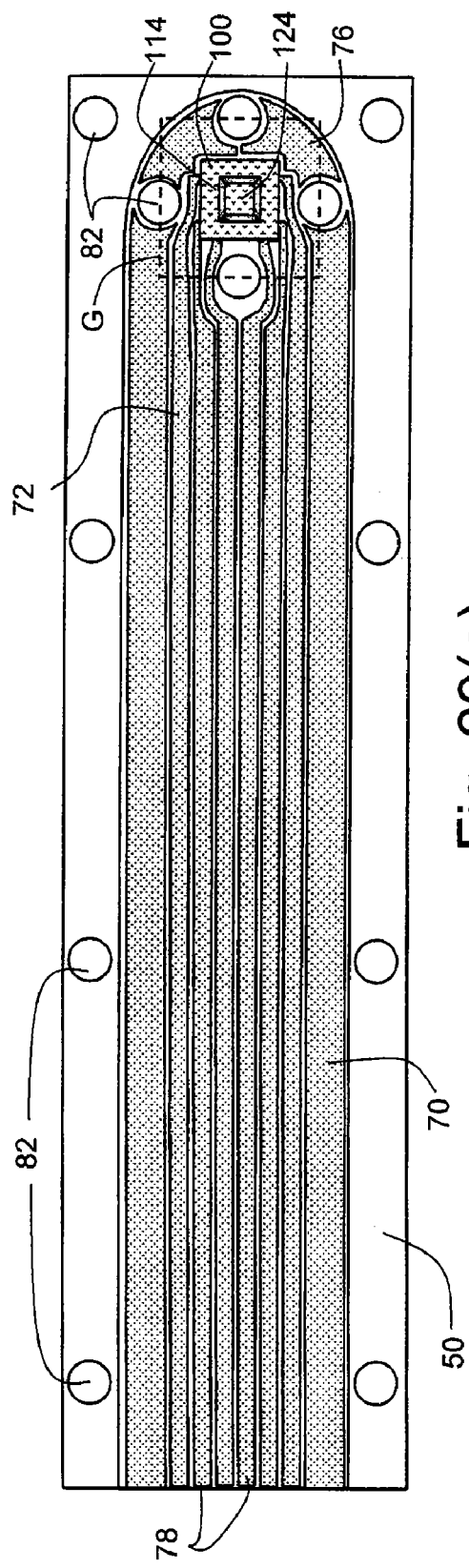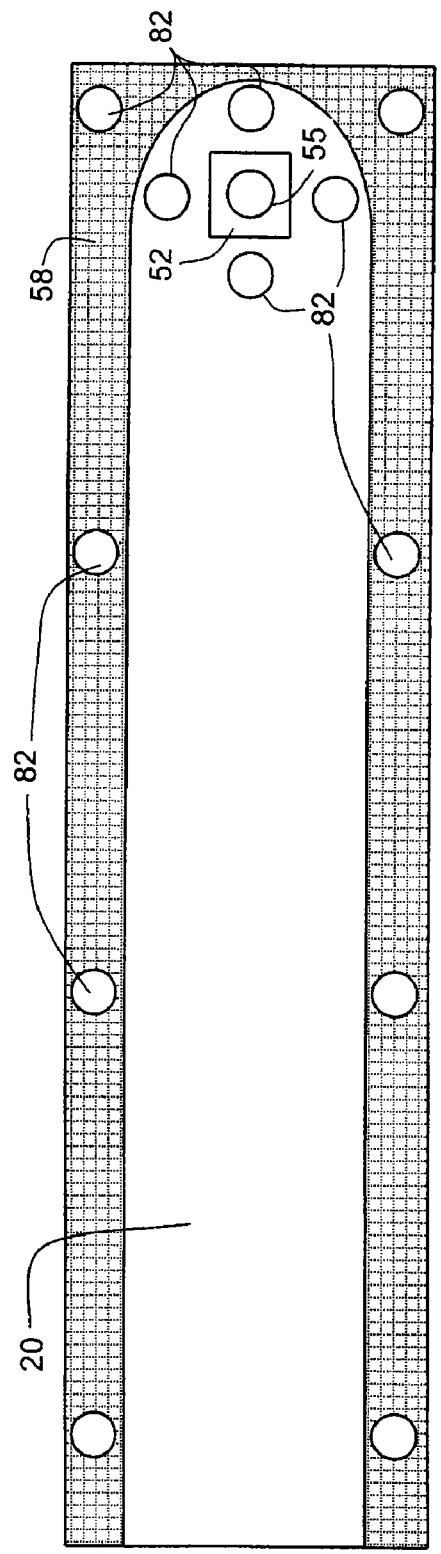
Fig. 29(a)
Fig. 29(b)

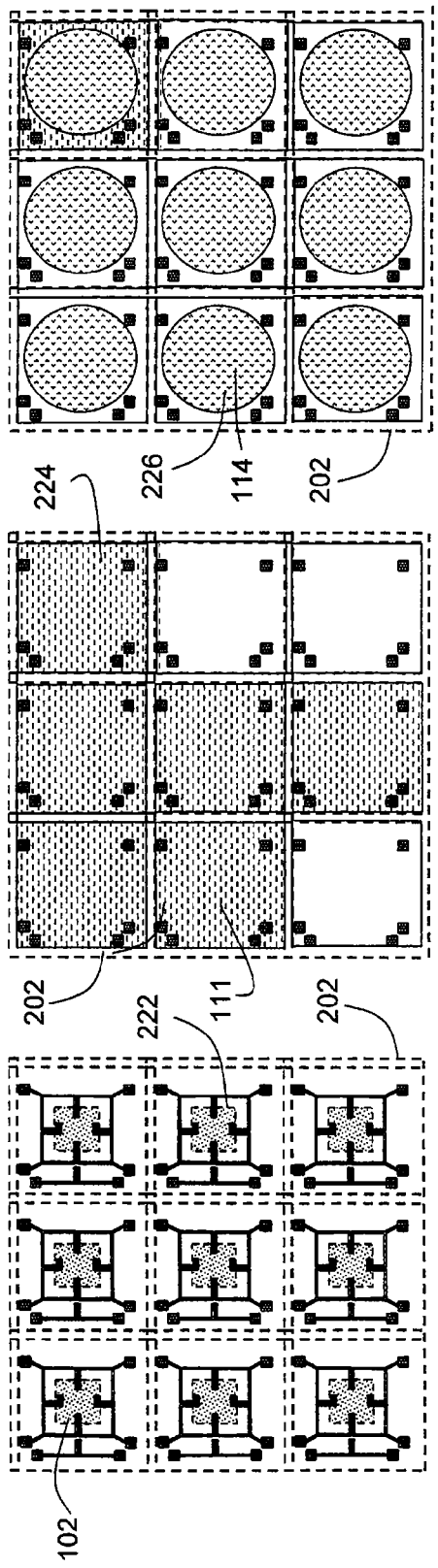

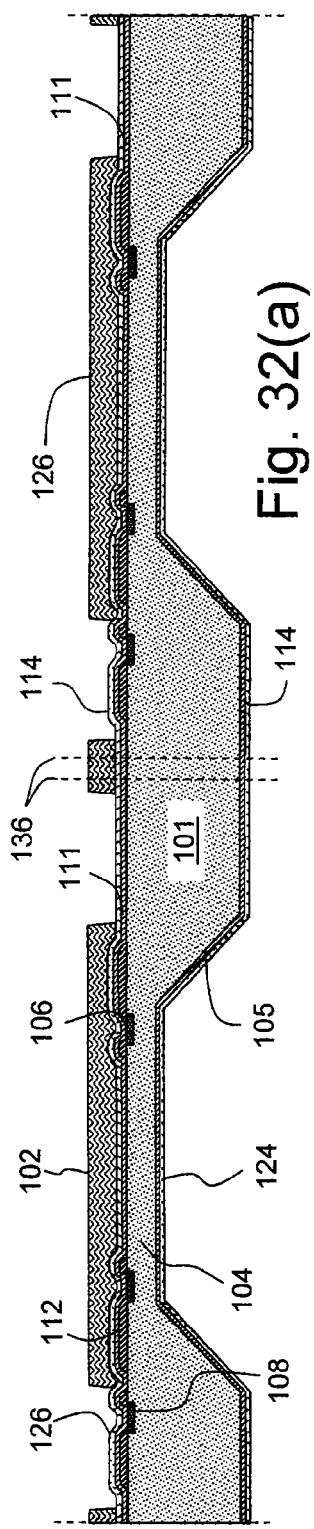
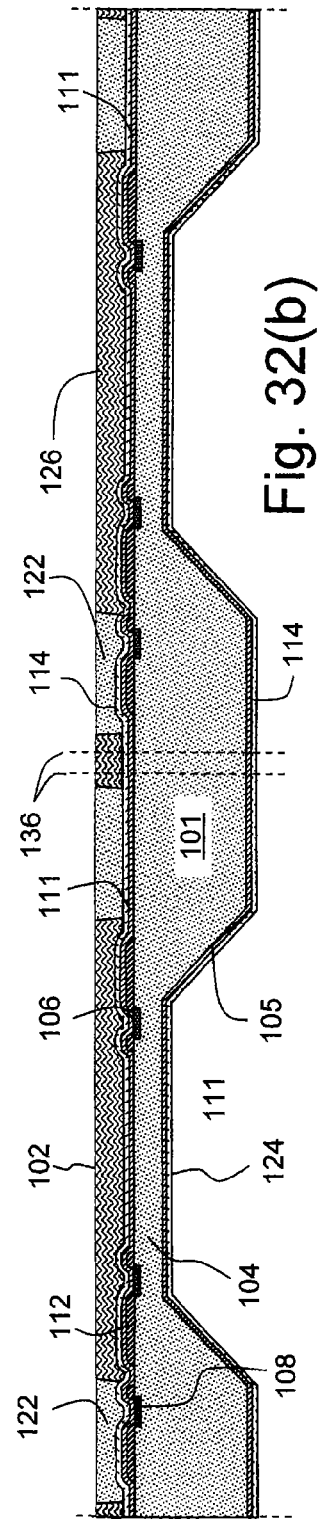
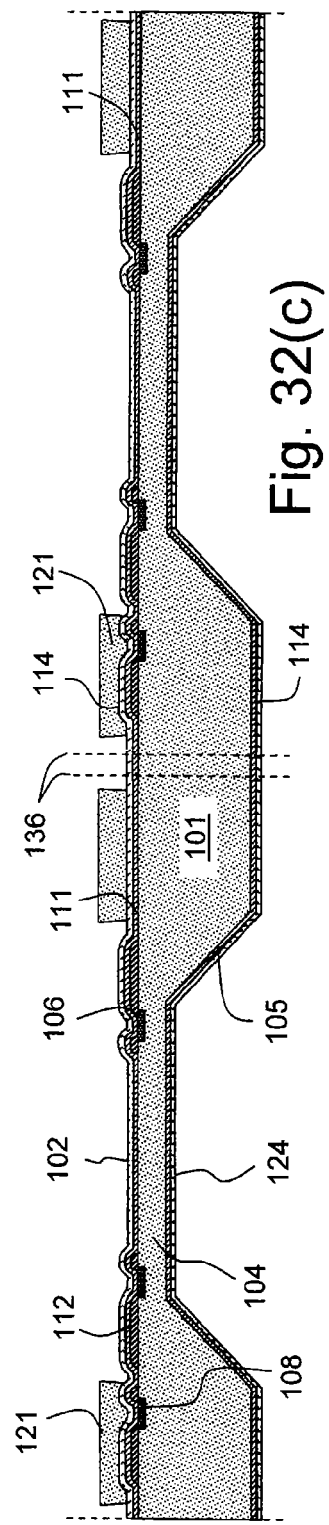

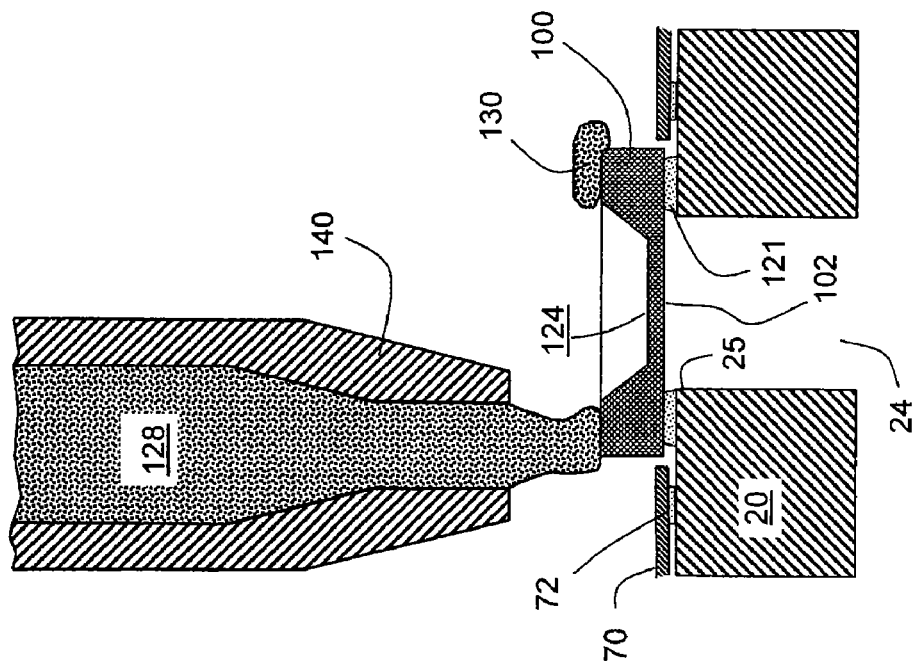
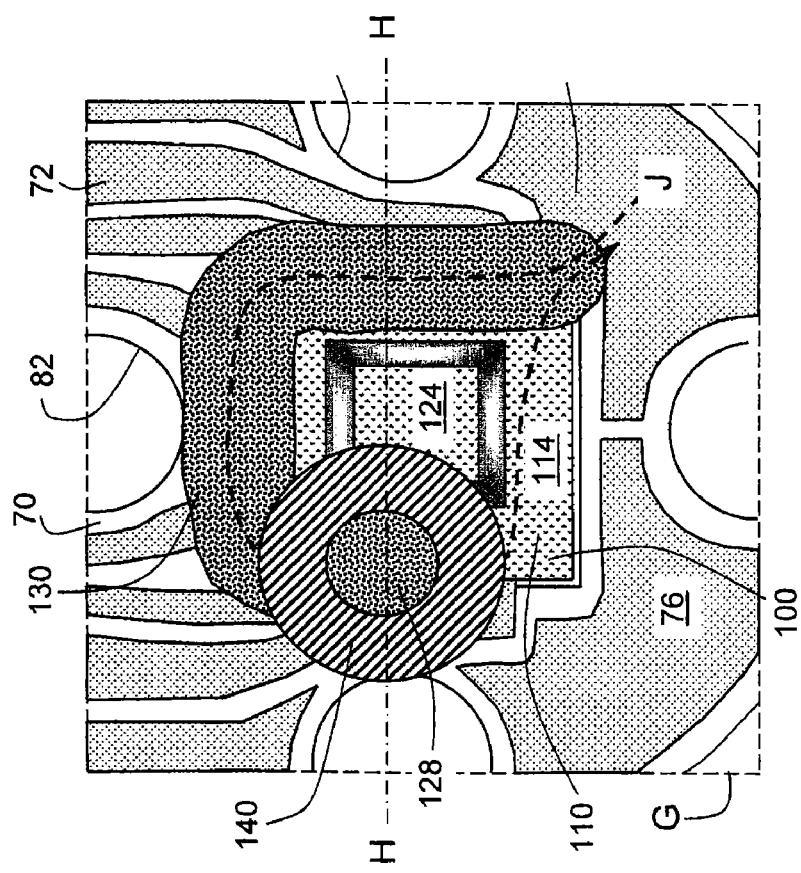
Fig. 33(a)
Fig. 33(b)

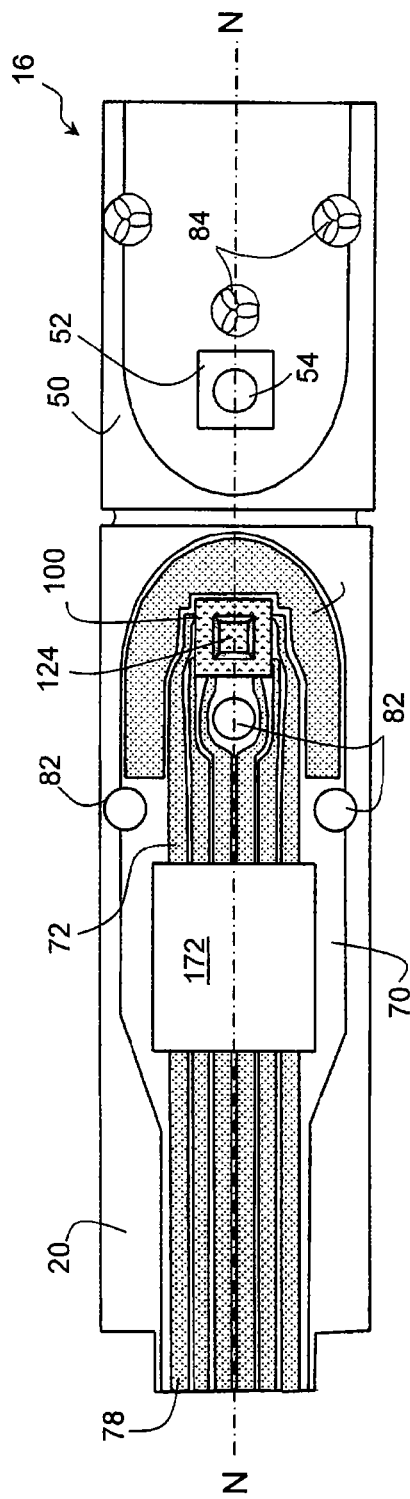
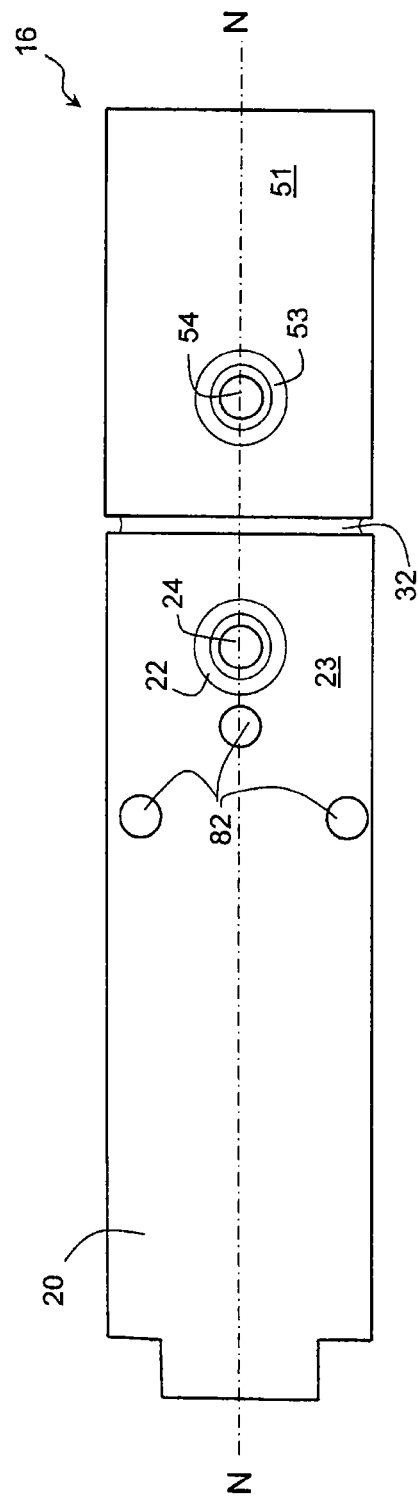
Fig. 35(a)
Fig. 35(b)

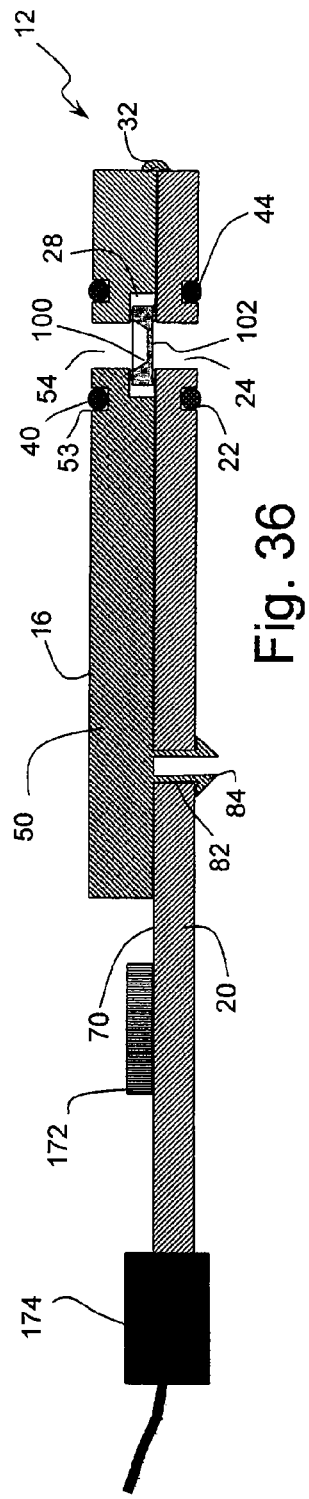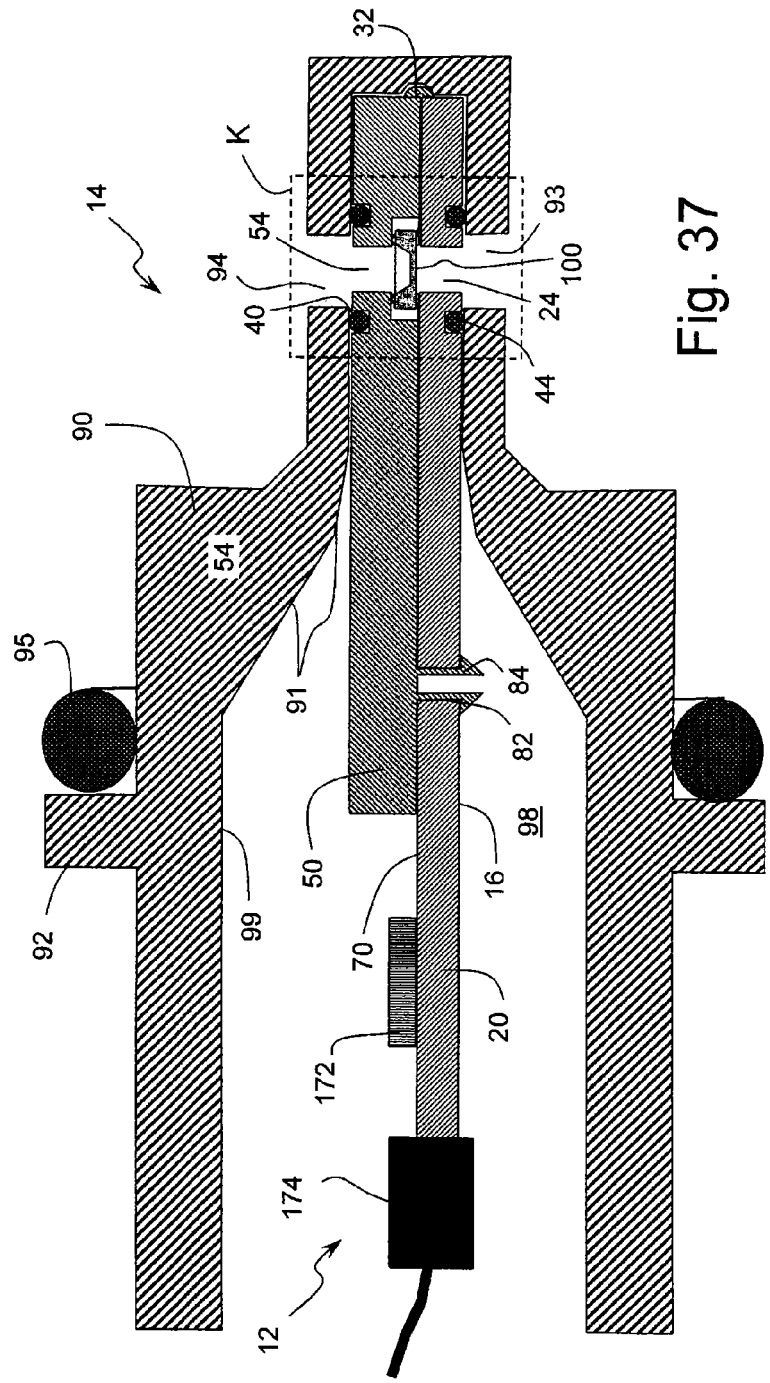

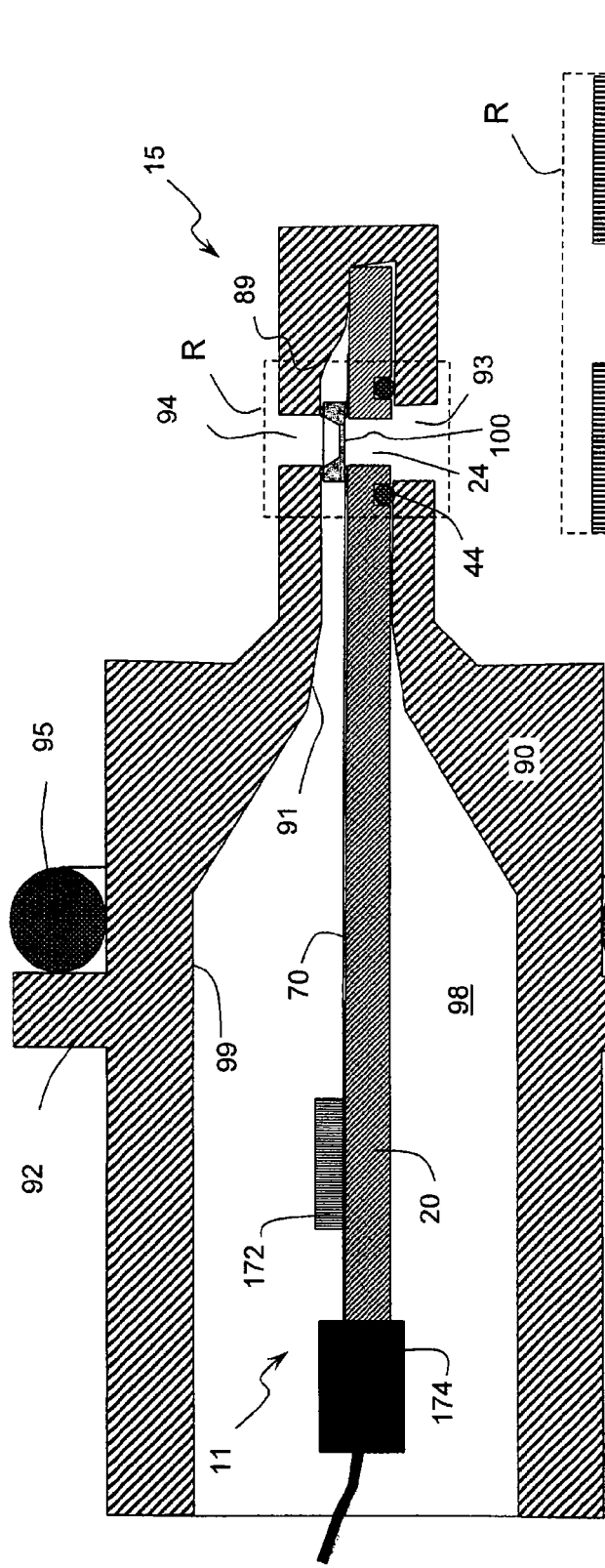
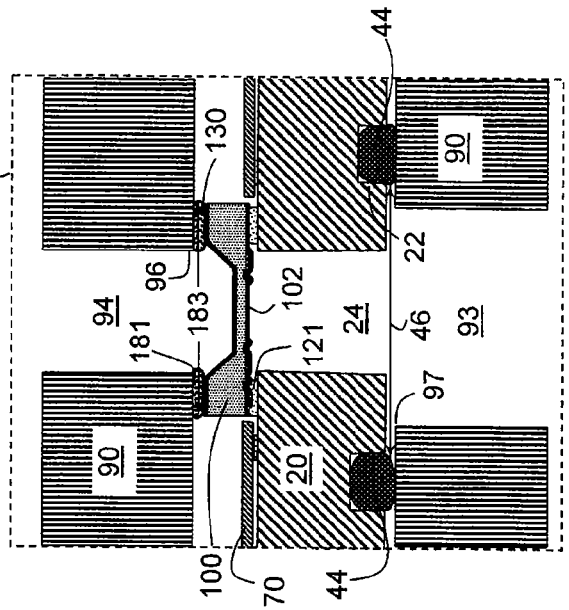
Fig. 39(a)
Fig. 39(b)

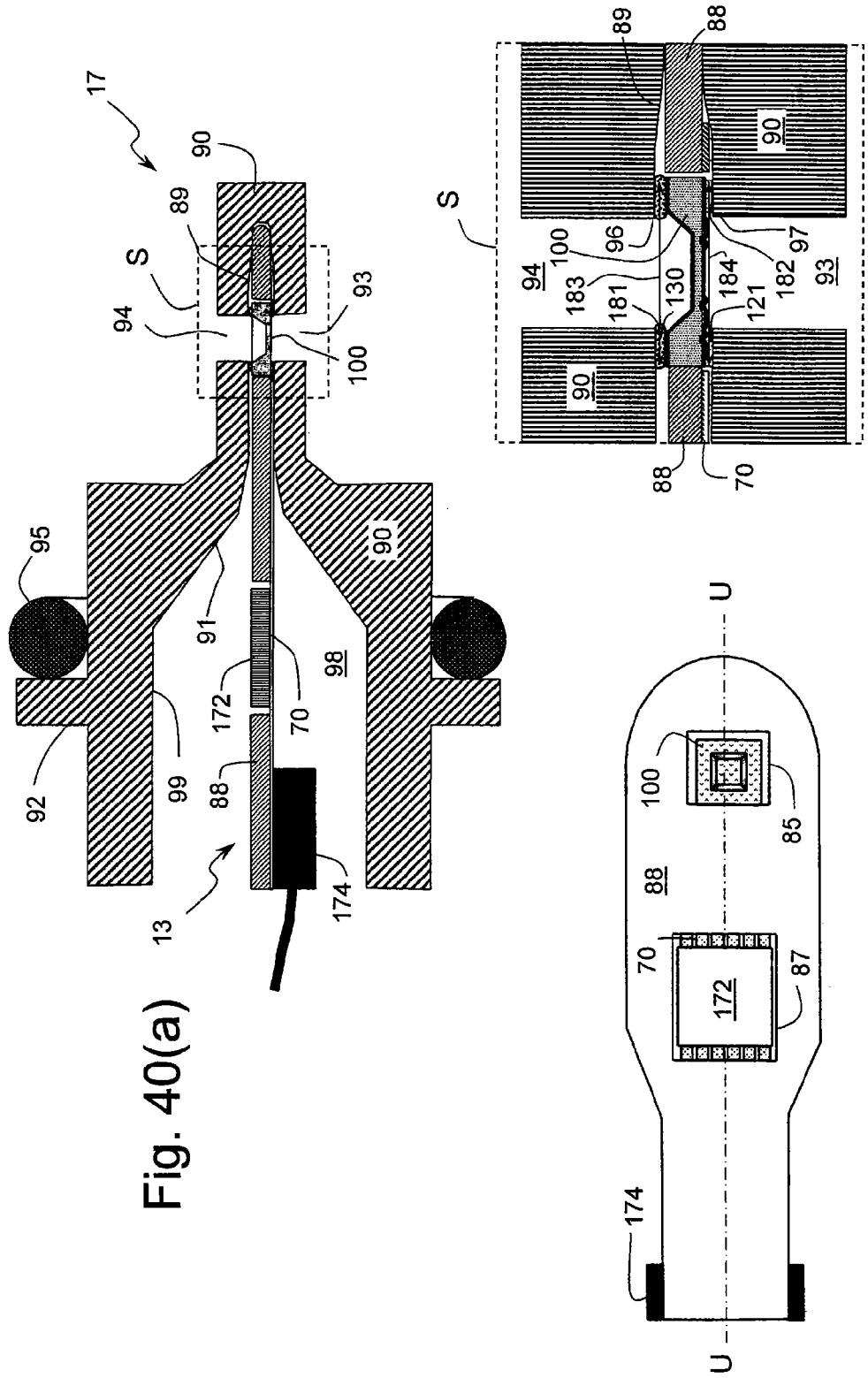

PRESSURE SENSOR

BACKGROUND OF THE INVENTION

The present invention relates to a pressure sensor, especially a differential pressure sensor, which includes a mounting structure and has an inner region comprised of a membrane which may be acted on by fluid pressure applied to both sides.

Pressure or differential pressure sensors having a diaphragm with measurement electrical elements located thereon are disclosed by Jensen, et al. in U.S. Pat. Nos. 6,030,709 and 6,085,596 (Jensen '709 and Jensen '596, hereinafter); and by Krog, et al. in U.S. Pat. No. 7,010,984 (Krog '984, hereinafter) The diaphragm is formed as a thinned region of a semiconductor device, a sensor die, which is sealingly clamped or bonded into a two-part mounting. The measurement element on the membrane may be connected to further electronic components arranged on a circuit board fastened or supported on a part of the mounting.

Through-holes are formed in each of the two parts of the mounting, in order to impinge the sensor diaphragm with one or more test fluids under pressure. The test fluids may be liquids, gasses or a gas and a fluid. Fluid may be ducted to the sensor diaphragm from two portions of a fluid circuit, thereby measuring a differential pressure. One side of the diaphragm may be ducted to a calibration fluid pressure source, such as the atmosphere, and the other to a test fluid source, in which case the pressure sensor measures the "absolute" pressure of the test fluid relative to the standard.

Pressure sensors may be required to operate in especially difficult chemical environments wherein the test fluids are highly corrosive. Jensen '709 and Jensen '596 disclose pressure sensors that are fabricated as a plurality of sensor die sites on single crystal silicon wafers using microelectronic materials and manufacturing processes. A thinned region that carries pressure sensitive resistors is achieved by orientation dependent etching (ODE) of the silicon at the wafer level. A dual layer coating comprised of an electrically insulating film and a deposition of an amorphous metal layer are applied to both sides of the sensor die wafer as last process stages before the wafers are singularized (i.e., separated into single wafers), i.e. by dicing.

While the wafer scale fabrication of sensor die disclosed in Jensen '709 and Jensen '596 is effective in producing sophisticated core sensor transducer elements, the ultimate cost of a finished sensor assembly is importantly affected by the design and implementation of a system of seals to confine test fluids to impinge only protected surfaces of the sensor die and inert materials in the sensor assembly. Microelectronic processing technology is such that the active area of a pressure sensor may be made quite small, less than 1 $mm^2$ per sensor die site. Electrical output pads for connecting the sensor to an outside system require some additional die site area. After improving these two factors, a next most important sensor design feature affecting die cost is the die area that must be provided for sealing "off" the unprotected portions of the sensor die, electrical leads and mounting adhesives from corrosive test fluids.

Jensen '709 and '596 and Krog '984 disclose two sealing designs for providing die surface fluid seals: (1) mechanical sealing members such as an O-ring and (2) an adhesive layer applied in an undisclosed fashion and cured after assembly. Mechanical sealing members require substantial sensor die surface area to ensure that an adequate area of seal will be formed given the variations that are expected in the amount of seal compression due to component and assembly dimensional variations. Adhesive sealing between two closely spaced components is difficult to control in the case wherein a perimeter seal is to be formed around a central surface region that must remain uncoated by the adhesive during the adhesive cure process.

The potential reliability or manufacturing yield difficulties of both of the above two die surface sealing designs may be managed by adding sealing area to the die site design. However, adding die site area for sealing reliability increases sensor cost in several ways: fewer die per wafer, lower yields due to defects in corrosion protection layers, and larger, more rigid mounting components are needed to protect more fragile individual sensor die.

There is a need, therefore, for a pressure sensor sealing design that minimizes the sealing area needed at the sensor die surface level. A spatially efficient sealing design and fabrication method will allow reduced sensor die area, thereby reducing the die surface area requiring full integrity of protective coatings such as the amorphous metal films disclosed by Jensen '709 and Jensen '596, and improving the yield of good die sites per wafer. Producing more sensor die per wafer will also directly lower cost. Finally, die having smaller overall dimensions relative to thinned diaphragm areas will experience less strain and strain induced cracking during sensor assembly and while in service by the end user.

BRIEF SUMMARY OF THE INVENTION

It is therefore an object of the present invention to provide a differential pressure sensor, fabricated at wafer scale by microelectronic methods, at a low cost by reducing the area required to seal the sensor die surfaces, thereby increasing the number of sensor die per wafer.

It is also an object of the present invention to improve the yield of corrosion protected differential pressure sensors fabricated at a wafer scale by reducing the area of the sensor die surfaces that is exposed to corrosive test fluids.

It is also an object of the present invention to improve the assembly yield and reliability in service of semiconductor pressure sensors by reducing the sensor die lengths exposed to stresses.

The foregoing and numerous other features, objects and advantages of the present invention will become readily apparent upon a review of the detailed description, claims and drawings set forth herein. These features, objects and advantages are accomplished by a differential pressure sensor comprised of a micro-electromechanical sensor die fabricated as a plurality of sensor die sites on a semiconductor wafer, and then singularized, the sensor die having a top face surface including die electrical output pads exposed to a first test fluid source and a bottom side surface exposed to a second test fluid source. The differential pressure is further comprised of a sensor die support member having a die support member fluid access port with a support member port perimeter; wherein one of the top face surface or the bottom side surface is sealed fully around the support member port perimeter by a wafer scale seal formed on the plurality of sensor die sites before die singulation. Wafer scale seals may be formed by a photofabrication process, screen printing, stamp printing, or pressure transfer printing. Some embodiments of the present invention may comprise a photofabricated seal formed by a photosensitive polydimethylsiloxane material, by a filled photofabricated mold, and by photopatterned glass frit.

Further embodiments of the present invention include a top cover for assembly to the sensor die and sensor die support member after the sensor die is supported on the sensor die support. The top cover has a top cover fluid access port with a top cover port perimeter; wherein the other of the top face surface or the bottom side surface is sealed fully around the top cover port perimeter by wafer scale seal or an applied-in-place seal formed on one of the sensor die or the top cover before assembly of the top cover.

For further embodiments of the present invention, the top cover is assembled to the die support member and sensor die and inserted into a rigid outer sensor case having a sensor cavity formed by a sensor cavity wall enclosure having an interior wall surface adapted to receive the assembly. The rigid outer sensor case has first and second test fluid access ports formed through the sensor cavity wall enclosure in fluid communication with the top cover fluid access port and the die support member fluid access port, respectively. The sensor cavity is dimensioned so as to mechanically compress the top cover seal member and the die support seal member and the first and second test fluid access ports having first and second openings in the interior wall surface that are positioned and dimensioned to lie within the top cover seal interior opening and the die support seal interior opening, respectively.

For still further embodiments of the present invention, the die support member and sensor die, or an electrically connected sensor die, are inserted into a rigid outer sensor case having a sensor cavity formed by a sensor cavity wall enclosure having an interior wall surface adapted to receive the assembly. The sensor cavity is dimensioned so as to mechanically compress, or ensure contact, of wafer scale or applied-in-place seals to inner perimeter surfaces of first and second test fluid access ports provided in the rigid outer sensor case.

BRIEF DESCRIPTION OF THE SEVERAL VIEWS OF THE DRAWINGS

These and other objects, features, and advantages of the present invention will become apparent to those skilled in the art upon a reading of the following detailed description when taken in conjunction with the drawings wherein there is shown and described an illustrative embodiment of the invention. In the drawings:

FIG. 1 is a perspective view of a differential pressure sensor assembly according to an embodiment of the present invention;

FIG. 2 is a cross-sectional view of the differential pressure sensor illustrated in FIG. 1;

FIGS. 4(a) and 4(b) are plan views of a die support member and a top cover according to embodiments of the present invention;

FIGS. 6(a) and 6(b) are plan views of a die support member and a top cover for an alternate configuration of the present invention;

FIGS. 9(a) and 9(b) are cross-sectional views of a sensor die illustrating the application of a photofabricated seal to the sensor die top surface and a form-in place seal to the sensor die bottom side, and vice versa, according to embodiments of the present invention;

FIGS. 12(a), 12(b), and 11(c) are cross-sectional view illustrations of process steps in the wafer scale fabrication of photofabricated seals on sensor die bottom sides according to embodiments of the present invention;

FIGS. 14(a) and 14(b) are cross-sectional view and plan view illustrations, respectively, of the application of an apply-in-place seal to the top face surface of a sensor die using a seal-shaped hollow dispense needle according to embodiments of the present invention;

FIG. 28 is an enlarged cross-sectional view of the sensor die region of a differential pressure sensor for an alternate configuration according to the present invention;

FIGS. 29(a) and 29(b) are plan views of a die support member and a top cover for an alternate configuration according to the present invention;

FIGS. 31(a), 31(b), 31(c), 31(d), 31(e) and 31(f) are plan view illustrations of process steps in the wafer scale fabrication of photofabricated seals on sensor top face surfaces according to embodiments of the present invention;

FIGS. 32(a), 32(b), and 32(c) are cross-sectional view illustrations of process steps in the wafer scale fabrication of photofabricated seals on sensor top face surfaces according to embodiments of the present invention;

FIGS. 33(a) and 33(b) are plan view and cross-sectional view illustrations, respectively, of the application of an apply-in-place seal to the bottom side surface of a sensor die according to embodiments of the present invention;

FIGS. 35(a) and 35(b) are plan views of the two sides of a die support member and a top cover formed in a single piece according to embodiments of the present invention;

FIG. 36 is a cross-sectional view of a differential pressure sensor formed using the single piece component illustrated in FIG. 35;

FIG. 37 is a side view illustrating the assembly of a single piece top cover and die support member mounting of a sensor die inserted and mechanically sealed into a rigid outer sensor casing according to embodiments of the present invention;

FIGS. 39(a) and 39(b) are side views illustrating the assembly of a die support member mounting of a sensor die inserted and mechanically sealed into a rigid outer sensor casing according to embodiments of the present invention; and FIGS. 40(a) and 40(c) are side views and FIG. 40(b) is a plan view illustrating the assembly of a sensor die inserted and sealed into a rigid outer sensor casing according to embodiments of the present invention.

DETAILED DESCRIPTION OF THE INVENTION

Figure 3:
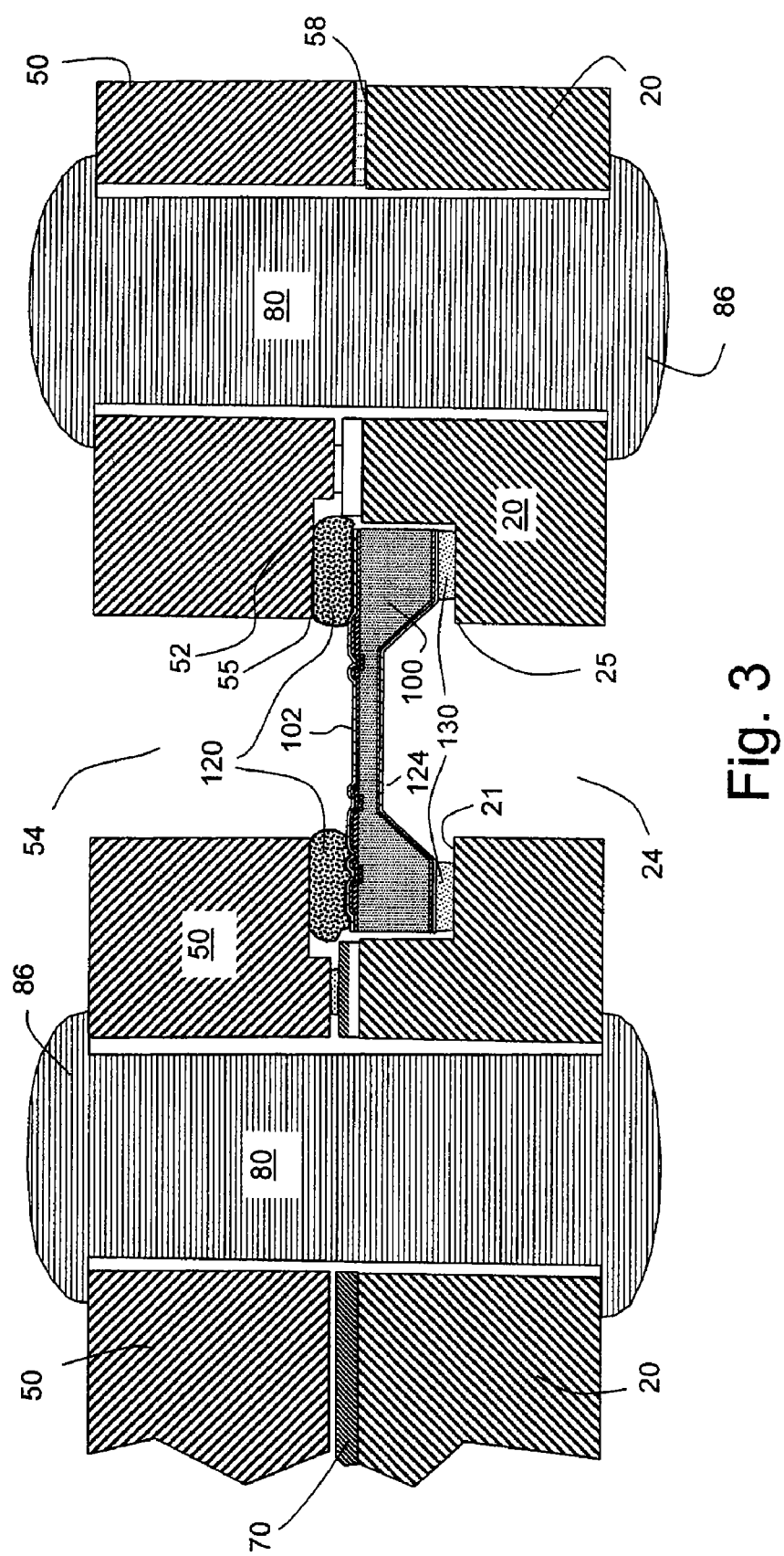
FIG. 3 is an enlarged cross-sectional view of the sensor die region of the differential pressure sensor illustrated in FIG. 2.

The invention is described in detail with particular reference to certain preferred embodiments thereof, but it will be understood that variations and modifications can be effected within the spirit and scope of the invention. The present invention provides differential pressure sensor apparatus designs which minimize the sensor die sealing areas needed in order to minimize die size. The term differential pressure sensor is used herein to denote a pressure sensor that measures a pressure difference between fluids impinging the two sides of a sensitive diaphragm carrying transducers that sensitive to diaphragm deflection, hence to strain. One of the fluids may be a fluid (gas or liquid) provided at a standard or calibration pressure, such as the atmosphere or a fluid in communication with the atmosphere. In this case the differential pressure sensor is may also be termed an absolute pressure sensor. That is, for purposes of understanding embodiments of the present invention, an absolute pressure sensor is considered to be a configuration of a differential pressure sensor and is intended to fall within metes and bounds of the present invention.

In the discussion hereinbelow, numerical labels are used to identify certain elements and features of the invention. The same labels and word phrases are used for same functional features and elements unless it is necessary for the discussion to differentiate between different versions or embodiments of a functional element or feature. This use of common labeling and naming should not be taken to indicate that same functional elements and features need be identical in all respects for the several embodiments of the present invention disclosed.

FIG. 1 illustrates in perspective view a differential pressure sensor 10 according to embodiments of the present invention. FIG. 2 illustrates differential pressure sensor 10 in cross-sectional view taken along the dash-dot line A-A in FIG. 1. Differential pressure sensor 10 is an assembly of several components, beginning with the active transducer component, sensor die 100. Sensor die 100 is encased by a die support member 20 and a top cover 50, held together by locking pins 80. Sensor die 100 is electrically connected to an electrical wiring connection board 70 that transfers electrical signals from sensor die output pads (not shown) to edge connector pads 78 for further connection to a controlling or interfacing application electronics system.

Top cover test fluid access port 54 is a through hole in top cover 50 allowing a test or calibration fluid to impinge on one side of sensor die 100. Die support test fluid access port 24 is a through hole in die support member 20 allowing a test or calibration fluid to impinge on the other side of sensor die 100. For some embodiments of the present invention differential pressure sensor 10 has an outer case seal 58 formed at an outer case perimeter that is located at the outermost area of overlap of top cover 20 and die support member 50 and is visible in FIGS. 1 and 2 along three sides of top cover 50.

FIG. 3 is an enlargement of the area around sensor die 100 and indicated by the dotted rectangle B in FIG. 2. In this enlarged view several features of the present invention may be seen. Sensor die 100 is mounted in a die support recess 21. A wafer scale die support seal 130 is formed on the sensor die in a wafer scale process to be discussed hereinbelow. An apply-in-place sensor die top face seal 120 is applied after the sensor die is electrically attached to wiring circuit board 70 in a manner to be described hereinbelow. Top cover 50 and sensor die support member 20 are held in compression by locking pins 80 welded into a rivet or locking pin tips 86.

For the embodiment illustrated, the wafer scale die support seal 130 and applied-in-place sensor die top seal 120 are held in compression by the locking pins 80 thereby insuring that the sensor die top face 102 and sensor die bottom side 124 are sealed to the top cover 50 and die support member 20 around the perimeter 55 of the top cover test fluid access port 54 and around the perimeter 25 of the die support test fluid access port 24. While welded locking pins 80 are illustrated, any means of holding the assembly under compressive force, for example, screws, bolts, clamping arrangements, rigid adhesives, welded portions, and the like, may be used to practice the present invention as contemplated by the inventors of the present invention.

A top cover die recess 52 may be provided to accommodate the dimensional build-up of seals, sensor die and electrical attachments. A portion of the outside seal layer 58 is visible at the end of the sensor assembly, outward of the right locking pin 80.

The inside surfaces of die support member 20 and top cover 50 are shown in plan view in FIGS. 4(*a*) and 4(*b*) respectively. Electrical connection wiring board 70 is positioned on die support member 20. The wiring board 70 may be adhered to the die support member or mechanically clamped and held in place by compression after the assembly of top cover 50. Sensor die 100 is already electrically connected to wiring runs (not visible) of the wiring board 70. A portion of the sensor die top face surface 102 may be seen within the interior of the sensor die top face seal 120. Through holes 82 are provided to receive locking pins. Outside seal layer 58 is illustrated as being placed on the inside surface of top cover 50. Alternatively, outside seal layer may be provide as a separate gasket layer or formed on the perimeter of the die support member 20.

Figure 5:
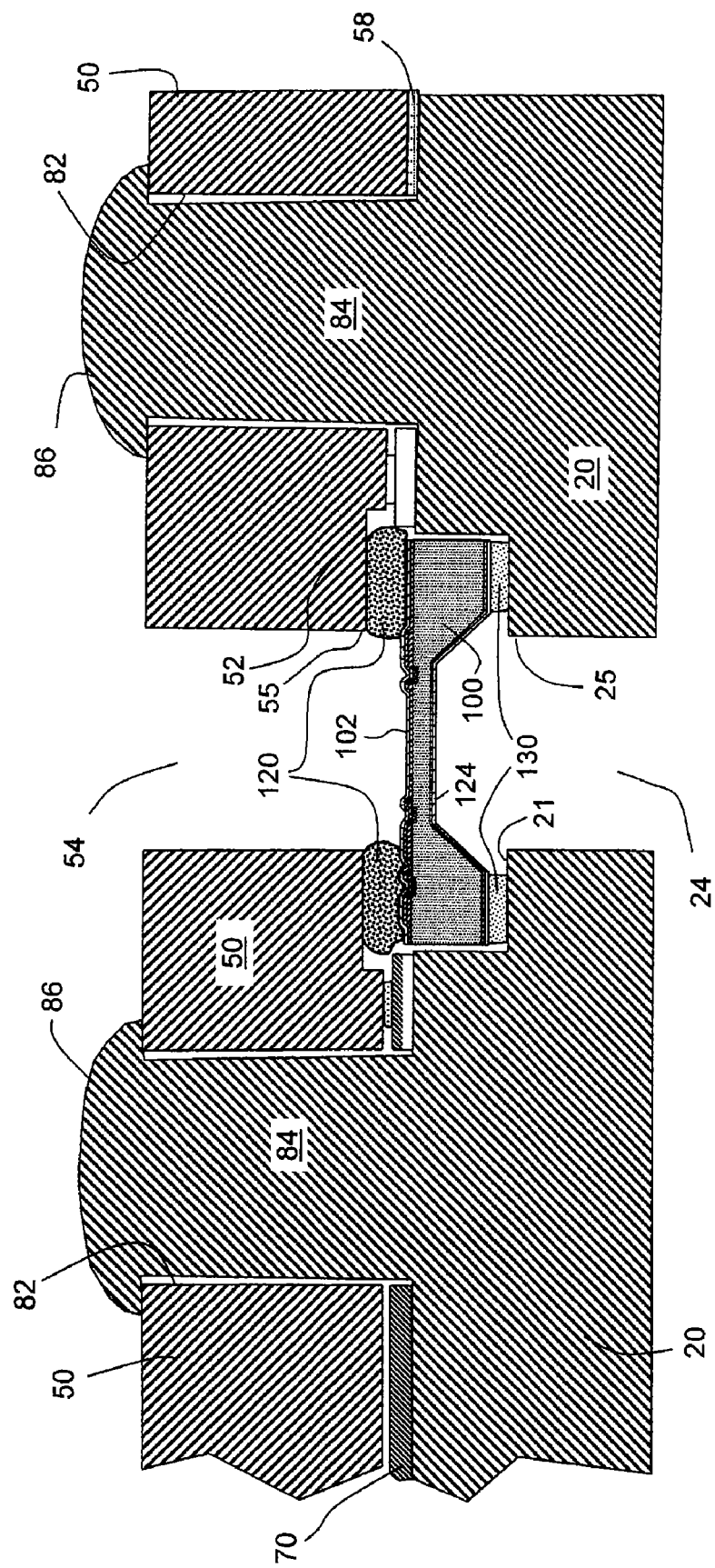
FIG. 5 is an enlarged cross-sectional view of the sensor die region of a differential pressure sensor for an alternate configuration of the present invention.

An alternative arrangement for locking or mechanically compressing the die support member 20 and the top cover 50 is illustrated in the enlarged cross-sectional view of the sensor die region shown in FIG. 5. In this embodiment, integral locking pins 84 are formed in the material of die support member 20, for example polystyrene, polyphenylene sulphide, or some other injection moldable, durable plastic material. The tips 86 of integral pins 84 are welded after insertion in through holes 82 to hold the assembly under compression. Alternatively, integral pins may be formed in the top cover 50 and through holes in the die support member 20.

A further embodiment of the present invention is illustrated in FIGS. 6(*a*) and 6(*b*) showing the inside surfaces of die support member 20 and top cover 50 that are formed with ultrasonic welding features 56 and 26. Instead of having an outer perimeter seal as shown in previous embodiments, an outer seal is formed by the ultrasonic welding of a ridge welding feature 26 on top cover 50 that is married to a receiving groove 56 on the die support member 50. Through holes 82 are illustrated for the use of locking pins around the site of the sensor die 100. However other ultrasonic welding features or the use of integral locking pins on one or both of the top cover 50 and die support member 50 could be used instead to maintain compression of the top face and bottom side seals against sensor die 100.

Wiring board conductor runs 72 terminate in electrical connection fingers (not shown) around and adjacent to output pads (not shown) on sensor die 100. Dummy conductor run material 76 is provided at the outer perimeter of electrical wiring board 70 to provide for proper spacing, hence compression, of the top cover and die support member around the perimeter of the assembly. An enlarged view of dotted area C is illustrated in FIGS. 8(*a*) and 8(*b*).

Figure 7:
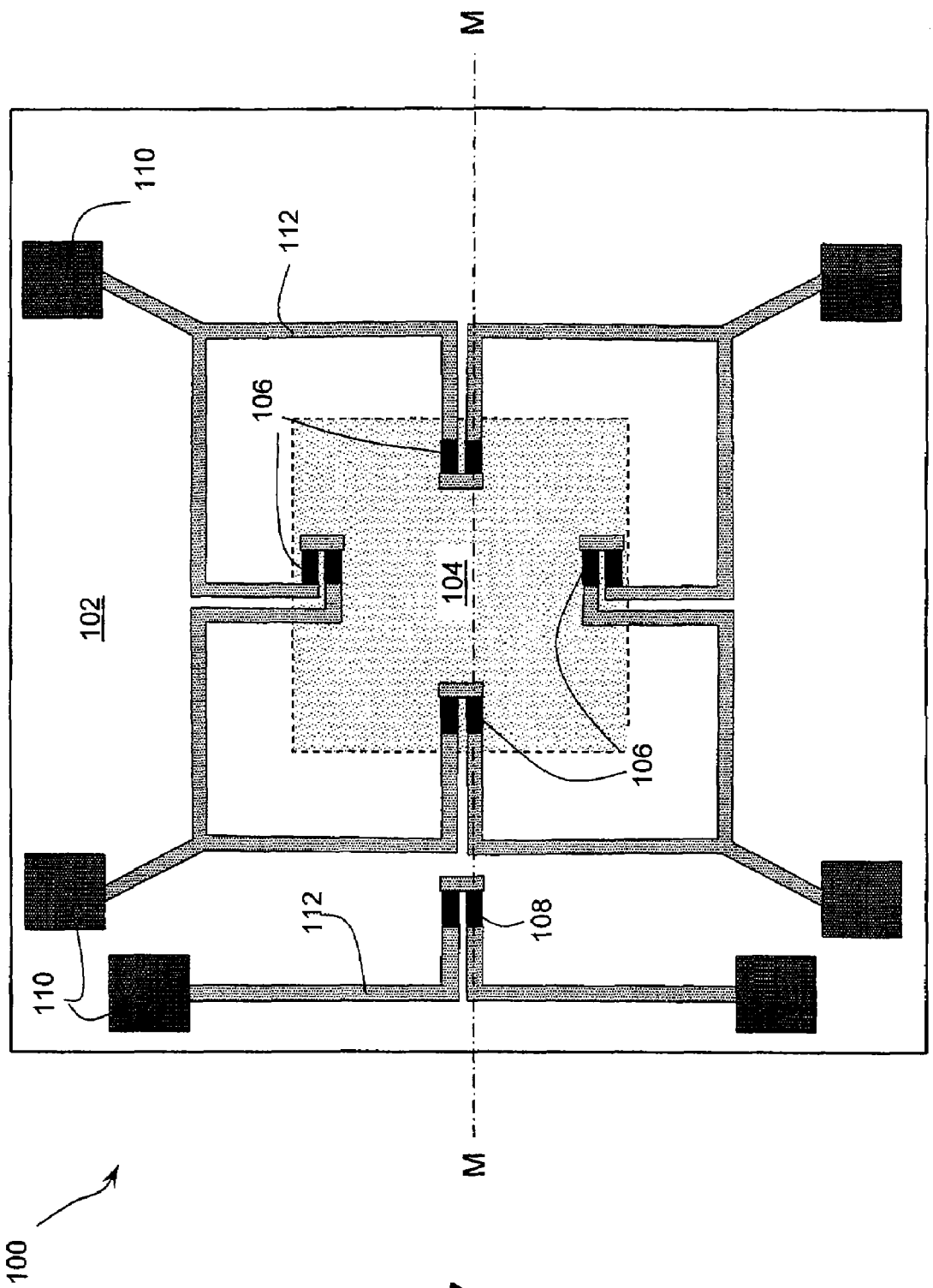
FIG. 7 is a schematic plan view of a sensor die top surface before the application of protective coatings.

FIG. 7 illustrates, in plan view of the top face surface, an example single sensor die 100 formed using standard microelectronic materials and designs. For this illustration, opaque protective layers, such as amorphous metal, have been omitted for clarity. Strain sensitive resistors 106 are formed in pairs near the edge of a central diaphragm area 104 of the die that has been thinned from the backside by etching. As thinned diaphragm area 104 is distorted by the application of differential fluid pressures to its two sides, strain resistors 106 change in resistance value. These changes are detected by passing current through the four resistors in a Wheatstone bridge arrangement via input/output electrical pads 100 and conductor runs 112. An auxiliary temperature sensitive resistor pair 108 is used to sense the temperature of the sensor die for purposes of calibration of the pressure sensing Wheatstone bridge resistors 106.

Figure 8B:
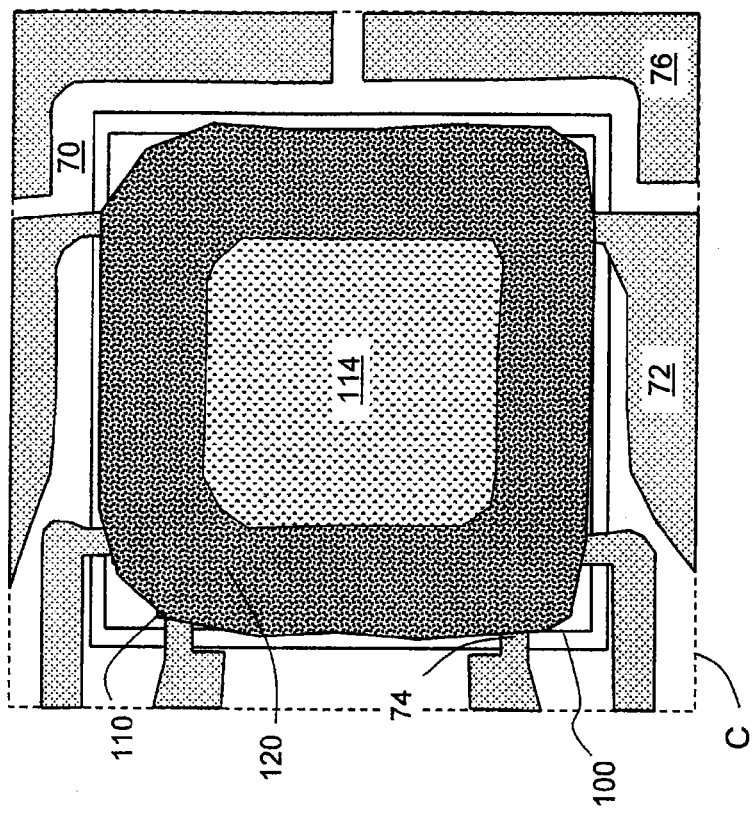
FIGS. 8(a) and 8(b) are enlarged plan views of the sensor die region after electrical lead attachments have been made and before and after an apply-in-place seal is applied according to embodiments of the present invention.
Figure 8A:
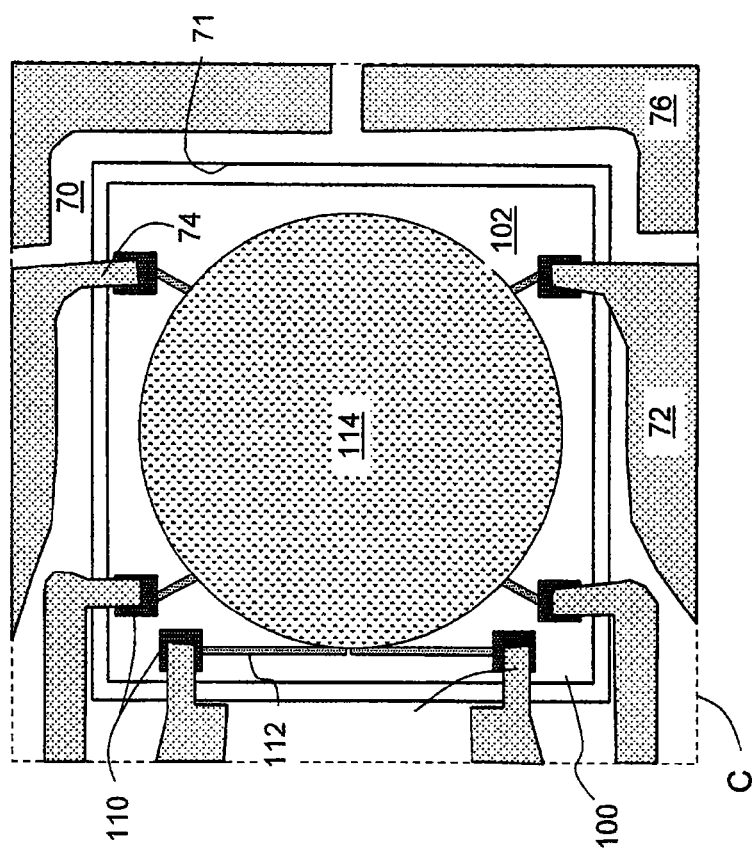

FIGS. 8(*a*) and 8(*b*) illustrate further stages of packaging sensor die 100. These Figs. show an enlarged plan view of the area C shown in FIG. 6(*a*). In FIG. 8(*a*) the Wheatstone bridge resistor arrangement and temperature sensor 108 illustrated in FIG. 7 is not visible because an amorphous metal anti-corrosion protective cover 114 has been formed on die sensor 100 in a wafer scale process. Sensor die 100 resides in a square opening 71 in electrical wiring board 70. Tape automated bonding (TAB) fingers 74 have been ultrasonically welded to sensor die output pads 100.

An apply-in-place seal is applied to form sensor die top face seal 120 after the sensor die has been electrically attached to the wiring board 70 via TAB fingers 74. This process may be performed before or after the wiring board and sensor die assembly is mounted on die support 20 (not shown). Also, there are several methods by which the wiring board leads 84 may be electrically attached to sensor die output pads 100 including reflow soldering, wirebonding and conductive epoxy.

Cross-sectional views of sensor dies having seals are illustrated in FIGS. 9(*a*) and 9(*b*) to further illuminate the two types of sensor die seals being discussed and the two positions of the seals. The cross-section is formed along dash-dot line M-M in FIG. 7. Seals may be formed at the wafer scale or after singulation and the wafer scale seal may be formed on either the sensor die top face or bottom surface. For the configuration illustrated in FIG. 9(*a*), the top face seal 121 is photofabricated at the wafer lever as will be explained hereinbelow. The sensor die bottom seal 130 is an apply-in-place seal that is after die singulation to a partially mounted sensor die, or alternatively, to the top cover before assembly. For the configuration illustrated in FIG. 9(*b*), the top face seal 120 is applied-in-place after die singulation and sensor die bottom seal 131 is photofabricated at the wafer lever as will be explained hereinbelow.

Other details of the sensor die structure are visible in FIGS. 9(*a*) and (*b*). A single crystal silicon wafer material 101 is processed at the wafer scale to form a plurality of sensor die sites such as those illustrated in FIG. 7. Insulating and passivating layers 111 and 105 are visible as under layers to the amorphous metal protective layer 114. Passivating layers 105 and 111 may be a standard microelectronic insulating material such as silicon nitride, silicon carbide, silicon oxide or the like. Strain and temperature resistors 106 and 108 may be formed as doped or implanted regions near the top face surface 102. The evident thinning of the silicon material to form thinned region 104 may be accomplished by orientation dependent etching (ODE) of the silicon wafer from the bottom side. Alternatively, a sensor die could be constructed by thinning the semiconductor wafer overall via mechanical and chemical polishing. For the purposes of the present invention it is only necessary that a sensor die is fabricated at the wafer scale having a deformable diaphragm that responds to a pressure differential applied to the two sides of the diaphragm.

The inventors of the present invention have realized that the use of photofabrication methods and materials, applied to sensor die sites at the wafer scale, can define sensor surface seal widths ($w_s$ in FIG. 9(*a*)) that are significantly smaller than mechanical or adhesive methods that have been taught in previous disclosures, such as by Jensen '709, '596 and Krog '984. Seal fabrication may be accomplished by adding a few additional photomasking, material deposition, and material delineation steps to a prior sensor die wafer fabrication process sequence. In the practice of the present invention, wafer scale seals are formed having sealing widths, $w_s$, of 50 to 700 microns. Wafer scale seal thicknesses, $t_{ws}$, are formed so that $t_{ws} \leq w_s$, and preferably, 25 microns $\leq t_s \leq$ 200 microns.

Figure 10:
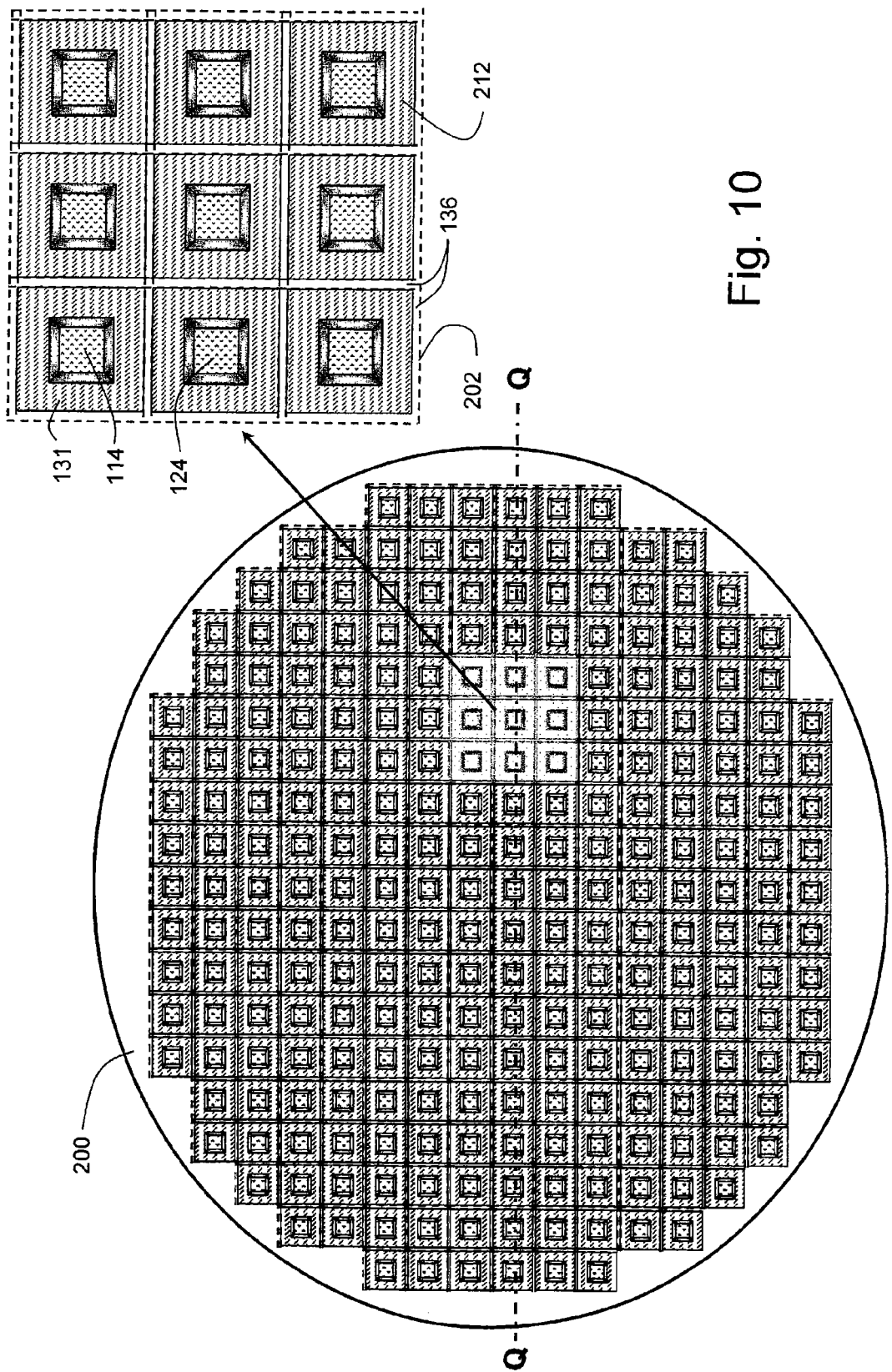
FIG. 10 is an illustration of the fabrication of photofabricated seals on sensor die bottom sides at the wafer scale according to embodiments of the present invention.

FIGS. 10, 11 and 12 explain the photofabrication of sensor die bottom side seals at the wafer scale. FIG. 10 is a plan view of a sensor wafer 200 of sensor die sites 212 that has been processed completely, ending with a photofabricated seal prepared on the sensor die site bottom surface. A 3×3 grid 202 of sensor die sites 212 has been enlarged in order to illustrate the photofabricated bottom side seal 131 that surrounds the central thinned diaphragm region of the sensor die bottom side 124 protected by amorphous metal protective coating 114.

Figure 11B:
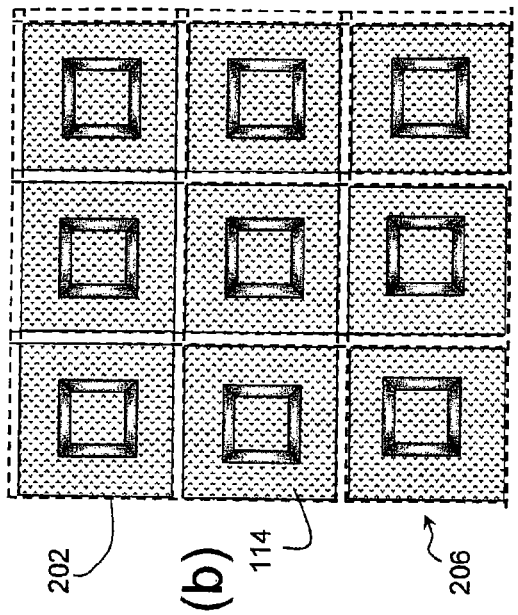
FIGS. 11(a), 11(b), 11(c) and 11(d) are plan view illustrations of process steps in the wafer scale fabrication of photofabricated seals on sensor die bottom sides according to embodiments of the present invention.
Figure 11D:
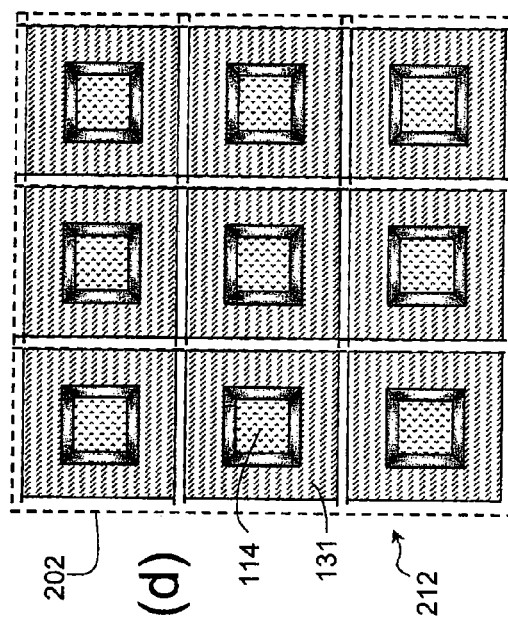
Figure 11A:
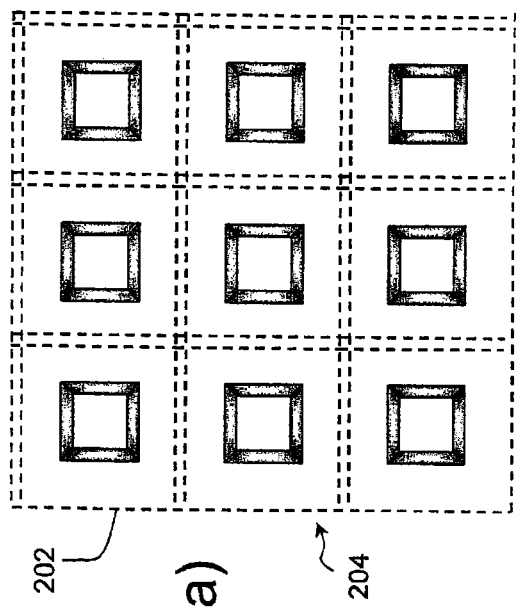

FIGS. 11(a), 11(b), 11(c) and 11(d) are plan view illustrations of 3×3 groups of die sites as the final stages of wafer scale fabrication is completed. The dotted lines in these figures indicate the dicing streets 136, i.e., the material that will be sawed away to singularize the wafer into individual sensor die. In FIG. 11(a) the sensor die wafer bottom side is illustrated after ODE processing has thinned the central diaphragm region. In FIG. 11(b) an amorphous metal protective coating has been applied and photopatterned to remove the layer in the dicing street areas. Amorphous metal protective coating compositions and deposition processes are disclosed in Jensen '709 and '596.

Figure 11C:
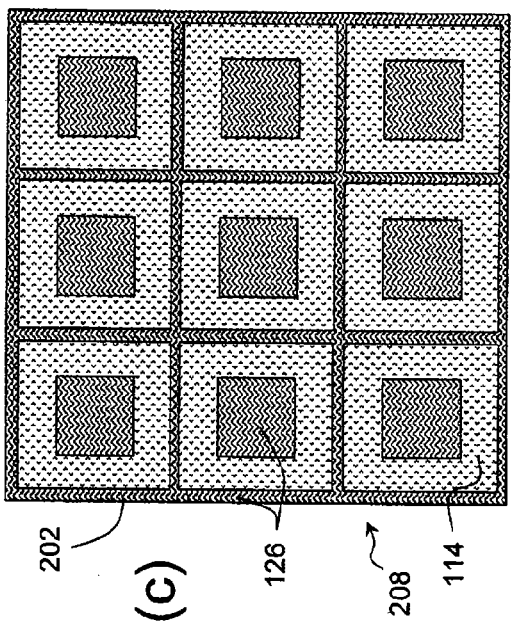

FIG. 11(c) illustrates a further sensor wafer processing step according to the present invention wherein a photopatterned mold pattern 208 is formed on the wafer using one of many microelectronic fabrication procedures adaptable to surfaces having substantial topography. That is, in the FIG. 11(c) illustration, photopatternable mold material 126 may be a spun-on or sprayed on photoresist material that conforms to the topography of the ODE processed wafer bottom side. The mold pattern 208 is the image negative of the intended final seal. The mold pattern 208 is designed so that seal material will not be present in dicing street areas FIG. 11(d) illustrates a final wafer scale fabrication stage according to the present invention wherein the photopatterned mold illustrated in FIG. 11(d) is filled with bottom side seal material 128 which is then cured in place. The bottom side seal material may be one of many elastomeric or compressible materials, especially a polydimethyl siloxane or silicone rubber. The bottom seal material is selected to be chemically inert to the test fluids that may be applied to the pressure sensor. The photopatterned mold may be filled by spinning, spraying or doctoring on the bottom seal material. After cure of the bottom seal material, the photopatterned mold material is removed. This process also removes any bottom seal mold material that remained in the recessed, ODE etched areas of the bottom side of the sensor wafer.

FIGS. 12(a), 12(b) and 12(c) are side view illustrations of the final wafer scale fabrication process steps for the photofabrication of sensor die seals on the bottom side surface. The sensor die bottom side surface is drawn as the upper surface in FIGS. 12(a)-12(c), i.e., as the wafer is viewed "bottom-side-up" in FIGS. 10 and 11. These Figures show side view detail of the processes illustrated in FIGS. 11(c) and 11(d). The cross-sections are formed along a line similar to the dash-dot line M-M in FIG. 7. The photopatterned seal mold may be seen as a pattern of photopatternable mold material 126 in FIGS. 12(a) and 12(b). Bottom side seal material 128 is illustrated in FIG. 12(b) filling the photopatterned mold material 126 and remaining as the final photofabricated sensor die bottom side seal 131 in FIG. 12(c). Some bottom side seal material 128 that remained in the ODE recesses of the bottom side after mold fill is removed with the removal of the photopatterned mold material 126. Also, the bottom side seal material is not deposited in dicing street areas 136 in order to facilitate reliable and productive sensor die singulation without the impediment of soft seal material in the dicing streets.

FIGS. 11 and 12 illustrate photofabrication of a sensor die bottom seal by first forming a mold pattern, filling it with seal material and then removing the mold pattern. Alternatively, according to the present invention, the seal material itself may be photosensitive, for example, photosensitive polydimethyl siloxane or glass frit. For these embodiments, the bottom seal is formed in analogous fashion to the formation of the mold pattern illustrated in FIGS. 11(c) and 12(a), except a positive image of the intended bottom seal pattern is used to delineate the photosensitive seal material. The sensor die bottom seal pattern is then completed by developing the photosensitive material resulting in the seal patterns illustrated in FIGS. 11(d) and 12(c). The process step illustrated in FIG. 12(b), filling a mold pattern, is therefore omitted.

If glass frit is utilized as a photofabricated sensor die bottom side seal, then the sensor die support member must be fabricated of a high temperature tolerant material, such as a ceramic or aluminum oxide, that may be cycled to glass frit reflow temperatures. A primary objective of the present invention is to utilize sensor die having amorphous metal protective coatings that cannot withstand high temperature exposure while retaining the desired amorphous atomic arrangement. Consequently, the glass frit seal material must have a sintering or reflow temperature of less that 500° C. and preferably less than 450° C. Further, for embodiments of the present invention using glass frit sensor die bottom side seals, the die sensor die is first bonded to the high temperature material die support member, before electrically connecting the electrical connection wiring board to the sensor die output pads. This is preferable to avoid subjecting the electrical wiring board materials to the glass frit reflow processing temperatures.

The present invention utilize sensor die surface seals that are photofabricated at the wafer scale in order to minimize the area of the sensor die that must be allocated to the die sealing function. It is contemplated by the inventors of the present invention that wafer scale seals may be formed on both sides of a sensor die wafer, before singulation. However, for some sensor configurations, the wafer scale photo fabrication methods that are adaptable to applying acceptable seal materials are not easily adaptable to two-side wafer processing without damaging the firstly formed seal. Consequently, apply-in-place gasket or seal technology may be used to provide the seal on the sensor die side opposite to the photofabricated seal. Apply-in-place seal technology uses an uncured seal material that is deposited, transferred or dispensed directly onto the workpiece in the intended seal shape. Examples of apply-in-place seal technology include extruding the seal material from a fine hollow needle tip while the tip or work piece is moved along a two-axis motion pattern, extruding seal material from a needle having a seal-shaped hollow, transfer stamp printing, screen printing and pressure transfer from a patterned carrier material. The present invention envision using any process of applying seal material in the intended shape directly to one of the singularized sensor die surfaces, or to a top cover member, to form an applied-in-place seal.

Figure 13B:
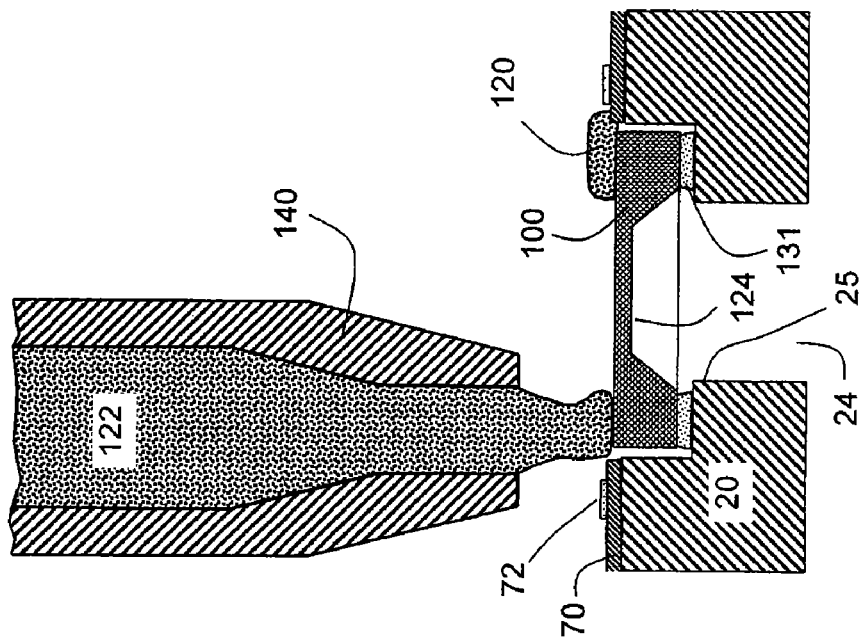
FIGS. 13(a) and 13(b) are plan view and cross-sectional view illustrations, respectively, of the application of an apply-in-place seal to the top face surface of a sensor die using a moved dispense needle according to embodiments of the present invention.
Figure 13A:
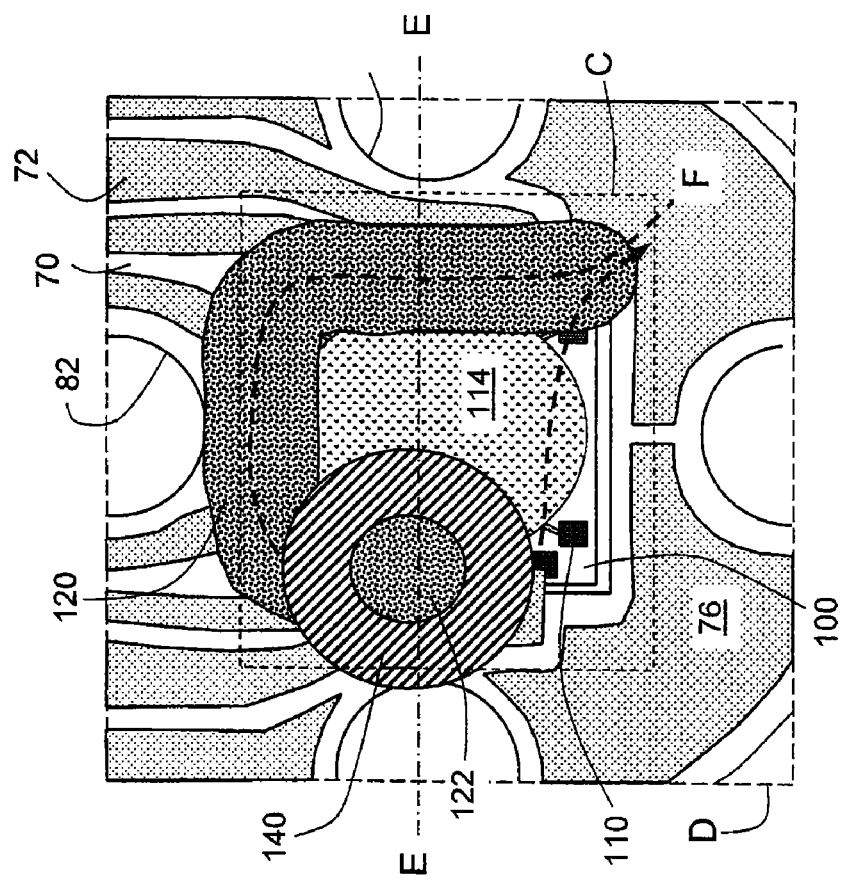

For the present invention, the apply-in-place seal is applied after sensor die have been singularized and electrically attached to an electrical connection wiring board. This is illustrated in FIGS. 13(a) and 13(b). FIG. 13(a) is a plan view of the sensor die 100 assembled and electrically connected to electrical wiring board 70, corresponding to the dotted rectangle area D in FIG. 4(a) and including the dotted rectangle area C in FIG. 6(a). Sensor die top face seal 120 is illustrated in mid-formation as an apply-in-place seal material 122 being dispensed by a dispensing needle 140. Dispensing needle 140 is moved relative to the sensor die top face along the seal pattern pathway shown as dotted arrow F. Dispensing of seal material 122 is turned on and off in an appropriate fashion to complete a bead of seal material pattern fully around the central area sensor die 100, leaving an exposed portion of the amorphous metal protected top face surface that will be impinged by a test fluid when the sensor is in use.

FIG. 13(b) illustrates the apply-in-place dispensing process in a side view taken along the dotted line E-E in FIG. 13(a). As may be appreciated by the illustrations of FIG. 13, the application of an apply-in-place seal to the sensor die top face, after sensor die electrical attachment, allows the seal to occupy a large lateral area than might otherwise be possible, thereby assisting the overall purposes of the invention to minimize sensor die area that is devoted to the sealing function. That is, the procedure and design illustrated in FIG. 13 allows the top face seal 120 to overlap both the electrical connection area of the sensor die and even the outer edge of the sensor die. Therefore, any tolerance problems associated with controlling the width of the apply-in-place seal may be accommodated by biasing the centerline of deposition of the seal to the outer boundary rather than towards the central portion of the top face which must remain open to test fluid impingement. In addition, if desired or needed, the clearance between the sensor die edge surfaces and the openings and recesses in the sensor die support member and electrical connection wiring board may be further enlarged to receive and control excess top face seal material or top face seal material that may migrate during cure.

An alternative apply-in-place seal forming process is illustrated in FIGS. 14(a) and 14(b). In this case a seal material 122 is dispensed from a needle 141 having a hollow 139 shaped in the shape of the intended seal shape, in this case a rectangle. FIG. 14(a) illustrates the shaped hollow needle seal dispensing process in cross-sectional view formed along a line analogous to E-E in FIG. 13(a), i.e. along line P-P in FIG. 14(b). FIG. 14(b) is a plan view through line Q-Q in FIG. 14(a) and including the features below this line. The seal-shaped hollow 139 is filled with top seal material 122. An advantage of this apply-in-place seal forming process is that the needle does not have to be moved to form the seal shape. Seal material is dispensed by a combination of up and down motion of dispense needle 141 with pressure pulsing of the seal material supply source, or may be accomplished by cycling the seal material pressure to extend and retract the seal material.

Figure 15:
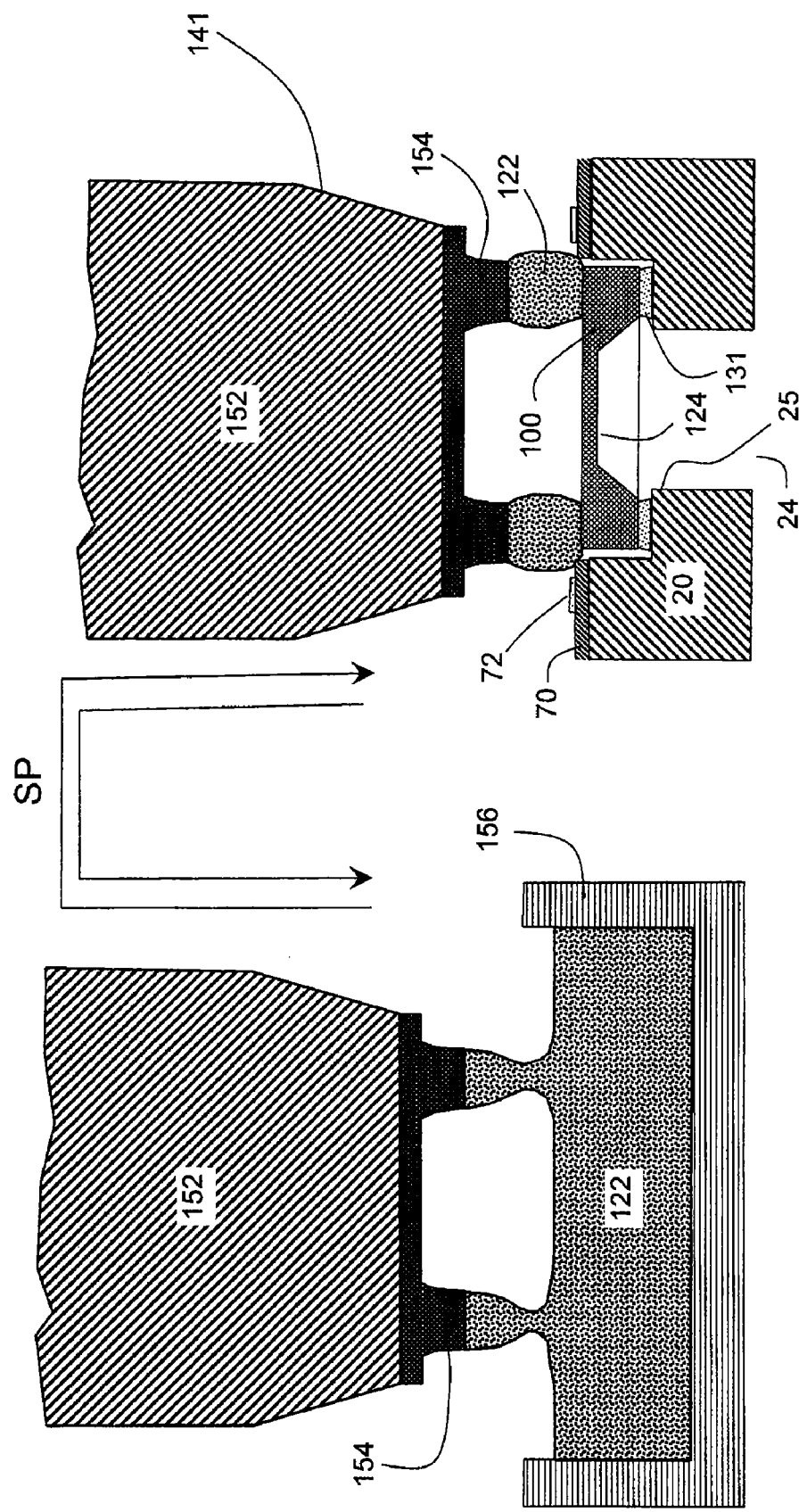
FIG. 15 is a cross-sectional view illustration of the application of an apply-in-place seal to the top face surface of a sensor die using a stamp transfer process according to embodiments of the present invention.

Another apply-in place seal forming process, stamp printing, is illustrated in cross-sectional view in FIG. 15. The cross-section is formed in similar fashion to that of FIG. 14(a). A stamp printer head 152 is fitted with a stamp 154 that is shaped in the form of the intended seal according to the stamping process design rules. The stamp is dipped into top seal material 122 held in material hopper 156, withdrawn and then touched to the intended seal location, the sensor die top face in FIG. 15. The stamp is then withdrawn from the seal location, leaving seal material 122 behind. The seal material 122 adheres to both the intended seal location surface and to the stamp surface. When touched and withdrawn from the seal material in the material hopper, or to the seal location surface, the seal material layer splits in a predictable fashion. Stamp print head 152 is moved along the cycling path indicated in FIG. 15 as "SP" to print a seal and then return to the material hopper to pick up seal material 122 for a next cycle. In this manner a seal is applied-in-place.

Figure 16:
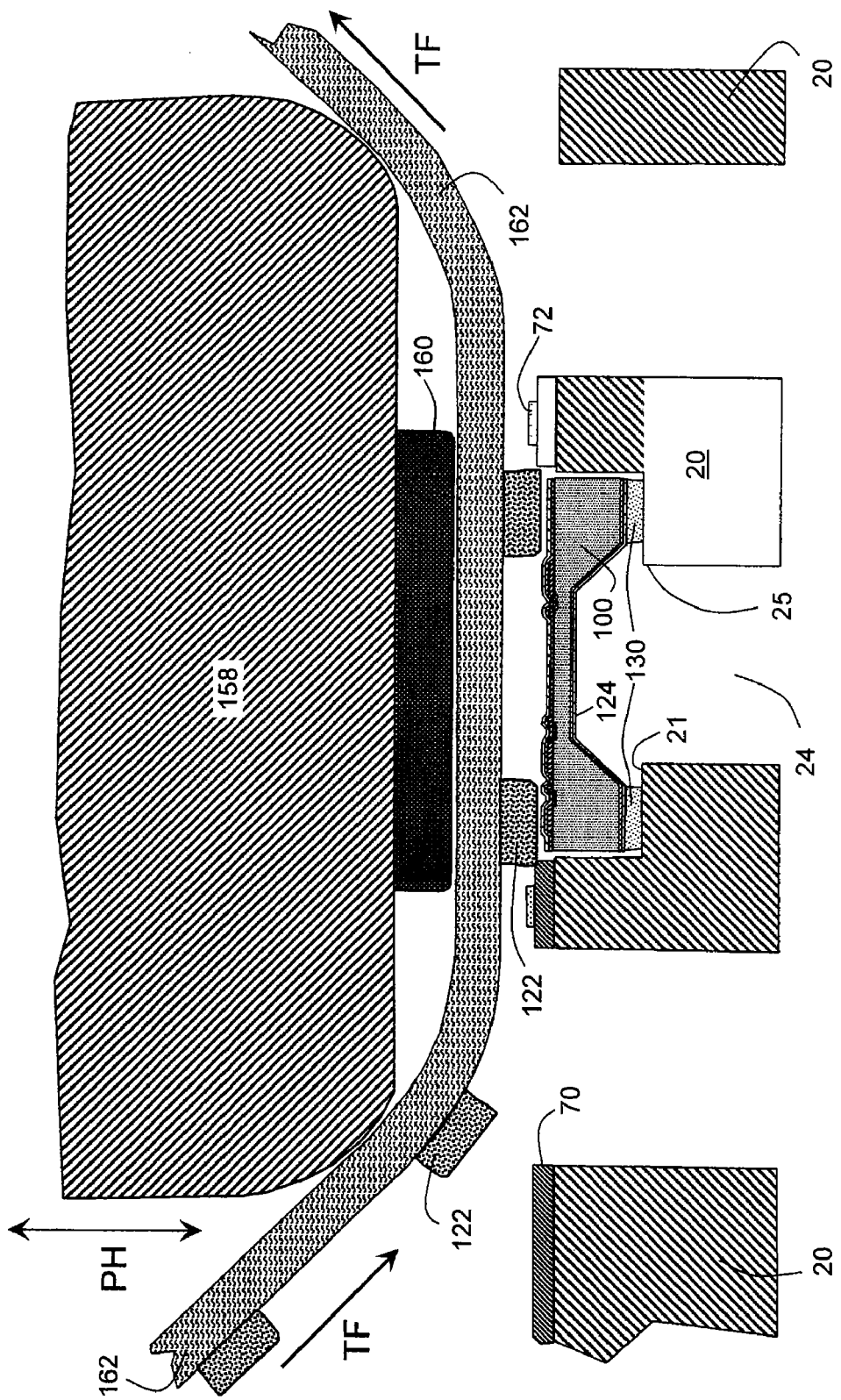
FIG. 16 is a cross-sectional view illustration of the application of an apply-in-place seal to the top face surface of a sensor die using a pressure transfer process according to embodiments of the present invention.
Figure 17:
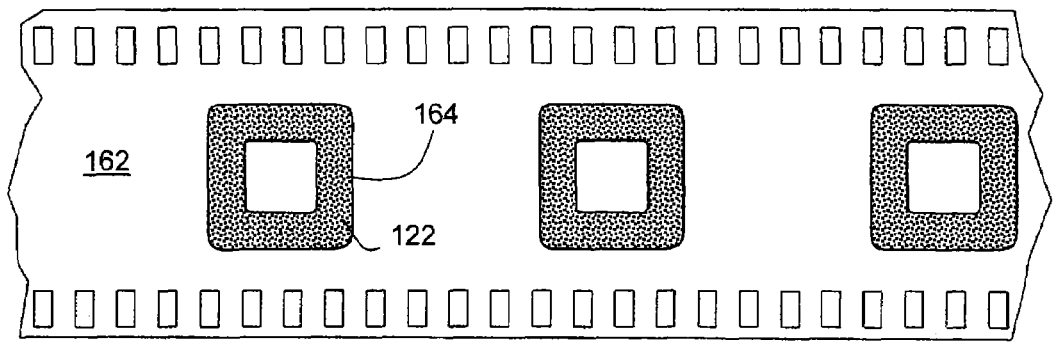
FIG. 17 is a plan view illustration of a portion of a tape-carried-seal material for a pressure transfer application of an apply-in-place seal to the top face surface of a sensor die according to embodiments of the present invention.

Another apply-in place seal forming process, pressure transfer printing, is illustrated in cross-sectional view in FIG. 16 and, further, in a plan view of a seal carrier material in FIG. 17. The cross-section in FIG. 16 is formed in a similar area to that illustrated in FIG. 3. In pressure transfer seal printing, the seal material 122 is formed in the intended seal shape 164 on a seal material carrier tape 162 that is advanced and positioned opposite the intended seal location on a workpiece and stopped. A transfer pressure head 158, fitted with a pressure transfer shoe 160, is then lowered to press the carrier tape and seal material against the intended seal location. Seal material 122 is held on the carrier tape in an uncured form so that it is tacky and adheres to the seal location surface more strongly than it does to the carrier tape material. When the seal carrier tape and the workpiece are separated, seal material 122 remains on the workpiece forming an applied-in-place seal.

Figure 18:
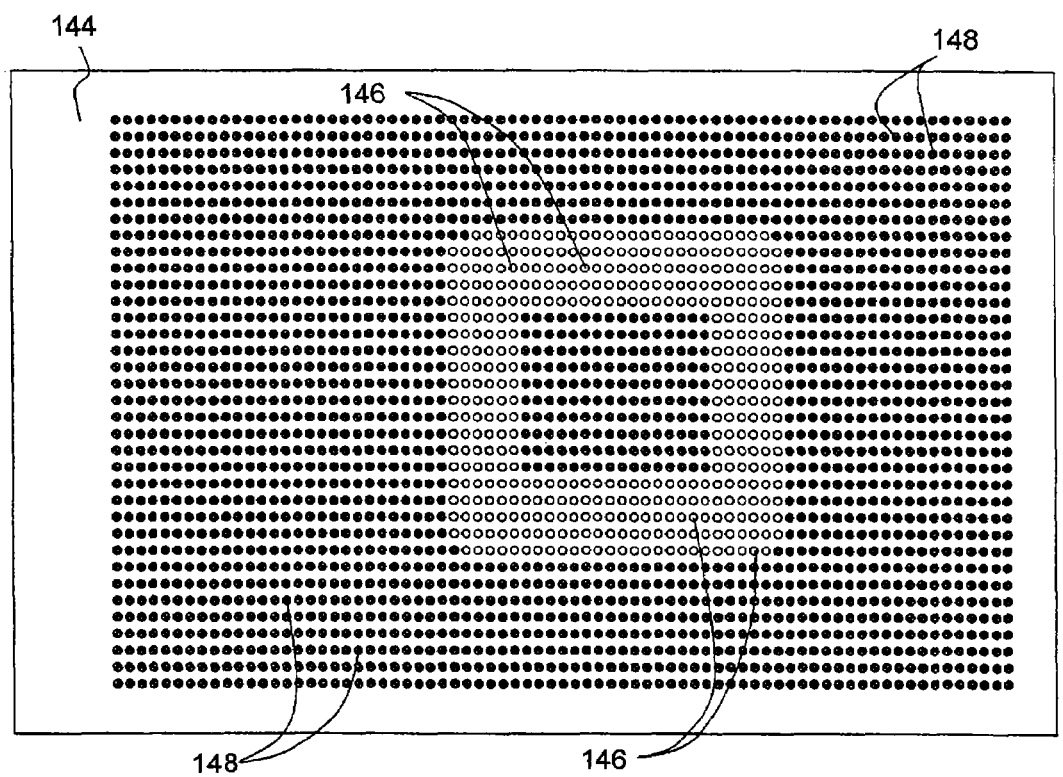
FIG. 18 is a plan view illustration of a seal-patterned screen for a screen printing process application of an apply-in-place seal according to embodiments of the present invention.
Figure 19:
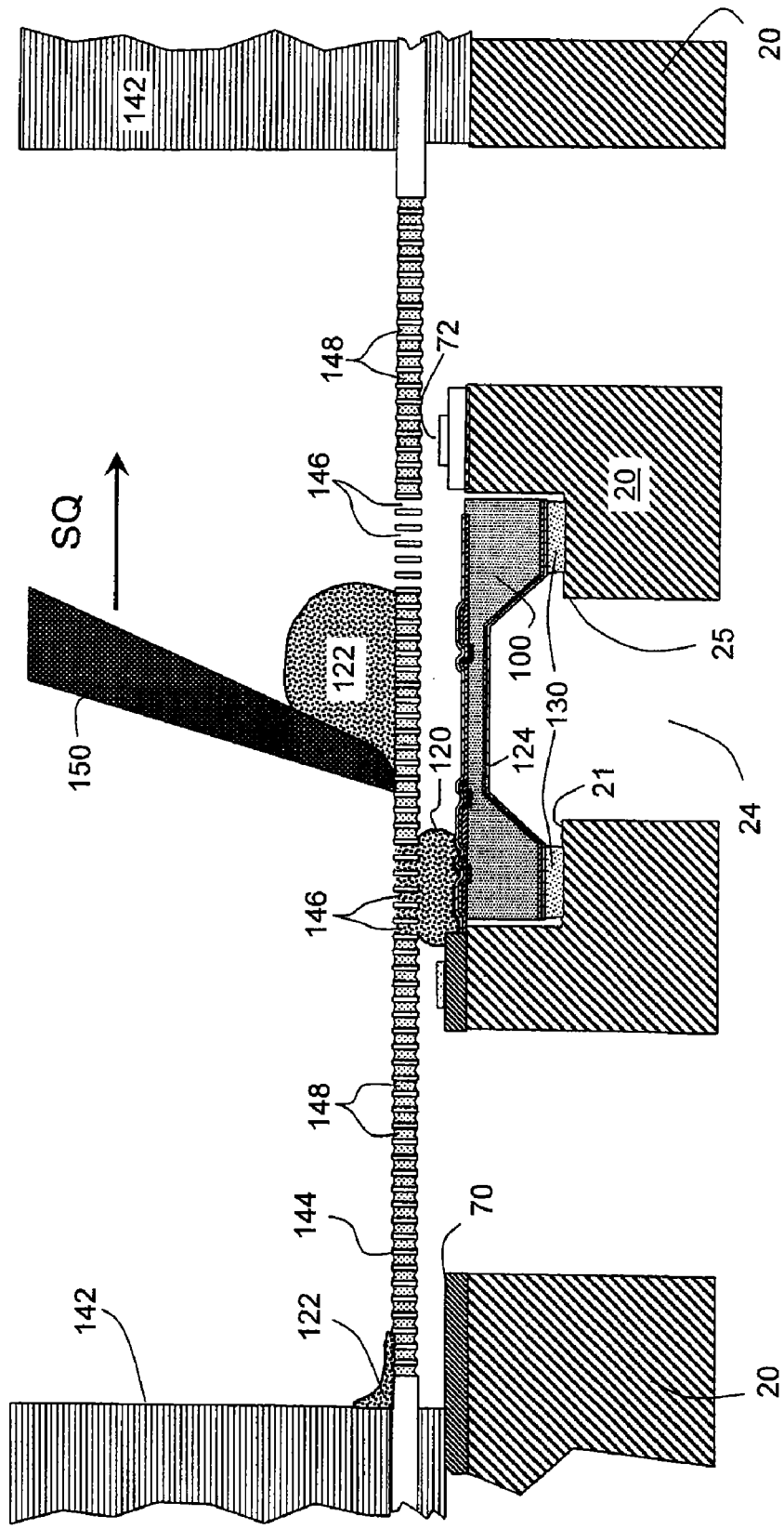
FIG. 19 is a cross-sectional view illustration of the application of an apply-in-place seal to the top face surface of a sensor die using a screen printing process according to embodiments of the present invention.

Yet another apply-in-place seal forming process, screen printing, is illustrated in cross-sectional view in FIG. 19 and, in a plan view of a seal-patterned screen in FIG. 18. The cross-section in FIG. 19 is formed in a similar area to that illustrated in FIG. 3. A screen printer material hopper 142 is positioned opposite the intended seal location on a workpiece and spaced away a distance appropriate to the intended seal thickness. A seal-patterned screen 144 is held at the bottom of screen printer material hopper 142. The seal-patterned screen 144 has open holes or pores 146 in the shape of the intended seal shape 164 and closed holes or pores 148 in all other areas of the screen. Seal material 122 is forced through open holes 146 in the screen 144 by means of a squeegee blade 150 that is moved (as indicated by the arrow "SQ") across the screen, pushing a bead of seal material. The screen 144 and workpiece are subsequently separated, leaving seal material 122 that has been extruded through the screen in a seal pattern onto the workpiece, thereby forming an apply-in-place seal according to the present invention.

An alternative embodiment of the present invention that may also be used to similar effect is to apply the apply-in-place seal material to the top cover around the perimeter of the top cover test fluid access port 54 as may be appreciated from FIG. 3 or 5. A dispense needle is operated in analogous fashion to deposit an apply-in-place seal to the inside surface of the top cover 50 around the top cover port perimeter 55, and a top cover die recess 52 may be designed to receive and control the sensor die top face seal material as it cures. The other methods discussed herein of forming applied-in-place seals may also be used to apply a seal to the top cover component.

In addition, for either approach of applying the form in place seal material to the sensor die top face itself, or applying the seal material to the top cover surface, the seal material may be cured before assembly of the top cover to the sensor die or after this assembly step. If the cure is performed before assembly, then a mechanical compression is maintained by locking pins, or the like, to compress both the top face seal and the bottom side seal. If the seal cure is performed after assembly, compressive force may not be required to ensure top face sealing, however it may be required to maintain compression of the pre-cured photofabricated seal applied to the bottom surface at the wafer scale. All of these variations in design are contemplated as preferred embodiments of the present invention.

The combination of a photofabricated sensor die bottom side seal 131 and an apply-in-place sensor die top face seal provides a design that allows a minimum of sensor die surface area to be devoted to sealing, as may be appreciated especially from FIG. 13(b). Wafer scale seals that have a sealing width, $w_s$, that is less than 500 microns wide (see FIG. 9(a)) may be formed by the use of a photofabrication process. By way of contrast, if mechanical sensor die seal members, such as 0-rings, are applied in mass production, sealing widths, $w_s$, of at least 1000 microns are typically required. Sensor dies having 1 mm$^2$ thinned diaphragm areas are typically manufactured with 16 mm$^2$ overall die dimensions in order to provide sufficient mechanical seal member sealing widths. In the practice of the present invention, photofabricated seal widths, $w_s$, of 50 microns to 200 microns are preferred in order to minimize sensor die size. By use of such narrow, photofabricated seals, overall sensor die sizes may be reduced to 4 mm$^2$ or less, yielding a substantial cost improvement over sensor dies designed for use with mechanical side surface sealing.

Other seal material application processes such as the screen printing, stamp printing and pressure transfer processes discussed above for applying seals to singularized die surfaces may also be adapted for wafer scale seal formation. Use of these processes for forming wafer scale seals may be especially useful as a compliment to photofabricated seal formation on one side of a sensor die wafer to fabricate wafer scale seals on the other side of the wafer. These patterned material transfer processes may not provide sealing widths as narrow as those achievable using photofabrication processes, however, they may be used to form wafer scale seals that are substantially smaller than those achievable in mass production using mechanical sealing members. Seal widths in the range of 200 microns to 700 microns may be formed by these methods, allowing overall sensor die sizes of 9 mm$^2$ or less, significantly smaller and less costly than sensor die sealed using prior art mechanical seal members.

Figure 20:
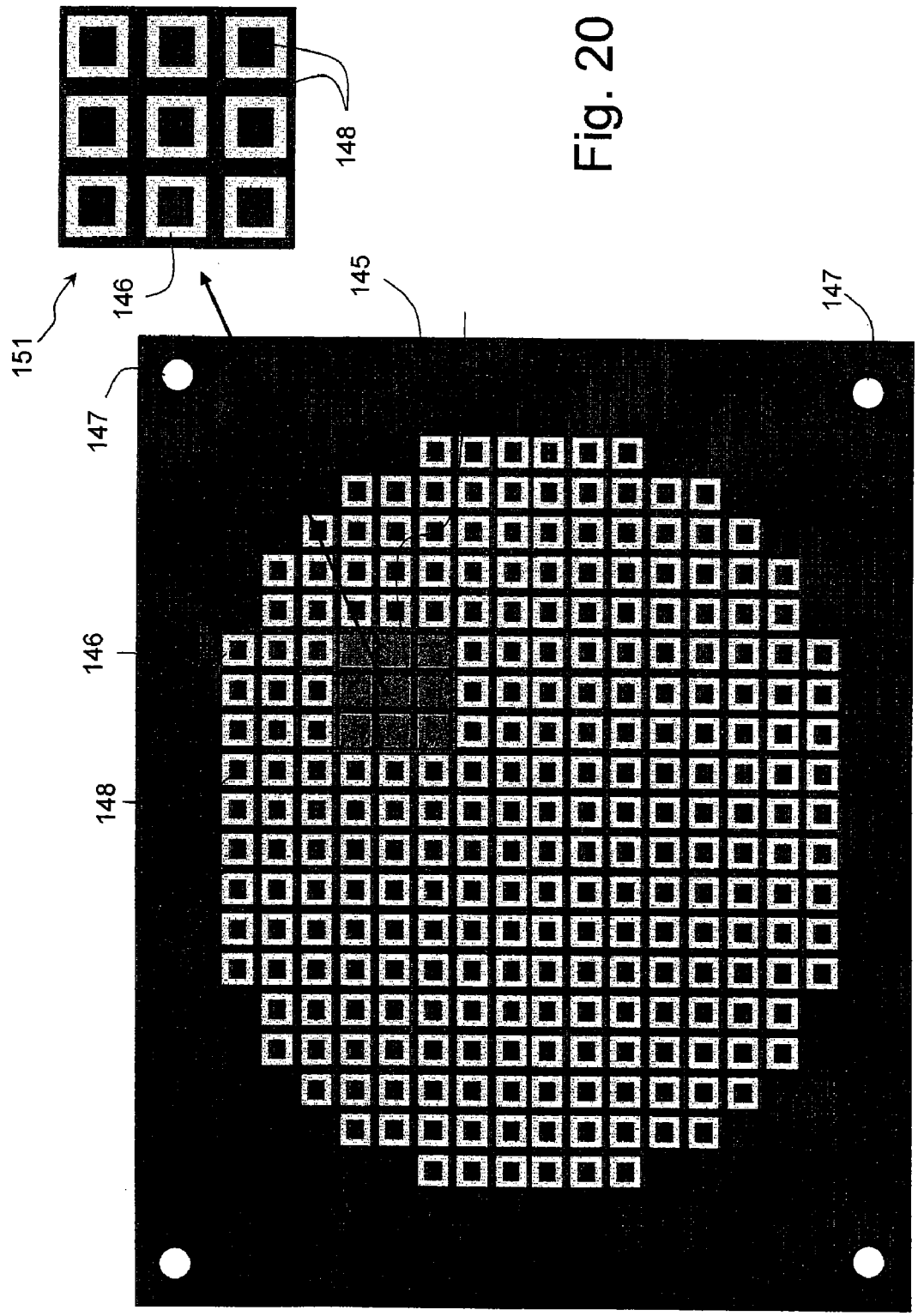
FIG. 20 is a plan view illustration of a seal-patterned screen for a screen printing process application of a wafer scale seal according to embodiments of the present invention.
Figure 21:
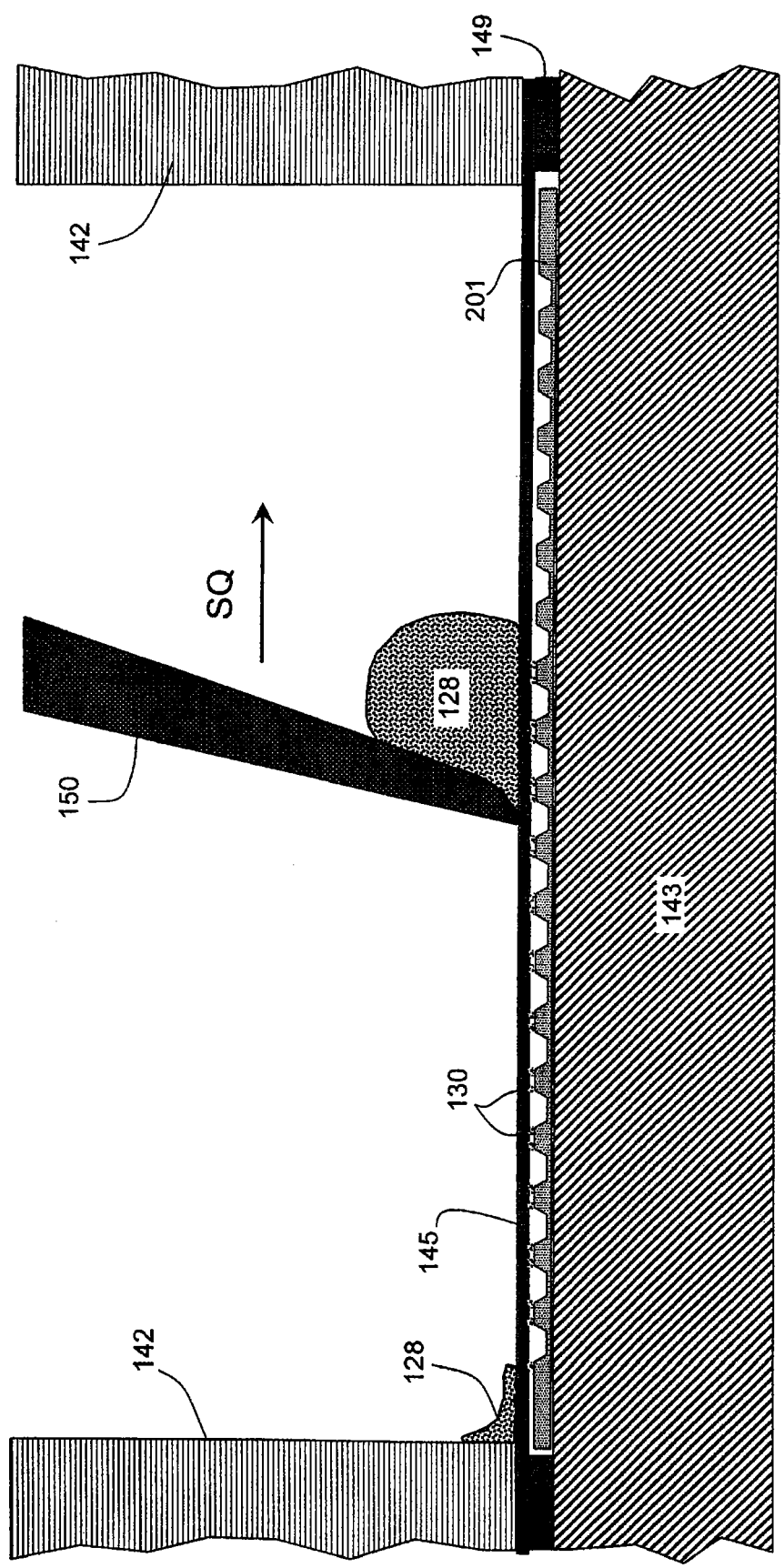
FIG. 21 is a cross-sectional view illustration of the application of a wafer scale seal to the bottom side surface of a sensor die using a screen printing process according to embodiments of the present invention.

Several alternate wafer scale seal formation processes are illustrated in FIGS. 20 through 28. FIGS. 20 and 21 depict a wafer scale screen printing process for forming sensor die surface seals. A wafer scale seal pattern of open areas 146 and closed areas 148 is formed in screen 145. A 3×3 grid of individual sensor die site seal patterns 151 is highlighted. The illustrated wafer scale seal screen pattern corresponds to a sensor die site layout like that illustrated in FIG. 10. The screen may also have alignment features, illustrated as pin holes, to assist in aligning the screen to a wafer of sensor die.

A cross-sectional view of wafer scale screen printing is illustrated in FIG. 21. The cross-section is formed along a line in the sensor die wafer like Q-Q in FIG. 10. A screen printer material hopper 142 is positioned opposite the sensor die wafer 201 held by a mounting chuck 143. In this illustration, the sensor die bottom side surfaces are up. That is, the screen printed seal pattern will be applied to the sensor die bottom side surfaces. A wafer scale seal-patterned screen 145 is held at the bottom of screen printer material hopper 142. The wafer scale seal-patterned screen 145 has open holes or pores 146 in the shape of the intended seal shape at each sensor die site and closed holes or pores 148 in all other areas of the screen. Seal material 128 is forced through open holes 146 in the screen 145 by means of a squeegee blade 150 that is moved (as indicated by the arrow "SQ") across the screen, pushing a bead of seal material. The screen 145 and wafer are subsequently separated, leaving seal material 128 that has been extruded through the screen in a wafer scale seal pattern onto the sensor die wafer, thereby forming a wafer scale seal at each sensor die site, according to the present invention. Seal material 128 may be fully cured or cured to an intermediate cure state before singulation of the sensor die.

Figure 22:
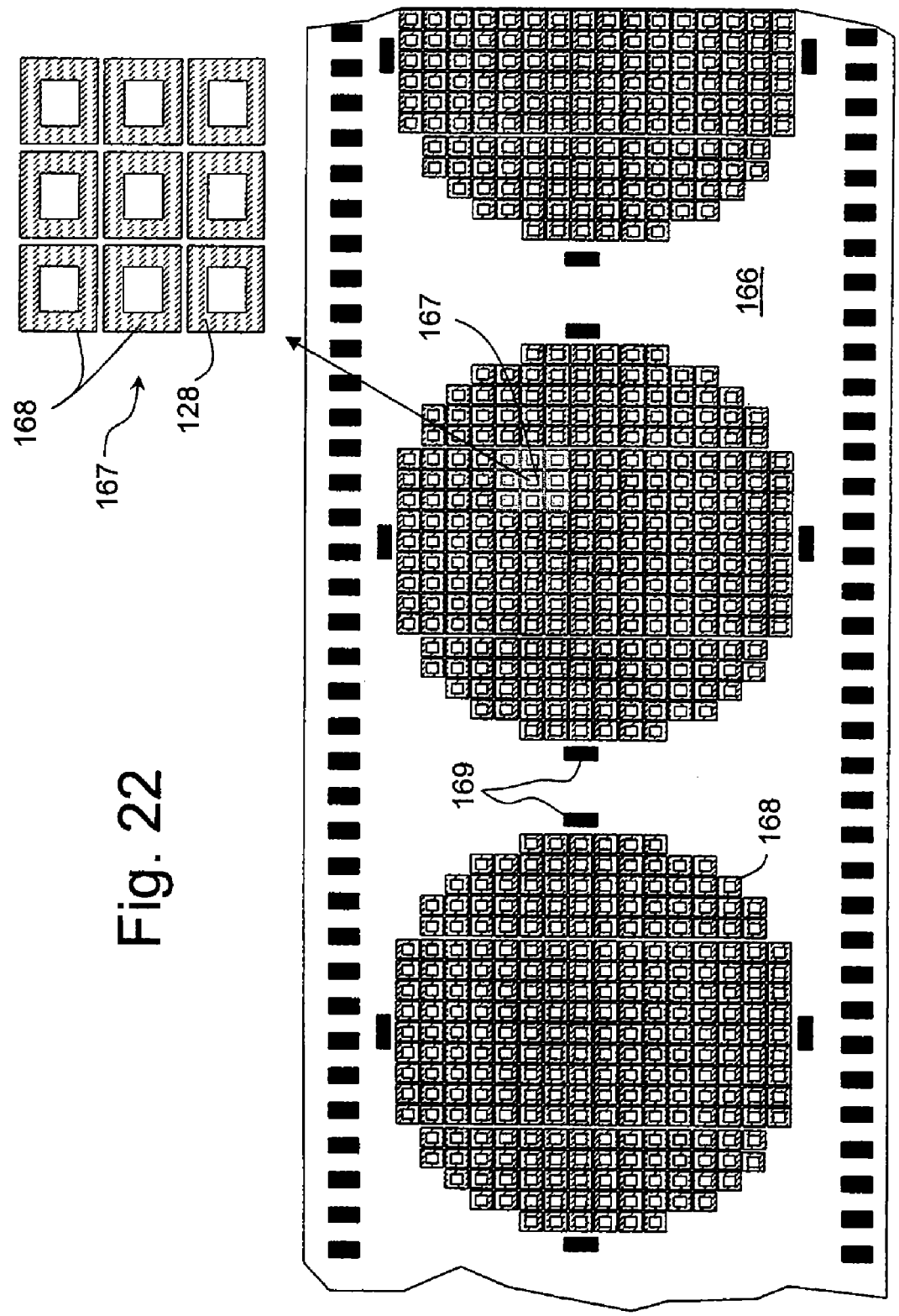
FIG. 22 is a plan view illustration of a portion of a tape-carried-seal material for a pressure transfer application of a wafer scale seal to a surface of a sensor die according to embodiments of the present invention.
Figure 23:
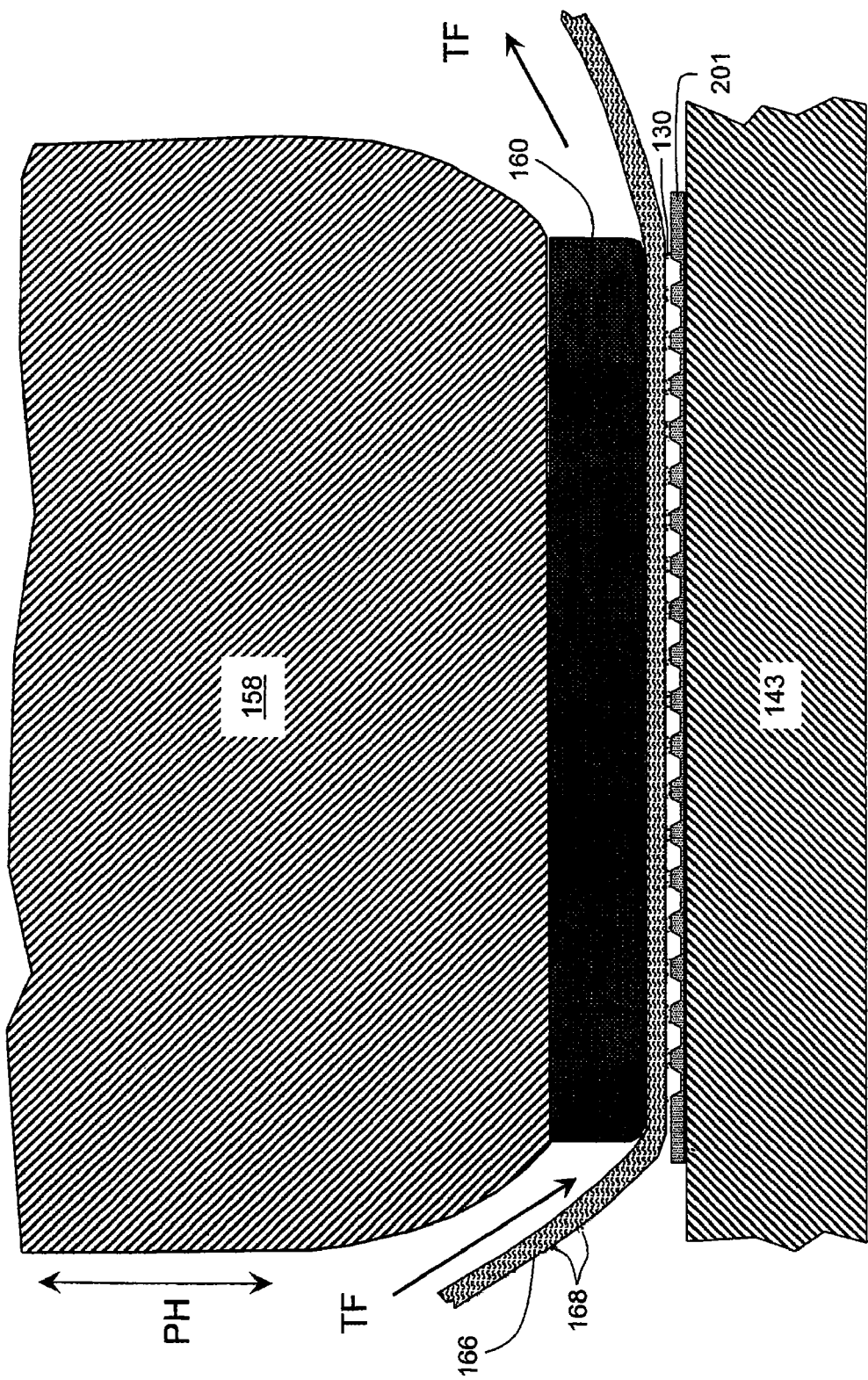
FIG. 23 is a cross-sectional view illustration of the application of a wafer scale seal to the bottom side surface of a sensor die using a pressure transfer process according to embodiments of the present invention.

Another wafer scale seal forming process, pressure transfer printing, is illustrated in cross-sectional view in FIG. 23 and, further, in a plan view of a seal carrier material, in FIG. 22. The cross-section is formed along a line in the sensor die wafer 201 like Q-Q in FIG. 10. A pressure transfer head 158 is positioned opposite the sensor die wafer 201 held by a mounting chuck 143. In this illustration, the sensor die bottom side surfaces are up. That is, the preformed wafer scale seal pattern will be pressure transferred to the sensor die bottom side surfaces. The seal material 128 is formed in the intended wafer scale seal shape 168 on a wafer scale seal material carrier tape 166 (FIG. 22) that is advanced (along direction "TF" in FIG. 23) and positioned opposite the intended seal location on a sensor die wafer 201 and then stopped. A 3×3 grid of individual sensor die site seal patterns 167 is enlarged and highlighted in FIG. 22. Alignment features 169 may be provided on the seal material carrier tape 166 to assist in aligning the wafer scale seal pattern 168 to the die sites on sensor wafer 201.

A transfer pressure head 158, fitted with a pressure transfer shoe 160, is then lowered (direction "PH" in FIG. 23) to press the carrier tape and seal material against the intended seal location. Seal material 128 (see FIG. 22) is held on the carrier tape in an uncured form so that it is tacky and adheres to the seal location surface more strongly than it does to the carrier tape material. When the seal carrier tape and the sensor die wafer are separated by raising the transfer pressure head, seal material 128 remains on the sensor die wafer 201 forming wafer scale seals 130. Seal material 128 may be fully cured or left in an intermediate cure state before singulation of the sensor die.

Figure 24:
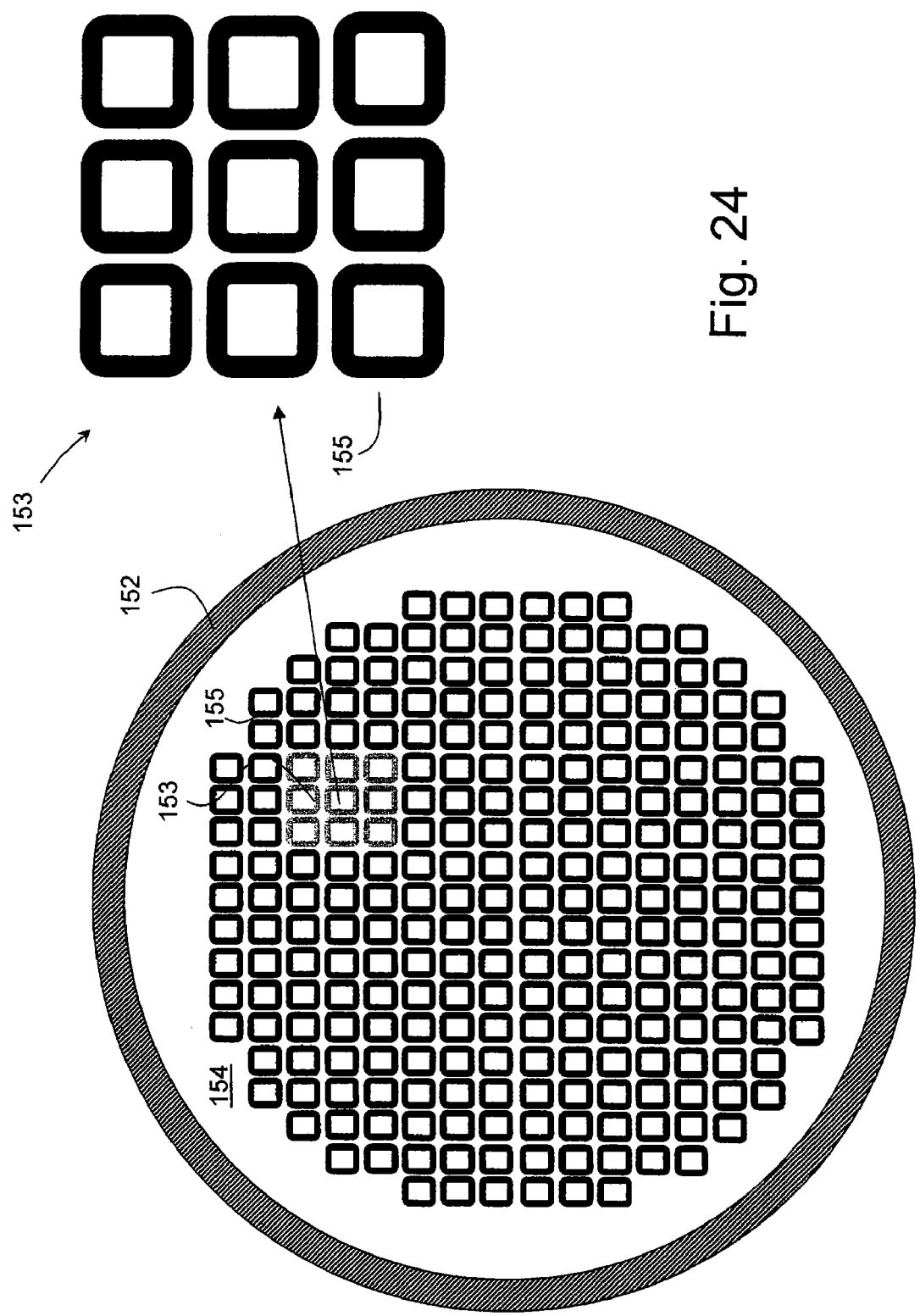
FIG. 24 is a plan view illustration of a seal-patterned stamp head for a stamp printing process application of a wafer scale seal according to embodiments of the present invention.
Figure 25:
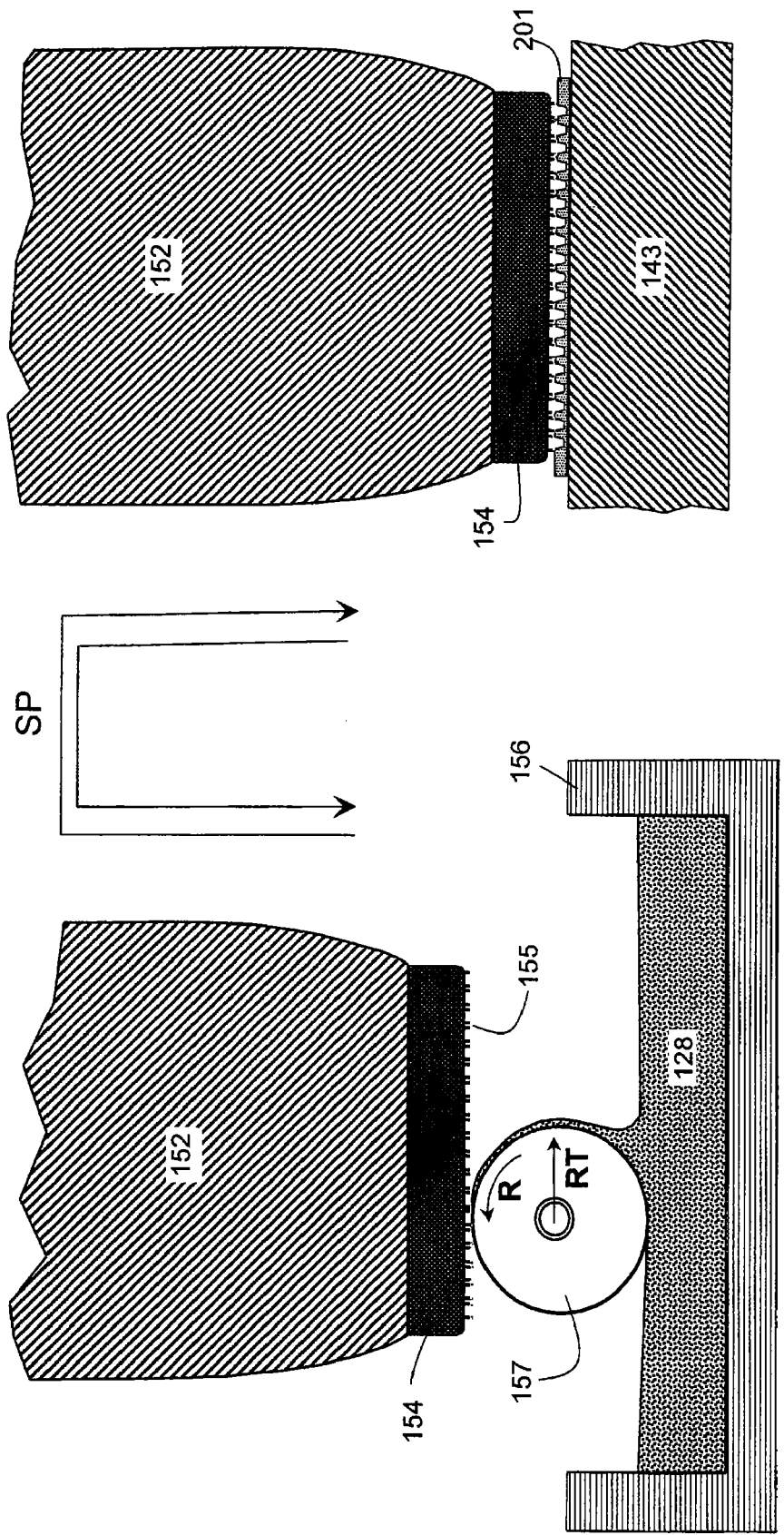
FIG. 25 is a cross-sectional view illustration of the application of a wafer scale seal to the die bottom surface of a sensor die using a stamp transfer process according to embodiments of the present invention.
Figure 26:
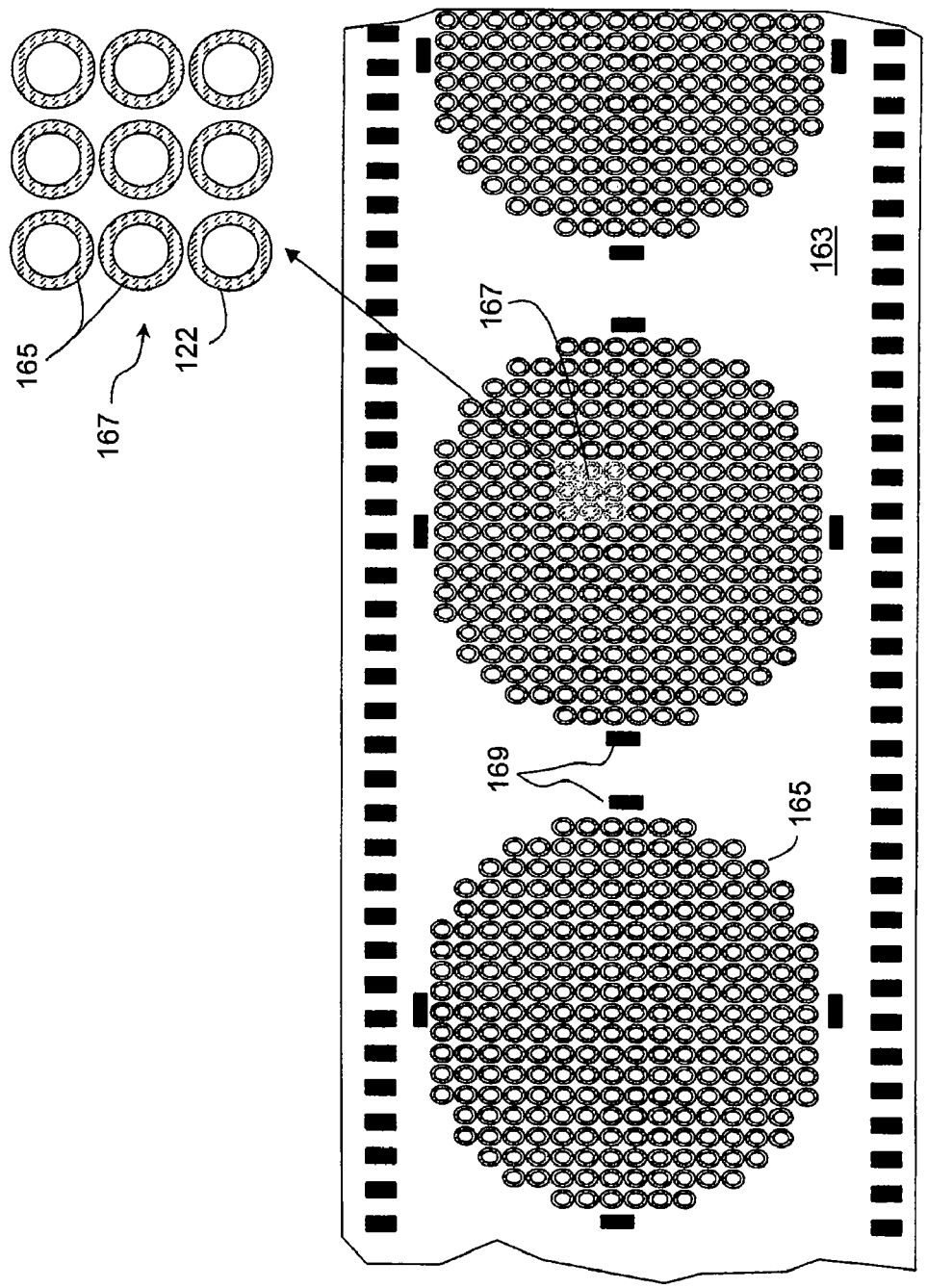
FIG. 26 is a plan view illustration of a portion of a tape-carried-seal material for a pressure transfer application of a wafer scale seal to a surface of a sensor die according to embodiments of the present invention.

Another wafer scale seal forming process, stamp printing, is illustrated in cross-sectional view in FIG. 25 and a stamp head pattern in plan view in FIG. 24. The cross-section is formed along a line in the sensor die wafer 201 like Q-Q in FIG. 10. A stamp printer head 152 is positioned opposite the sensor die wafer 201 held by a mounting chuck 143. Stamp printer head 152 is fitted with a stamp 154 that is shaped in the form of the intended wafer scale seal according to the stamping process design rules. In this case the stamp 154 is formed with a die seal pattern ridge 155 for each sensor die site (See FIG. 24). An enlarged set of 3×3 die site ridge patterns 153 is illustrated in FIG. 24.

The stamp may be dipped into die bottom seal material 128 in analogous fashion to the stamp dipping process illustrated in FIG. 15. Or, alternatively, as shown in FIG. 25, coated using a transfer roller 157 that dips into seal material 128 held in material hopper 156 as it is rotated (direction "R" in FIG. 25) and translated (direction "RT" in FIG. 25) forming a rolling nip with stamp 154. In this fashion seal material 128 is transferred to the seal pattern ridges 155 by layer splitting. The stamp is then positioned over sensor die wafer 201 and lowered until the seal material carried by the stamp ridges 155 touch the wafer surface, in this case the sensor die bottom side. When the stamp is then withdrawn, the seal material again splits, leaving seal material 128 behind to form wafer scale seals 130 at each sensor die site.

The seal material 128 adheres to both the intended seal location surfaces on the wafer 201 and to the stamp surface ridges 155. When touched and withdrawn from the seal material in the material hopper, or to the wafer surface, the seal material layer splits in a predictable fashion. Stamp print head 152 is moved along the cycling path indicated in FIG. 25 as "SP" to print a seal and then return to the material hopper to pick up seal material 128 for a next cycle. In this manner a seal is formed at the wafer scale on all die sites simultaneously. Seal material 128 may be fully cured or cured to an intermediate state before singulation of the sensor die.

It is further contemplated by the inventors of the present invention that wafer scale seals may be formed on both sides a sensor die wafer before die singulation. For example, FIG.

Figure 27:
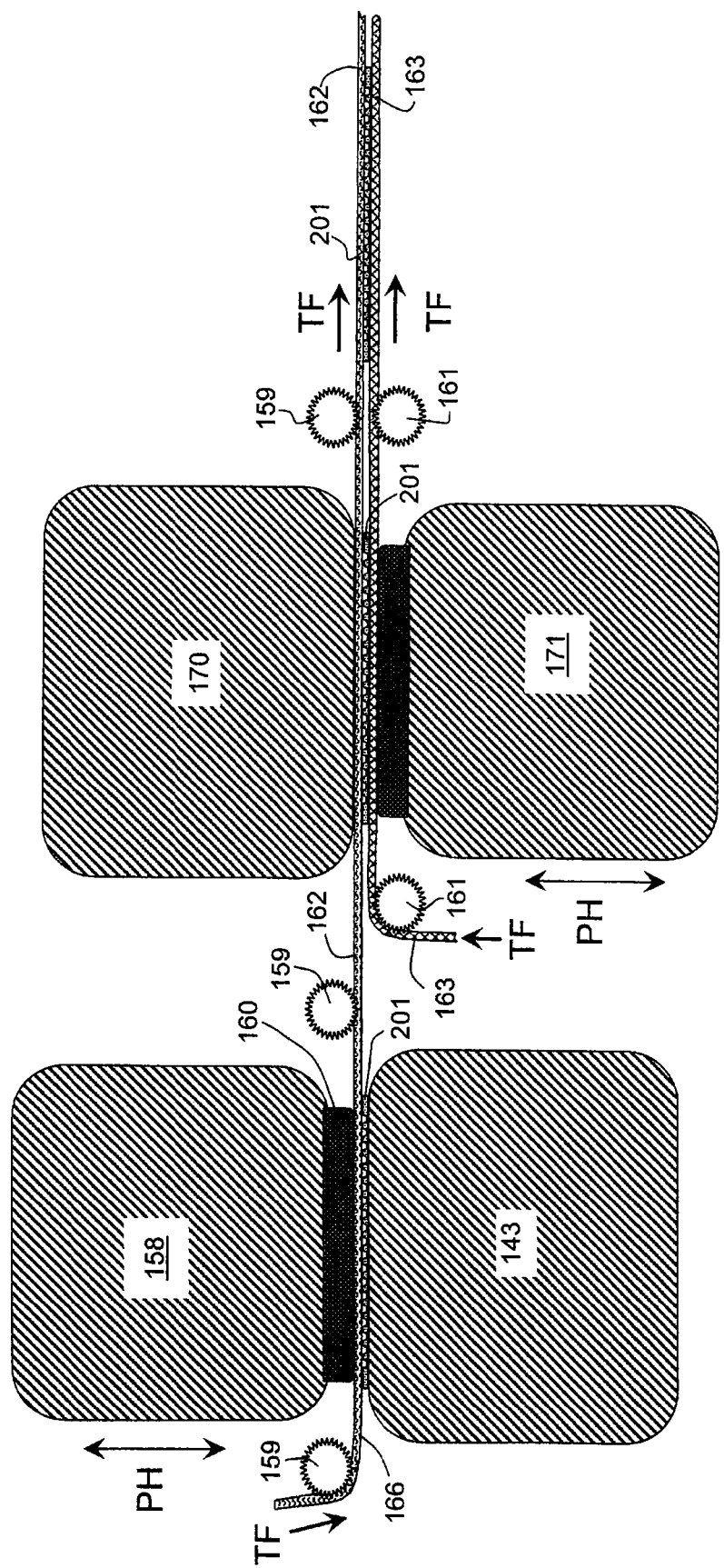
FIG. 27 is a cross-sectional view illustration of the application of a wafer scale seals to both surfaces of a sensor die using a pressure transfer process according to embodiments of the present invention.

26 illustrates a plan view of a second seal carrier tape 163 patterned with a second seal material 165, similar to that illustrated in FIG. 22 except in a complimentary pattern, i.e. for a sensor die top face seal pattern for application to a sensor die top face side. A cross-sectional view of a two-stage pressure transfer seal printing process is illustrated in FIG. 27. The cross-section is formed along a line in the sensor die wafer 201 like Q-Q in FIG. 10.

FIG. 27 illustrates a first pressure transfer head 158 positioned opposite a sensor die wafer 201 held by a wafer alignment and mounting chuck 143. In this illustration, the sensor die bottom side surfaces are up. That is, a first pre-formed wafer scale seal pattern will be pressure transferred to the sensor die bottom side surfaces. Seal material is formed in the intended wafer scale seal shape 168 on a first wafer scale seal material carrier tape 166 (as in FIG. 22) that is advanced by sprocket drive wheels 159 (along direction "TF" in FIG. 27) and positioned opposite the intended seal location on a sensor die wafer 201 and then stopped. A 3×3 grid of individual sensor die site seal patterns 167 is enlarged and highlighted in FIG. 22. Alignment features 169 may be provided on the seal material carrier tape 166 to assist in aligning the wafer scale seal pattern 168 to the die sites on sensor wafer 201.

First transfer pressure head 158, fitted with a pressure transfer shoe 160, is then lowered (direction "PH" in FIG. 27) to press the carrier tape and seal material against the intended seal location. Seal material 128 (see FIG. 22) is held on the carrier tape 166 in an uncured form so that it is tacky and adheres to the seal location surface as well as to the carrier tape material. First transfer pressure head 158 is then retreated and the wafer alignment chuck 143 released, leaving the sensor die wafer 201 adhered to the seal carrier tape 166 by means of the individual die site seals.

Sensor die wafer 201 and seal carrier tape 166 are advanced to a second pressure transfer printing station by sprocket drive wheels 159 where a second alignment chuck 170 aligns the sensor die wafer opposite a second seal carrier tape 163. In this example, first seal carrier tape 166 is patterned with seals designed for sensor die bottom sides and second seal carrier tape 163 is patterned with seals designed for sensor die top faces. Second seal carrier tape 163 is advanced by sprocket drive wheels 161. Second transfer pressure head 171, fitted with a pressure transfer shoe 160, is then raised (direction "PH" in FIG. 27) to press the second carrier tape 163 and seal material against the intended seal locations on the sensor wafer top face side. Second seal material 165 (see FIG. 26) is held on the carrier tape 166 in an uncured form so that it is tacky and adheres to the seal location surface as well as to the carrier tape material. Second transfer pressure head 171 is then retreated and the alignment chuck 170 released, leaving the sensor die wafer 201 adhered to the seal carrier tape 163 by means of the individual die site seals.

In FIG. 27, at the completion of pressure transfer printing of wafer scale seals on both sides of sensor die wafer 201, both first and second seal carrier tapes 166 and 163 are still attached on opposite sides of the sensor die wafer 201. Either one or both seal carrier tape substrates may now be removed before sensor die singulation or either or both may be left in place to protect the seal material during subsequent sensor die packaging operations, including singulation. In addition, one or both of the seal carrier tapes may be utilized as a film frame mounting material to hold the sensor die wafer during subsequent processing and quality control testing operations.

Two-sided wafer scale seal formation was illustrated and discussed above utilizing pressures transfer printing processes. The inventors of the present invention contemplate that any of the wafer scale seal formation processes may be implemented in an analogous two-stage process. That is photofabrication processes, stamp printing, pressure transfer printing or screen printing processes may be used to form seals on one side of a sensor die wafer and then the same or another of these processes used to form wafer scale seals on the other side. Also, the advantages provided by protecting and handling first and second sets of wafer scale seals by leaving the seal carrier tape in place when using pressure transfer printing may also be gained by applying a releasable protective backing tape to a wafer already processed using stamp or screen printing or one the various photofabrication methods discussed herein. All of these seal-forming process permutations of achieving wafer scale seals on two sides of a sensor die wafer are preferred embodiments of the present invention.

FIGS. 28 through 33 illustrate a set of alternate embodiments of the present invention wherein a wafer scale seal is applied to the sensor die top face at the wafer scale, in contrast to the previously described embodiments having bottom side wafer scale seals. Most of the features, materials and processes previously discussed above are applicable to the embodiments in direct or analogous fashion to the embodiments illustrated by FIGS. 28 through 33. Consequently, to avoid a repetitious discussion, only the differences or new features of these embodiments will be explained as are needed for understanding.

FIG. 28 illustrates an enlarged cross-sectional view of the region around sensor die 100 having a wafer scale sensor die top face seal 121 and an apply-in-place sensor die bottom side seal 130. Top cover 50 is provided with a deeper top cover die recess 52 to receive the full thickness of sensor die 100. Sensor die support member 20 is not recessed so as to allow contact of the top face seal 121 while providing clearance for electrical connections to the electrical output pads (not shown) on the top face of the sensor die 100.

FIGS. 29(a) and 29(b) show inside surfaces of die support member 20 and top cover 50 are plan view. The bottom side surface of sensor die 100 is visible at a stage before application of an apply-in-place seal.

Figure 30:
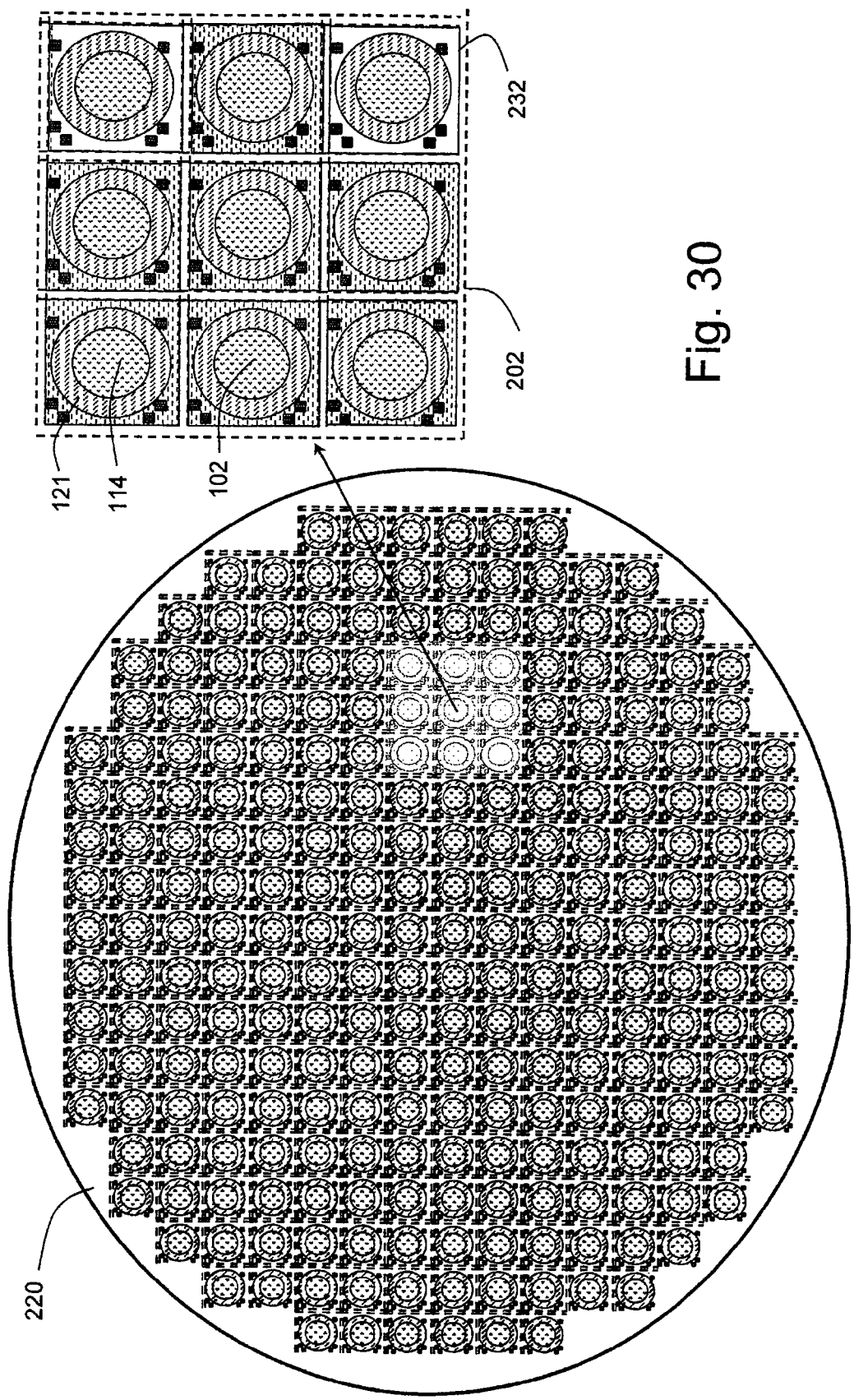
FIG. 30 is an illustration of the fabrication of photofabricated seals on sensor top face surfaces at the wafer scale according to embodiments of the present invention.

FIGS. 30, 31 and 32 illustrate a wafer scale process for photofabricating a top face seal at the wafer scale. FIG. 30 shows a plan view of the top surface of a sensor die wafer 220 after completing all wafer scale processing. A 3×3 group 202 of top face sensor sites 232 with photofabricated seals is shown in FIG. 30. FIGS. 31(a) through 31(f) illustrate, in plan views of 3×3 die site groupings, several stages in the wafer scale seal fabrication process. FIGS. 32(a) through 32(c) illustrate the final process stages in seal formation in side views of two sensor sites.

FIG. 31(a) shows the top face view of sensor die sites 222 without protective coatings, i.e. after conductor run metallization. Die sites 224 in FIG. 31(b) have a dielectric insulator and protective layer 111 deposited and delineated. The die sites 226 illustrated in FIG. 31(c) additionally have amorphous metal corrosion protection in the central region of the top face. FIG. 31(d) illustrates a photofabricated mold pattern 228 formed of photopatternable mold material 126, the negative pattern of a final top face seal pattern. The photopatternable mold material 126 may be a spun-on or sprayed on wet photoresist material or a dry film photo resist layer that is laminated to the wafer.

FIG. 31(e) illustrates sensor sites 232 wherein mold pattern 228 filled with top face seal material 122. The top face seal material may be one of many elastomeric or compressible materials, especially a polydimethyl sulfide or silicone rubber. Finished sensor die sties 232 having photofabricated top face sensor sites are illustrated in FIG. 31(f). Note that the seal material is not formed over sensor die output pads, preserving access to these pads for later electrical connection.

FIGS. 32(a) through 32(c) show a cross-sectional side view of the final top seal formation processes illustrated in FIGS. 31(d) through 31(f). The cross-sections are formed along a line similar to the dash-dot line M-M in FIG. 7. A top face seal mold is formed by photopatternable mold material 126 (FIG. 32(a)), that is filled with top face seal material 122 and cured (FIG. 31(b)). Mold material 126 is then removed to form completed sensor die top face seals.

FIGS. 31 and 32 illustrate photofabrication of a sensor die top face seal by first forming a mold pattern, filling it with seal material and then removing the mold pattern. Alternatively, according to the present invention, the seal material itself may be photosensitive, for example, photosensitive polydimethyl siloxane or a durable photosensitive dry film material such as Vacrel® or Parad® made by E.I. DuPont de Nemours and Company of Wilmington, Del. (USA). For these embodiments, the top face seal is formed in analogous fashion to the formation of the mold pattern illustrated in FIGS. 31(d) and 32(a), except a positive image of the intended bottom seal pattern is used to delineate the photosensitive seal material. The sensor top face seal pattern is then completed by developing the photosensitive material resulting in the seal patterns illustrated in FIGS. 31(f) and 32(c). The process step illustrated in FIG. 32(b), filling a mold pattern, is therefore omitted.

Screen printing, pressure transfer printing and stamp printing may also be employed to form wafer scale seals on the sensor top face in analogous fashion to the bottom side seal forming processes described above and illustrated by FIGS. 20 through 25. The only difference is that, for top face wafer scale sealing, the screen, stamp and pre-formed pressure transfer seal shapes must be designed to avoid covering or impeding access to the electrical connection pads on the sensor die.

FIGS. 33(a) and 33(b) illustrate an apply-in-place seal forming process on a sensor die bottom surface that has been electrically attached to an electrical connection wiring board, face down. FIG. 33(a) is a plan view of the sensor die 100 assembled and electrically connected to electrical wiring board 70, corresponding to the dotted rectangle area G in FIG. 29(a). Sensor die bottom side seal 130 is illustrated in mid-formation as an apply-in-place bottom side seal material 128 is being dispensed by a dispensing needle 140. Dispensing needle 140 is moved relative to the sensor die top face along the pathway shown as dotted arrow J. Dispensing of seal material 128 is turned on and off in an appropriate fashion to complete a bead of seal material fully around the unthinned perimeter portion of sensor die 100, leaving an exposed portion of the amorphous metal 114 protected bottom side surface 124 that will be impinged by a test fluid when the sensor is in use.

FIG. 33(b) illustrates the apply-in-place dispensing process in a side view taken along the dotted line H-H in FIG. 33(a). As may be appreciated by the illustrations of FIG. 33, the application of an apply-in-place seal to the sensor die bottom side surface, after sensor die electrical attachment, allows the seal to occupy a large lateral area than might otherwise be possible, thereby assisting the overall purposes of the invention to minimize sensor die area that is devoted to the sealing function. That is, the procedure and design illustrated in FIG. 33 allows the bottom side seal 130 to overlap the outer edge of the sensor die. Therefore, any tolerance problems associated with controlling the width of the apply-in-place seal may be accommodated by biasing the centerline of deposition of the seal to the outer boundary of the sensor die rather than towards the thinned diaphragm central portion of the sensor die bottom side, which must remain open to test fluid impingement. In addition, if desired or needed, the clearance between the sensor die edge surfaces and the openings and recesses in the sensor die top cover may be further enlarged to receive and control excess bottom side seal material that may migrate during cure.

It will be appreciated that the other examples of apply-in-place seal technology discussed previously may also be used for the alternate configuration of forming an apply-in-place seal to the sensor die bottom surface or top cover as illustrated in FIGS. 33(a) and 33(b). An apply-in-place seal may be formed by extruding seal material from a needle having a seal-shaped hollow (see FIGS. 14(a) and 14(b)), transfer stamp printing (see FIG. 15), screen printing (see FIGS. 18 and 19) and pressure transfer from a patterned carrier material (see FIGS. 16 and 17). The present invention envision using any process of applying seal material in the intended shape directly to one of the singularized sensor die surfaces, or to a top cover member, to form an applied-in-place seal.

The combination of a wafer scale sensor die top face seal 121 and an apply-in-place sensor die bottom side seal 130 provides a design that allows a minimum of sensor die surface area to be devoted to sealing, as may be appreciated especially from FIG. 33(b) and from the previous discussion on the beneficial reduction in sealing widths, $w_s$, resulting from the present invention.

An alternative embodiment of the present invention that may also be used to similar effect is to apply the apply-in-place seal material to the top cover around the perimeter of the top cover test fluid access port 54 as may be appreciated from FIG. 28. A dispense needle is operated in analogous fashion to deposit an apply-in-place seal to the inside surface of the top cover 50 around the top cover port perimeter 55, and a top cover die recess 52 may be designed to receive and control the sensor die top face seal material as it cures.

In addition, for either approach of applying the form in place seal material to the sensor die top face itself, or applying the seal material to the top cover surface, the seal material may be cured before assembly of the top cover to the sensor die or after this assembly step. If the cure is performed before assembly, then a mechanical compression is maintained by locking pins, or the like, to compress both the top face seal and the bottom side seal. If the seal cure is performed after assembly, compressive force may not be required to ensure top face sealing, however it may be required to maintain compression of the pre-cured photofabricated seal applied to the bottom surface at the wafer scale. All of these variations in design are contemplated as preferred embodiments of the present invention.

Another set of embodiments of the present invention is illustrated by FIGS. 34 through 38. For these embodiments the die support member 20, sensor die 100, electrical connection wiring board 70 and top cover 50 are configured as a die sensor inner package assembly 12 that is inserted into a rigid outer sensor casing 90 to form a differential pressure sensor system 14. An additional set of seals is provided between the die support member 20 and the rigid outer sensor casing 90 and between the top cover 20 and the rigid outer casing 90. A related pressure sensor design is disclosed in U.S. Pre-grant Publication 20050235752 to Mikkelsen, et al., assigned to the assignee of the present invention (Mikkelsen '752, hereinafter). Mikkelsen '752 discloses sensor die sealing to the top face and bottom surface of a sensor die using mechanical sealing members such as O-rings, thereby necessitating a larger sensor die seal area than is required by the present invention that use wafer scale and apply-in-place seals.

Figure 34:
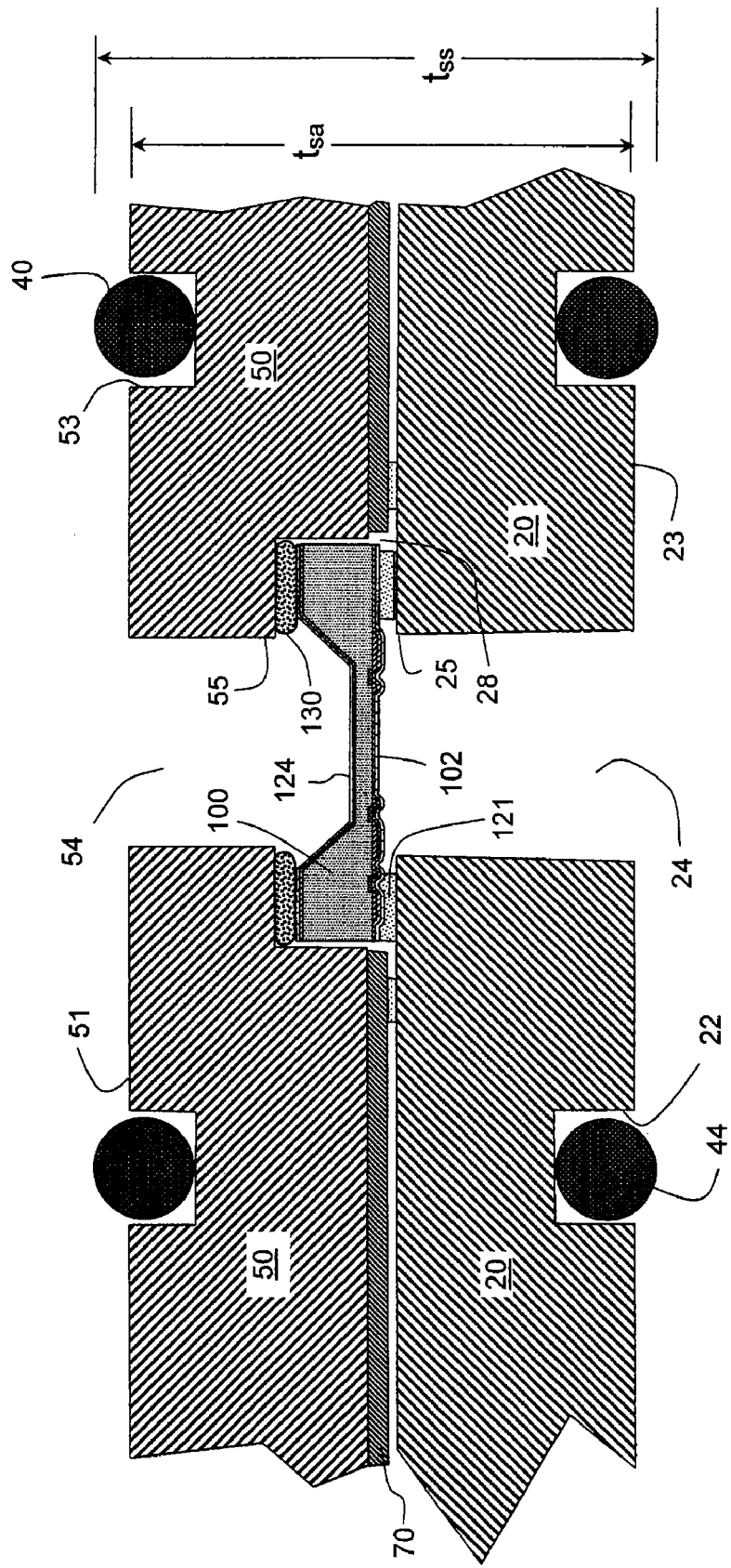
FIG. 34 is an enlarged cross-sectional view of the sensor die region of a differential pressure sensor for an alternate configuration according to the present invention.

FIG. 34 illustrates in cross-sectional view the addition of a mechanical top cover sealing member 40 to the outer surface 51 of top cover 50 positioned by top cover seal member holding feature 53. A second mechanical sealing member, die support seal member 44, is positioned by die support seal member holding feature 22 on the outer surface 23 of the die support member. Mechanical sealing members 40 and 44 are, for example, O-rings.

FIGS. 35(a) and 35(b) illustrate a single piece sensor housing 16 design that combines top cover 50 with sensor die support member 20 and flexible joining hinge 32. FIGS. 35(a) and 35(b) show the inner and outer surface features of the single piece sensor housing 16, respectively. A new element, integrated sensor interface integrated circuit die 172, is illustrated in FIG. 35(a). This element provides electronic control and signal processing functions associated with the sensor die. For example, sensor IC 172 may amplify and convert analog voltage signals into digital signals and may perform calibration tests and adjustments.

FIG. 36, with reference to elements in FIGS. 34 and 35, illustrates a die sensor inner package assembly 12 in side cross-section after the sensor IC 172, electrical connection wiring board 70, sensor die 100 with wafer scale sensor die top face seal 121, sensor die bottom seal 130, single piece sensor housing 16 and top cover seal member 40 and die support seal member 44 are assembled, including the folding and locking of integrated locking pins 84 into through holes 82. In addition an electrical edge connector 174 is affixed to the electrical contact pads 78. The cross-sectional view is formed along dash-dot line N-N in FIG. 35(b).

FIG. 37 illustrates in side cross-sectional view, also formed along a line conforming to the dash-dot line N-N in FIG. 35(b), the insertion of die sensor inner package assembly 12 into sensor cavity 98 formed by a sensor cavity wall enclosure formed in a rigid outer sensor casing 90, to form a differential pressure sensor system 14. The advantage of this approach is that the components retained within sensor cavity 98 are sealed off from test fluid sources by a combination of the sensor die surface seals and the mechanical seal members 40 and 44. That is, it is not necessary to provide an outer perimeter seal of the top cover and die support member as was provided, for example, by ultrasonic welding of perimeter features as discussed above with respect to FIG. 6. In addition rigid outer sensor casing 90 may be provided with, within its wall thickness, different through passage routes in order to convey test fluid sources from different locations around the sensor system 14 perimeter, as is disclosed by Mikkelsen '752.

Mechanical seals 40 and 44 are affixed to die sensor inner package 12 before insertion. Tapered surfaces 91 on the sensor cavity 98 enclosure walls 99 gradually compress the mechanical seals 40 and 44 as the sensor inner package 12 is fully inserted into rigid outer sensor casing 90. Differential pressure sensor system 14 is further configured with an outer casing seal member 95 and O-ring stop 92 to provide a final seal to the fluid system in which the sensor is inserted. Rigid outer sensor case 90 may be formed from many corrosion resistant materials, for example, polyphenylene sulfide, polystyrene, or stainless steel.

Figure 38:
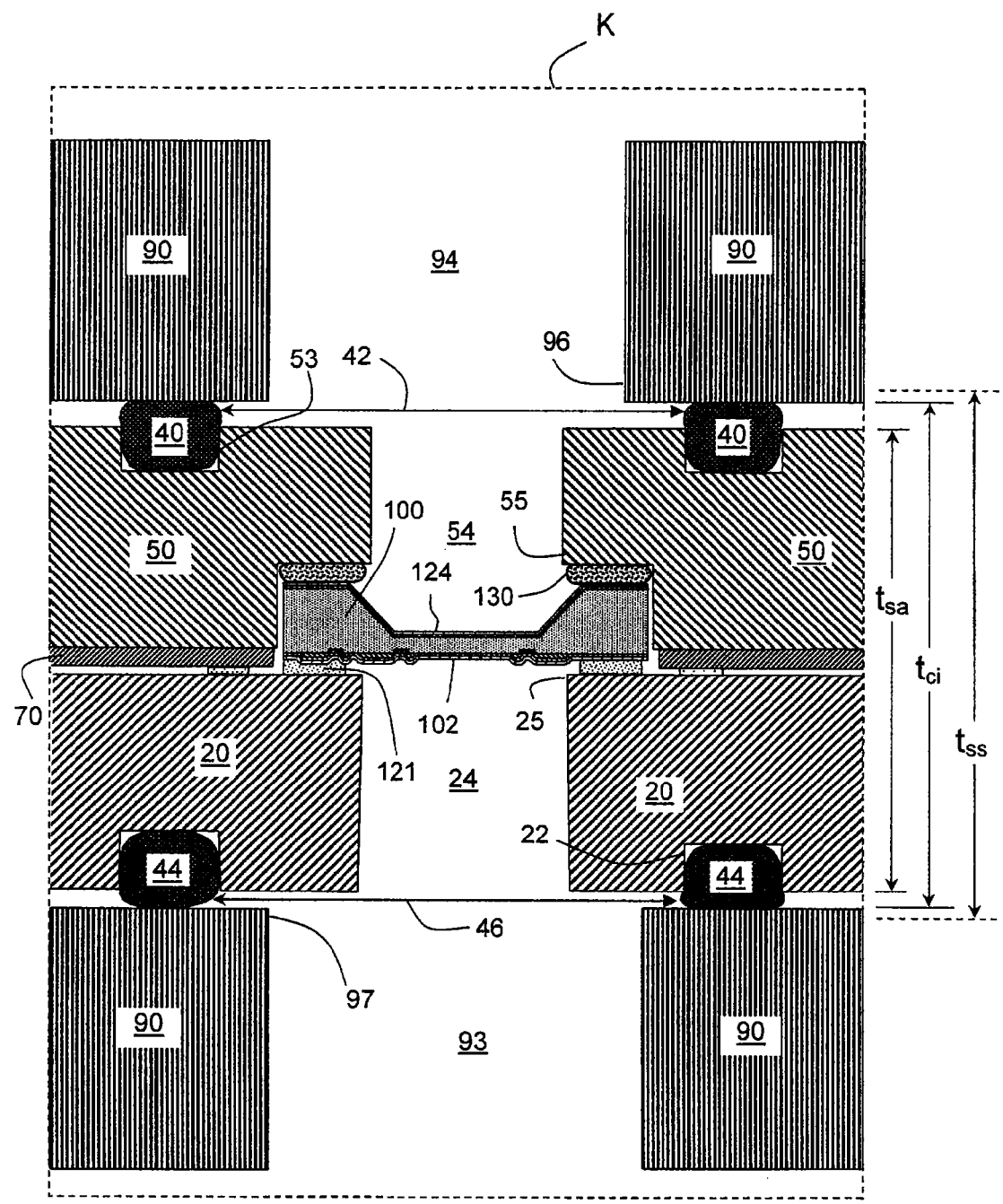
FIG. 38 is an enlarged cross-sectional view of the sensor die region of a differential pressure sensor including the rigid outer sensor casing and mechanical seals according to embodiments of the present invention.

Details of various sealing features of the differential pressure sensor system 14 may be understood from the enlarged cross-sectional view illustrated in FIG. 38. This view is of dotted area K in FIG. 37. The seals and features around sensor die 100 are as have been previously discussed with respect to FIGS. 28 through 33 for the configuration wherein the top face seal 121 is photofabricated at the wafer scale. Alternative embodiments of the present invention may be formed wherein the wafer scale photofabricated seal is provided on the sensor die bottom side surface as illustrated in FIGS. 2 through 8 and 10 through 13 or is fabricated according to the alternate wafer scale seal forming processes previously discussed.

In FIG. 38 it may be seen that top cover seal member 40 is compressed within top cover seal member holding feature 53 forming a seal between top cover 50 and rigid outer sensor casing 90. Die support seal member 44 is compressed within die support seal member holding feature 22 forming a seal between sensor die support member 20 and rigid outer sensor casing 90. The compression of mechanical seals 40 and 44 is accomplished by dimensioning the thickness, $t_{ci}$, of the sensor cavity interior 98, to be sufficiently less than the thickness, $t_{ss}$, of the die sensor inner package assembly with seals, i.e., including the protruding thicknesses of mechanical seals 40 and 44 as illustrated in FIGS. 34 and 38. Of course, in order to insert the sensor inner package 12, the thickness of the interior cavity 98, $t_{ci}$ must be greater than the thickness of the die sensor inner package without seals, $t_{sa}$, as illustrated in FIGS. 34 and 38. Because the outer sensor case 90 is formed of a rigid material, the interference thickness $\Delta = t_{ci} - t_{ss}$, is taken up by the compression of seals 40, 44 and 121 and 130 for configurations of the present invention wherein one or both of the sensor die surface seals are compressible.

Rigid outer sensor case 90 is also provided with first test fluid access port 94 having a first opening 96 into sensor cavity 98 and second test fluid access port 93 having a second opening 97 into sensor cavity 98. First opening 96 is dimensioned and positioned so that it falls within the top cover seal interior opening 42 illustrated in FIG. 38. Likewise, second opening 97 is positioned and dimensioned so that it falls within the die support seal interior opening 46. It is not necessary for first and second fluid access ports to be configured as simple straight through cylindrical passages as depicted in FIGS. 37 and 38. However, it is necessary that these fluid access ports emerge into the sensor cavity 98 in alignment with the area sealed by top cover seal member 40 and die support seal member 44.

The seal design configuration illustrated in FIGS. 34 through 38 provides flexibility in the positioning of fluid access pathways to the two sides of a pressure sensor die, via passages in a rigid outer sensor case, protects components within the sensor cavity from test fluids and preserves the cost advantages of reduced sensor die size by the use of photofabricated and apply-in-place sensor die seals.

Another set of embodiments of the present invention that utilize a rigid outer casing 90 is illustrated by side view FIGS. 39(a) and 39(b). FIG. 39(b) is an enlargement of the portion "R" shown in phantom lines in FIG. 39(a). For these embodiments the die support member 20, sensor die 100, and electrical connection wiring board 70 are configured as a die sensor inner package assembly 11 that is inserted into a rigid outer sensor casing 90 to form a differential pressure sensor system 15. In these embodiments the top cover component previously described is omitted from the structure and a portion of the rigid outer sensor casing 90 serves to contain the side of the sensor die opposite the die side adjacent to the die support substrate. An additional seal is provided between the die support member 20 and the rigid outer sensor casing 90. For example this additional seal may be a mechanical sealing member such as O-ring 44. Sensor sub-assembly 11 may also comprise an integrated sensor interface integrated circuit die 172 and an electrical edge connector 174.

FIGS. 39(a) and 39(b) illustrates a die sensor inner package assembly 11 in side cross-section after the sensor IC 172, electrical connection wiring board 70, sensor die 100 with wafer scale sensor die top face seal 121, sensor die bottom seal 130, single piece sensor housing 15 and die support seal member 44 are all assembled. In addition an electrical edge connector 174 is affixed to the electrical contact pads 78 (not shown). These components are illustrated after insertion into sensor cavity 98 formed by a sensor cavity wall enclosure formed in a rigid outer sensor casing 90, to form a differential pressure sensor system 15. The advantage of this approach is that the components retained within sensor cavity 98 are sealed off from test fluid sources by a combination of the sensor die surface seals and the mechanical seal member 44. In addition rigid outer sensor casing 90 may be provided with, within its wall thickness, different through passage routes in order to convey test fluid sources from different locations around the sensor system 15 perimeter, as is disclosed by Mikkelsen '752.

Mechanical seal 44 is affixed to die sensor inner package 11 before insertion. Tapered surfaces 91 and 89 on the sensor cavity 98 enclosure walls 99 gradually compress the mechanical seal 44 as well as the sensor die bottom side seal 130 and sensor die top face seal 121 as the sensor inner package 11 is fully inserted into rigid outer sensor casing 90. Differential pressure sensor system 15 is further configured with an outer casing seal member 95 and O-ring stop 92 to provide a final seal to the fluid system in which the sensor is inserted. Rigid outer sensor case 90 may be formed from many corrosion resistant materials, for example, polyphenylene sulfide, polystyrene, or stainless steel.

Details of various sealing features of the differential pressure sensor system 15 may be understood from the enlarged cross-sectional view illustrated in FIG. 39(b). The seals and features around sensor die 100 are as have been previously discussed with respect to FIGS. 28 through 33 for the configuration wherein the top face seal 121 is photofabricated at the wafer scale. Alternative embodiments of the present invention may be formed wherein the wafer scale photofabricated seal is provided on the sensor die bottom side surface as illustrated in FIGS. 2 through 8 and 10 through 13 or is fabricated according to the alternate wafer scale seal forming processes previously discussed. Both bottom side and top face sensor die seals may be formed at the wafer scale in a two-side process as illustrated in FIG. 27 and above discussed. Further, the sensor die surface seal 130 adjacent the first access port inner perimeter 181 of the first opening 96 in the rigid outer sensor housing 90 may be formed by an apply-in-place seal forming process.

In FIGS. 39(a) and 39(b) it may be appreciated that sensor die bottom side seal 130 is compressed against first access port inner perimeter 181 of the first opening 96 in the rigid outer sensor housing 90 forming a seal between the sensor die bottom side and the rigid outer sensor casing 90. Die support seal member 44 is compressed within die support seal member holding feature 22 forming a seal between sensor die support member 20 and rigid outer sensor casing 90. The compression of mechanical die support seal 44 and sensor die bottom side seal 130 is accomplished by dimensioning the thickness of the sensor cavity interior 98, to be sufficiently less than the thickness the die sensor inner package assembly 11, with seals, i.e., including the protruding thicknesses of mechanical seal 44 and sensor die bottom side seal 130. Of course, in order to insert the sensor inner package 11, the thickness of the interior cavity 98 must be greater than the thickness of the die sensor inner package without seals. Because the outer sensor case 90 is formed of a rigid material, the planned mechanical interference is taken up by the compression of seals 44 and 121 and 130 for configurations of the present invention wherein one or both of the sensor die surface seals are compressible.

Rigid outer sensor case 90 is provided with first test fluid access port 94 having a first opening 96 into sensor cavity 98 and second test fluid access port 93 having a second opening 97 into sensor cavity 98. First opening 96 is dimensioned and positioned so that it falls within sensor die bottom side seal 130 area 183 as illustrated in FIG. 39(b). Likewise, second opening 97 is positioned and dimensioned so that it falls within the die support seal interior opening 46. It is not necessary for first and second fluid access ports to be configured as simple straight through cylindrical passages as depicted in FIGS. 37 and 38. However, it is necessary that these fluid access ports emerge into the sensor cavity 98 in alignment with the area sealed by sensor die bottom side seal 130 and die support seal member 44.

Yet another set of embodiments of the present invention that utilize a rigid outer sensor casing 90 is illustrated by side view FIGS. 40(a) and 40(c) and plan view FIG. 40(b). FIG. 40(c) is an enlargement of the portion "S" shown in phantom lines in FIG. 40(a). Cross-sectional views FIGS. 40(a) and 40(c) are formed along the line "U-U" shown in plan view FIG. 40(b). For these embodiments the sensor die 100 and electrical connection wiring board 70 are configured as a die sensor inner package assembly 13 that is inserted into a rigid outer sensor casing 90 to form a differential pressure sensor system 17. In this case the sensor die support component previously described is omitted and inner portions of the rigid outer sensor casing 90 serves to contain both sides of the sensor die.

A stiff die insertion and wiring board support member 88 provides mechanical strength to the sensor inner package assembly 13. The die insertion member 88 is formed of a strong material that is slightly thinner than the sensor die, so as not to interfere with seal formation upon insertion of the sensor inner package assembly into the rigid outer sensor casing. The sensor inner package assembly may also include a sensor interface integrated circuit device 172. The die insertion member 88 is windowed 87, 85 to receive the sensor interface IC and the sensor die 100 which are both electrically connected and bonded to electrical wiring board 70. Sensor die 100 is positioned against the trailing edge of sensor die window 85 in the die insertion member 88. In effect, the trailing inner wall of sensor die window 85 pushes the sensor die along into the rigid outer sensor case during the insertion process. An external electrical connector 174 is also provided with sensor sub-assembly 13.

The rigid outer sensor casing 90 is formed with a sensor cavity 98 formed by a sensor cavity wall enclosure 99 having a tapered interior wall surface 91, 89 adapted to receive the sensor die, and having first and second test fluid access ports 94, 93 formed through the sensor cavity wall enclosure 99 and having first and second openings 96, 97 in the interior wall surface with first and second access port inner perimeters 181, 182.

Tapered surfaces 91 and 89 on the sensor cavity 98 enclosure walls 99 gradually compress the sensor die bottom side seal 130 and sensor die top face seal 121 as the sensor inner package 13 is fully inserted into rigid outer sensor casing 90. The die insertion member 88 may be provided with a tapered or rounded leading edge that guides the sub-assembly 13 into and over the tapered inner surfaces 91, 89 of rigid outer sensor case 90. Differential pressure sensor system 17 is further configured with an outer casing seal member 95 and O-ring stop 92 to provide a final seal to the fluid system in which the sensor is inserted. Rigid outer sensor case 90 may be formed from many corrosion resistant materials, for example, polyphenylene sulfide, polystyrene, or stainless steel.

Details of various sealing features of the differential pressure sensor system 17 may be understood from the enlarged cross-sectional view illustrated in FIG. 40(c). The seals and features around sensor die 100 are as have been previously discussed with respect to FIGS. 28 through 33 for the configuration wherein the top face seal 121 is photofabricated at the wafer scale. Alternative embodiments of the present invention may be formed wherein the wafer scale photofabricated seal is provided on the sensor die bottom side surface as illustrated in FIGS. 2 through 8 and 10 through 13 or is fabricated according to the alternate wafer scale seal forming processes previously discussed. Both bottom side and top face sensor die seals may be formed at the wafer scale in a two-side process as illustrated in FIG. 27 and above discussed. Further, one of the sensor die bottom side seal or the sensor die top face seal may be formed by an apply-in-place seal forming process after the sensor die is electrically connected to electrical wiring board 70.

In FIGS. 40(a) and 40(c) it may be appreciated that sensor die bottom side seal 130 is compressed against first access port inner perimeter 181 of the first opening 96 in the rigid outer sensor housing 90 forming a seal between the sensor die bottom side and the rigid outer sensor casing 90. Sensor die top face seal 121 is compressed against second access port inner perimeter 182 of the second opening 97 in the rigid outer sensor housing 90 forming a seal between the sensor die top face side and the rigid outer sensor casing 90.

The compression of sensor die bottom side seal 130 and sensor die top face seal 121 is accomplished by dimensioning the thickness of the sensor cavity interior 98, to be sufficiently less than the thickness the die sensor inner package assembly 11, with seals, i.e., including the protruding thicknesses of sensor die bottom side seal 130 and sensor inner top face seal 121. Of course, in order to insert the sensor inner package 11, the thickness of the interior cavity 98 must be greater than the thickness of the die sensor inner package without seals. Because the outer sensor case 90 is formed of a rigid material, the planned mechanical interference is taken up by the compression of seals 121 and 130 for configurations of the present invention wherein one or both of the sensor die surface seals are compressible.

For some embodiments of the present invention the compression may be only sufficient to establish contact between the seal materials and the fluid access port inner opening parameters 181, 182. Subsequently, the assembled package may be processed to further cure one or both of the seal materials causing the flow and permanent adhesion of the seal material to the associated fluid access port opening perimeter surface of the rigid sensor casing 90. Such a seal does not then depend on it remaining under mechanical compression within sensor assembly 17.

Rigid outer sensor case 90 is provided with first test fluid access port 94 having a first opening 96 into sensor cavity 98 and second test fluid access port 93 having a second opening 97 into sensor cavity 98. First opening 96 is dimensioned and positioned so that it falls within sensor die bottom side seal 130 area 183 as illustrated in FIG. 40(c). Likewise, second opening 97 is positioned and dimensioned so that it falls within sensor die top face seal 121 area 184. It is not necessary for first and second fluid access ports to be configured as simple straight through cylindrical passages as depicted in FIGS. 40(a) and 40(c). However, it is necessary that the two fluid access ports emerge with openings 96, 97 into the sensor cavity 98 in alignment with the area sealed by sensor die bottom side seal 130 and sensor die top face seal 121, respectively.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of producing a differential pressure sensor comprising:
   fabricating a plurality of sensor die sites on a semiconductor wafer,
   forming first and second wafer scale seals on each of the sensor die sites, the first and second wafer scale seal being formed on first and second surfaces of each of the sensor die sites,
   providing each of the sensor die sites with die electrical output pads,
   singularizing the plurality of sensor die sites to provide a plurality of singularized die sites, each singularized die site representing a sensor die comprising one of the sensor die sites with its respective first and second wafer scale seals, die electrical output pads, and first and second surfaces, and
   providing a sensor die support member and a top cover to the sensor die, wherein the sensor die support member has a support member fluid access port with a support member port perimeter and the top cover has a top cover fluid access port having a top cover port perimeter and wherein the first and second wafer scale seals on the sensor die fully seal the first and second surfaces of the sensor die around the support member port perimeter and around the top cover port perimeter.

2. The method of claim 1, wherein the first wafer scale seal comprises a seal material and wherein forming the first wafer scale seal comprises applying the seal material with one of a photofabrication process, screen printing, stamp printing, or pressure transfer printing.

3. The method of claim 1, wherein the first wafer scale seal comprises a compressible material.

4. The method of claim 2, wherein forming the first wafer scale seal comprises applying the seal material with the photofabrication process and wherein the seal material comprises a photosensitive polydimethylsiloxane material.

5. The method of claim 2, wherein forming the first wafer scale seal comprises forming a photofabricated mold on each of the sensor die sites, applying the seal material with the photofabrication process to fill the mold, and removing the photofabricated mold, and wherein the seal material comprises an elastomeric material.

6. The method of claim 5, wherein the elastomeric material comprises polydimethylsiloxane or silicone rubber.

7. The method of claim 5, wherein forming the photofabricated mold comprises using a dry film photoresist.

8. The method of claim 1, wherein the first wafer scale seal comprises a seal material having an intermediate cure state and a final cure state, and wherein providing the sensor die support member comprises bringing the first wafer scale seal into contact with the die support member while the seal material is in the intermediate cure state and subsequently finally curing the seal material so as to bond to the die support member.

9. The method of claim 1, further comprising coating the first or second surface of each of the sensor die sites with an amorpous metal layer such that the first or second surface of the sensor die is coated with the amorpous metal layer in a sensing area exposed to a central portion of the support member port area not covered by the first or second wafer scale seal.

10. The method of claim 9, wherein the sensor die support member comprises a ceramic material, the first wafer scale seal comprises a low temperature glass frit material with a curing temperature of not more than 450° C., and wherein providing the sensor die support member comprises bringing the first wafer scale seal into contact with the die support member and subsequently curing the glass flit so as to bond to the die support member.

11. The method of claim 1, wherein providing the die support member comprises mechanically compressing the first wafer scale seal against the die support member.

12. The method of claim 1, wherein the die support member comprises polyphenylene sulphide.

13. A method of producing a differential pressure sensor comprising:
    fabricating a plurality of sensor die sites on a semiconductor wafer,
    forming a first wafer scale seal on each of the sensor die sites, the first wafer scale seal being formed on one of a first or second surface of each of the sensor die sites,
    providing each of the sensor die sites with die electrical output pads,
    singularizing the plurality of sensor die sites to provide a plurality of singularized die sites, each singularized die site representing a sensor die comprising one of the sensor die sites with its respective first wafer scale seal, die electrical output pads, and first and second surfaces,
    providing a sensor die support member to the sensor die, wherein the sensor die support member has a support member fluid access having a support member port perimeter and wherein the first wafer scale seal on the sensor die fully seals the one of the first or second surface of the sensor die sites around the support member port perimeter, and
    providing a top cover for the sensor die after providing the sensor die support member and applying an applied-in-place seal on the sensor die or top cover before providing the top cover to the sensor die, wherein the top cover has a top cover fluid access port which has a top cover port perimeter, and wherein the applied-in-place seal fully seals the other of the first or second surface of the sensor die sites around the top cover port perimeter.

14. The method of claim 13, wherein the applied-in-place seal comprises a compressible material.

15. The method of claim 14, wherein the applied-in-place seal is cured before providing the top cover to the sensor die, and wherein the applied-in-place seal is mechanically compressed after providing the top cover to the sensor die.

16. The method of claim 13, wherein the applied-in-place seal comprises a seal material having an intermediate cure state and a final cure state, and wherein providing the top cover to the sensor die comprises bringing the applied-in-place seal into contact with the top cover and sensor die while the seal material is in the intermediate cure state and subsequently finally curing the seal material so as to bond to the top cover and the sensor die.

17. The method of claim 13, further comprising coating the other of the first or second surface of each of the sensor die sites with an amorphous metal layer, such that the other of the first or second surface of the sensor die sites is coated with the amorpous metal layer in a sensing area exposed to a central portion of the top cover port area and is not covered by the apply-in-place seal.

18. The method of claim 13, further comprising providing an electrical connection wiring board supported by the die support member, wherein providing the electrical connection wiring board comprises uses of one of thermocompression bonding, reflow soldering or anisotropic conductive epoxy, wherein the electrical connection wiring board is electrically connected to the die electrical output pads.

19. The method of claim 18, wherein providing the electrical connection wiring board comprises electrically connecting the electrical connection wiring board to the die electrical output pads to form an attached die subassembly and then assembling the attached die subassembly to the die support member.

20. The method of claim 19, wherein the forming of the first wafer scale seal comprises forming the first wafer scale seal on the second surface of each of the sensor die sites, such that the wafer scale seal is formed on the second surface of the sensor die sites and wherein the forming of the applied-in-place seal comprises extending the applied-in-place seal to cover the die electrical output pads.

21. The method of claim 13, wherein the top cover comprises polyphenylene sulphide.

22. The method of claim 13, wherein the die support member and top cover are formed in one piece.

23. The method of claim 13, wherein the outermost area of overlap between the top cover and the die support member defines an outer case perimeter, the method further comprising forming an outer case seal along at least a portion of the outer case perimeter.

24. The method of claim 23, wherein the outer case seal is an applied-in-place seal formed on the top cover or the die support member prior to the providing of the top cover.

25. The method of claim 23, wherein the outer case seal is formed as an ultrasonic weld of top cover and die support material along at least a portion of the outer case perimeter.

26. The method of claim 23, wherein the top cover and the die support member are held in mechanical compression after the providing of the top cover, and wherein the outer case seal comprises a compressible gasket member interposed between the top cover and the die support member.

27. The method of claim 13, wherein applying the applied-in-place seal comprises application by one of screen printing, stamp printing, pressure transfer printing, dispensing through a needle having a seal-shaped hollow portion, or dispensing through a needle that is moved along a seal pattern pathway.

28. The method of claim 1 wherein the second wafer scale seal comprises a seal material and wherein forming the second wafer scale seal comprises applying the seal material with one of a photofabrication process, screen printing, stamp printing, or pressure transfer printing.

29. The method of claim 28, wherein the second wafer scale seal comprises a compressible material.

30. The method of claim 13, wherein the sensor die support member has a die support side and a support member outer side, the support member port perimeter is on the die support side, the top cover has a die interface side and a top cover outer side, the top cover port perimeter is on the die interface side, and wherein the sensor die support member comprises a die support seal member holding feature on the support member outer side and a die support seal member held in place by the die support seal member holding feature, and wherein the die support seal member defines a die support seal interior opening which is aligned with the support member fluid access port, and the die support seal member is adapted to seal against the support member outer side and around the support member fluid access port when compressed.

31. The method of claim 30, wherein the die support seal member comprises an O-ring.

32. The method of claim 30, wherein the top cover has a top cover seal member holding feature located at the top cover outer side, and the top cover has a top cover seal member held by the top cover seal member holding feature, and wherein the top cover seal member defines a top cover seal interior opening aligned with the top cover fluid access port, and the top cover seal member is adapted to seal against the top cover outer side and around the top cover fluid access port when compressed.

33. The method of claim 32, wherein the top cover seal member comprises an O-ring.

34. The method of claim 32, wherein the top cover, the die support member, and the sensor die form an assembly, the method further comprising providing a rigid outer sensor case having a sensor cavity formed by a sensor cavity wall enclosure having an interior wall surface adapted to receive the assembly, and wherein the rigid outer sensor case has first and second test fluid access ports formed through the sensor cavity wall enclosure in fluid communication with the top cover fluid access port and the support member fluid access port, respectively, and wherein the sensor cavity is dimensioned so as to mechanically compress the top cover seal member and the die support seal member, and wherein the first and second test fluid access ports define respective first and second openings in the interior wall surface, the first and second openings are positioned and dimensioned to lie within the top cover seal interior opening and the die support seal interior opening, respectively.

35. The method of claim 34, wherein the die support member and the top cover are formed in one piece.

36. The method of claim 30, wherein the first wafer scale seal comprises a seal material, and forming the first wafer scale seal comprises applying the seal material with one of a photofabrication process, screen printing, stamp printing, or pressure transfer printing.

37. The method of claim 1, wherein the sensor die support member comprises a die support side, a support member outer side, a die support seal member holding feature on the support member outer side, and a die support seal member held in place by the die support seal member holding feature, wherein the die support seal member defines a die support seal interior opening which is aligned with the support member fluid access port, and the die support seal member is adapted to seal against the support member outer side and around the support member fluid access port when compressed.

38. The method of claim 37, wherein the a top cover for assembly to the sensor die is provided after the sensor die is supported on the sensor die support, wherein the top cover comprises a die interface side and a top cover outer side, and wherein the top cover has a top cover seal member holding feature located on the top cover outer side, the top cover has a top cover seal member held by the top cover seal member holding feature, the top cover seal member defines a top cover seal interior opening aligned with the top cover fluid access port, and the top cover seal member is adapted to seal against the top cover outer side and around the top cover fluid access port when compressed.

39. The method of claim 38, wherein the top cover, the die support member, and the sensor die form an assembly, and the method further comprising providing a rigid outer sensor case having a sensor cavity formed by a sensor cavity wall enclosure having an interior wall surface adapted to receive the assembly, and wherein the rigid outer sensor case has first and second test fluid access ports formed through the sensor cavity wall enclosure in fluid communication with the top cover fluid access port and the support member fluid access port, respectively, and wherein the sensor cavity is dimensioned so as to mechanically compress the top cover seal member and the die support seal member, and the first and second test fluid access ports define first and second openings in the interior wall surface that are positioned and dimensioned to lie within the top cover seal interior opening and the die support seal interior opening, respectively.

40. The method of claim 39, wherein the die support member and the top cover are formed in one piece.

41. The method of claim 38, wherein the first and second wafer scale seals are formed of first and second seal materials, respectively, and the forming of the first and second wafer scale seals comprises applying the first and second seal materials with one of a photofabrication process, screen printing, stamp printing, or pressure transfer printing.

42. The method of claim 37, further comprising providing a rigid outer sensor case having a sensor cavity formed by a sensor cavity wall enclosure, the sensor cavity wall enclosure having an interior wall surface adapted to receive the die support member and the sensor die, and the rigid outer sensor case having a first test fluid access port formed through the sensor cavity wall enclosure and having a first opening in the interior wall surface having a first access port inner perimeter, wherein the second wafer scale seal is adapted to seal the other of the first or second surface of the sensor die fully around the first access port inner perimeter; and wherein the rigid outer sensor case has a second test fluid access port formed through the sensor cavity wall enclosure in fluid communication with the support member fluid access port, the sensor cavity is dimensioned so as to mechanically compress the die support seal member and the second wafer scale seal, and wherein the second test fluid access port defines a second test fluid access port opening in the interior wall surface that is positioned and dimensioned to lie within the die support seal interior opening.

43. A method of producing a differential pressure sensor comprising:
fabricating a plurality of sensor die sites on a semiconductor wafer, the sensor die sites each having a first and second surface,
forming first and second wafer scale seals on each of the sensor die sites,
providing a first surface of each of the sensor die sites with die electrical output pads,
singularizing the plurality of sensor die sites to provide a plurality of singularized die sites, each singularized die site representing a sensor die comprising one of the sensor die sites with its respective first and second wafer scale seals, die electrical output pads, and first and second surfaces,
providing a rigid outer sensor case having a sensor cavity formed by a sensor cavity wall enclosure having an interior wall surface adapted to receive the sensor die, wherein the rigid outer sensor case has first and second test fluid access ports formed through the sensor cavity wall enclosure and having first and second openings in the interior wall surface, respectively, the first and second openings having first and second access port inner perimeters, respectively, and
wherein the first and second wafer scale seals are adapted to seal the first and second surfaces of the sensor die fully around the first and second access port inner perimeters, and wherein the sensor cavity is dimensioned so as to ensure contact between the first and second wafer scale seals and the first and second test fluid access ports, respectively.

44. The method of claim 43, wherein the sensor cavity is dimensioned so as to mechanically compress at least one of the first or second wafer scale seals.

45. The method of claim 43, wherein at least one of the first or second wafer scale seals is formed of a seal material cured after the die singularizing.

46. The method according to claim 1, wherein the first and second wafer scale seals have sealing widths of 50 to 700 micrometers and thicknesses of 25 to 200 micrometers.

47. The method according to claim 1, wherein the first and second wafer scale seals have sealing widths of 50 to 200 micrometers and thicknesses of 25 to 200 micrometers.

48. The method according to claim 13, wherein the first wafer scale seal has a sealing width of 50 to 700 micrometers and a thickness of 25 to 200 micrometers.

49. The method according to claim 13, wherein the wafer scale seal has a sealing width of 50 to 200 micrometers and a thickness of 25 to 200 micrometers.

50. The method according to claim 43, wherein the first and second wafer scale seals have sealing widths of 50 to 700 micrometers and thicknesses of 25 to 200 micrometers.

51. The method according to claim 43, wherein the first and second wafer scale seals have sealing widths of 50 to 200 micrometers and thicknesses of 25 to 200 micrometers.

* * * * *